(12) United States Patent
Yamazaki et al.

(10) Patent No.: US 10,177,780 B2
(45) Date of Patent: Jan. 8, 2019

(54) SIGNAL GENERATING DEVICE

(71) Applicant: NIPPON TELEGRAPH AND TELEPHONE CORPORATION, Tokyo (JP)

(72) Inventors: Hiroshi Yamazaki, Atsugi (JP); Munehiko Nagatani, Atsugi (JP); Hideyuki Nosaka, Atsugi (JP); Akihide Sano, Yokosuka (JP); Yutaka Miyamoto, Yokosuka (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 15/754,033

(22) PCT Filed: Aug. 19, 2016

(86) PCT No.: PCT/JP2016/003791
§ 371 (c)(1),
(2) Date: Feb. 21, 2018

(87) PCT Pub. No.: WO2017/033446
PCT Pub. Date: Mar. 2, 2017

(65) Prior Publication Data
US 2018/0191369 A1 Jul. 5, 2018

(30) Foreign Application Priority Data
Aug. 27, 2015 (JP) .................... 2015-168219

(51) Int. Cl.
*H03M 1/66* (2006.01)
*H03M 1/74* (2006.01)
(Continued)

(52) U.S. Cl.
CPC ............ *H03M 1/74* (2013.01); *H03M 1/66* (2013.01); *H04J 11/00* (2013.01);
(Continued)

(58) Field of Classification Search
CPC ........ H03M 1/0614; H03M 1/12; H03M 1/66; H03M 1/747; H03M 3/502; H03M 1/1009;
(Continued)

(56) References Cited

U.S. PATENT DOCUMENTS 6,549,566 B1* 4/2003 Lee ................... H04L 27/2628
370/203
6,822,595 B1* 11/2004 Robinson ............... H03M 3/51
341/143

(Continued)

FOREIGN PATENT DOCUMENTS

| JP | S58-69145 A | 4/1983 |
| JP | 2006-211112 A | 8/2006 |
| JP | 2014-187693 A | 10/2014 |

OTHER PUBLICATIONS

International Search Report dated Nov. 8, 2016, issued in PCT Application No. PCT/JP2016/003791, filed Aug. 19, 2016.
(Continued)

*Primary Examiner* — Linh V Nguyen
(74) *Attorney, Agent, or Firm* — Workman Nydegger

(57) ABSTRACT

In the conventional technique, only an output having a bandwidth identical to the bandwidth of individual DACs has been obtained even by using a plurality of DACs. Also, even when the output of a bandwidth broader than the individual DAC is obtained, there has been a problem associated with asymmetricity of a circuit configuration. In a signal generating device of the present invention, a plurality of normal DACs are combined to realize an analog
(Continued)

output of a broader bandwidth beyond the output bandwidth of the individual DACs, and the problem of the asymmetricity of the circuit configuration is also resolved. A desired signal is separated into a low-frequency signal and a high-frequency signal in a frequency domain, and a series of operation of constant (r)-folding the amplitude of the high-frequency signal and shifting it on the frequency axis to superimpose it on the low-frequency signal are made in a digital domain. The output of each DAC is switched by an analog multiplexer.

14 Claims, 32 Drawing Sheets

(51) Int. Cl.
*H04J 11/00* (2006.01)
*H04L 27/26* (2006.01)

(52) U.S. Cl.
CPC ........ *H04J 11/0056* (2013.01); *H04L 27/263* (2013.01); *H04L 27/2634* (2013.01); *H04J 11/0036* (2013.01)

(58) Field of Classification Search
CPC ........ H03M 1/662; H03M 3/41; H03M 3/464; H03M 1/0665; H03M 1/0668; H03M 1/121; H03M 1/1215; H03M 1/74; H03M 1/745; H03M 1/765
USPC .......................................... 341/144, 139–142
See application file for complete search history.

(56) References Cited

U.S. PATENT DOCUMENTS

| | | | |
|---|---|---|---|
| 6,825,785 B1* | 11/2004 | Huang | H03L 7/093 341/141 |
| 8,548,071 B2* | 10/2013 | Collins | H03K 19/17744 326/8 |
| 9,093,955 B2 | 7/2015 | Carlson et al. | |
| 9,413,394 B1* | 8/2016 | Lye | H03M 1/662 |
| 2005/0258992 A1 | 11/2005 | Fontaine et al. | |
| 2011/0075780 A1* | 3/2011 | Petrovic | H03M 1/0614 375/355 |
| 2012/0314804 A1* | 12/2012 | Dakshinamurthy | H04L 25/03834 375/295 |
| 2014/0285251 A1* | 9/2014 | Carlson | H03D 7/1408 327/361 |
| 2015/0009058 A1* | 1/2015 | Nentwig | H03M 3/50 341/144 |
| 2017/0019183 A1* | 1/2017 | Harley | H04B 10/548 |
| 2018/0159548 A1* | 6/2018 | Schmidt | H04L 25/0204 |

OTHER PUBLICATIONS

International Preliminary Report in Patentability dated Mar. 8, 2018, issued in PCT Application No. PCT/JP2016/003791, filed Aug. 19, 2016.
Hao Huang et al., *An 8-bit 100-GS/s Distributed DAC in 28-m CMOS for Optical Communications*, IEEE Transactions on Microwave Theory and Techniques, vol. 63, No. 4, Apr. 2015, pp. 1211-1218.
Charles Laperle et al., *Advances in High-Speed DACs, ADCs, and DSP for Optical Coherent Transceivers*, Journal of Lightwave Technology, vol. 32, No. 4, Feb. 15, 2014, pp. 629-643.
John G. Proakis et al. *Digital Communications*, McGraw-Hill, 2008, pp. 749-752.
Tomoo Takahara et al., *Discrete Multi-Tone for 100 Gb/s Optical Access Networks*, OFC2014, paper M21.1, 2014, pp. 3.
Yag Tang et al., *DFT-Spread OFDM for fiber Nonlinearity Mitigation*, IEEE Photonics Technology Letters, vol. 22, No. 16, Aug. 15, 2010, pp. 1250-1252.
Hiroshi Yamazaki et al., *Digital-Preprocessed Analog-Muliplexed DAC for Ultrawideband Multilevel Transmitter*, Journal of Lightwave Technology, vol. 34, No. 7, Apr. 1, 2016, pp. 1579-1584.
Office Action dated Nov. 13, 2018 in corresponding Japanese Patent Application No. 2017-536611.

\* cited by examiner

SIGNAL GENERATING DEVICE

TECHNICAL FIELD

The present invention relates to a high-speed signal generating device using a digital-to-analogue converter.

BACKGROUND ART

As represented in widespread diffusion of smartphones, the internet traffic continues to increase day by day, and an increase in the capacities of optical fiber communications, wireless communications, line telecommunications, and the like as well as their advanced functionalities are required. As an elemental technique for realizing the increased capacities and advanced functionalities of systems, development of efficient network configurations, advanced digital modulation and demodulation systems, optical and electronic devices operable at high speed, and the like are currently underway. For instance, focusing on a circuit on a transmission side of a communication device, processing such as advanced multi-level modulation and waveform shaping is vigorously examined in the level of digital signals using a digital signal processor (DSP), which is a processor dedicated to digital signal processing.

In introducing such a digital signal processing technology using the DSP, a digital-to-analog converter (DAC) which converts a digital signal generated by the DSP into a final high-speed analog signal and which is operable at high speed is essential. However, the DAC fabricated by using a current CMOS platform has an analog output bandwidth of about 15 GHz, which is insufficient and causes one of bottlenecks in realizing the increase of capacity for communication systems.

CITATION LIST

Non Patent Literature

NPL 1: H. Huang, J. Heilmeyer, M. Grozing, M. Berroth, J. Leibrich, and W. Rosenkranz, "An 8-bit 100-GS/s Distributed DAC in 28-nm CMOS for Optical Communications," IEEE Trans. Micro. Theo. Tech., 2015, vol. 63, no. 4, pp. 1211-1218

NPL 2: C. Laperle and M. O'Sullivan, "Advances in High-Speed DACs, ADCs, and DSP for Optical Coherent Transceivers," J. Lightw. Technol., 2014, vol. 32, no. 4, pp. 629-643

NPL 3: J. G. Proakis and M. Salehi, Digital Communications. McGraw-Hill, 2008, pp. 749-752

NPL 4: T. Takahara, T. Tanaka, M. Nishihara, Y. Kai, L. Li, Z. Tao, and J. Rasmussen, "Discrete Multi-Tone for 100 Gb/s Optical Access Networks," in Proc. OFC2014, paper M21.1, 2014

NPL 5: Y. Tang, W. Shieh, and B. S. Krongold, "DFT-Spread OFDM for Fiber Nonlinearity Mitigation," IEEE Photon. Technol. Lett., vol. 22, no. 16, pp. 1250-1252 (2010)

SUMMARY OF INVENTION

As a high-speed DAC technique, a technique of increasing a sampling rate by causing a plurality of DACs to be operated by interleaving in a time domain to shift a loopback noise toward a high-frequency side, as disclosed in NPL 1, has been well known. However, since the technique disclosed in NPL 1 simply combines DAC output signals by an adder, the output bandwidth of analog output signals from the overall DACs does not differ from the case of using individual DACs. The problem of the insufficient output bandwidth for the DACs has not been resolved at all.

FIG. 13A is an example of another conventional technique of a high-speed DAC technique (FIG. 8 of NPL 2), and is a diagram showing a configuration of using a multiplier and two DACs. In the configuration of NPL 2 shown in FIG. 13A, among the two DACs 1303 and 1304, an output signal frequency from the DAC 1304 is up-converted by using a multiplier 1309. By adding the up-converted signal to an output signal from the other DAC 1303 by using an adder 1310, a signal of a broader bandwidth is generated compared to the output bandwidth of individual DACs. However, in the configuration of NPL 2 shown in FIG. 13A, one analog signal path A from the DAC 1303 to the adder 1310 and the other analog signal path B from the DAC 1304 to the adder 1310 form an asymmetric configuration. In the case of assuming high-speed DAC operation, adjustment processes for a phase difference between each of the DAC outputs (difference in delay time) and an amplitude unbalance are complicated and the considerable extent of adjustment is required, and accordingly, there has been a case where the adjustment itself is difficult.

An object of the present invention is to provide, in consideration of the above problems, a signal generating device using a plurality of DACs which allows outputting any signal of a broader bandwidth compared to the output bandwidth for individual DACs and which requires no complicated adjustment for the plurality of DACs.

In order to resolve the above-described problems, a signal generating device of one aspect of the present invention comprises: a digital signal processing unit; two digital-to-analog converters (DACs); and an analog multiplexer that alternatingly switches analog signals outputted from the two DACs with a frequency $f_c$ for outputting as analog signals, wherein the digital signal processing unit includes: when a signal, among desired output signals having an upper limit frequency of less than $f_c$, made of a component having an absolute value of a frequency being substantially $f_c/2$ or less is assumed as a low-frequency signal, and when, for a positive frequency component and a negative frequency component which are made of a component having an absolute value of a frequency being substantially $f_c/2$ or more among the desired output signals, a signal in which the positive frequency component is shifted by $-f_c$ on a frequency axis and a signal in which the negative frequency component is shifted by $+f_c$ on the frequency axis are assumed as a folded signal, means for generating a first signal that is equal to a signal obtained by multiplying the folded signal by a constant and adding a resultant to the low-frequency signal; and means for generating a second signal that is equal to a signal obtained by multiplying the folded signal by the constant and subtracting a resultant from the low-frequency signal, and wherein: a digital signal corresponding to the first signal generated in the digital signal processing unit is inputted into one of the two DACs; and a digital signal corresponding to the second signal generated in the digital signal processing unit is inputted into the other one of the two DACs. Here, the low-frequency signal corresponds to a signal A in Description of Embodiments, the positive frequency component to a signal B, and the negative frequency component to a signal C.

Preferably, in the above-described signal generating device, the constant may be a real number of t/2 or more. Also, the output bandwidth of the analog multiplexer may have a broader bandwidth compared to an output bandwidth of each of the two DACs.

Further preferably, in the above-described signal generating device, the digital signal processing unit may further comprise compensation means for performing processing of compensating a response characteristic of the DACs for the first signal and the second signal. A low pass filter may further be provided at a post-stage of the analog multiplexer to suppress a frequency component of $f_c$ or more.

Further, in the above-described signal generating device, a signal in which transmission information data has underwent processing of symbol mapping, pulse shaping, and channel equalization may be inputted into the digital signal processing unit, and the analog signal from the analog multiplexer may be inputted into modulation means. Also, the modulation means may be any one of an orthogonal modulator, a polarization multiplexed orthogonal modulator, and an electric-optic conversion (E/O) device.

In a signal generating device of another aspect of the present invention, the desired signal is a multicarrier signal constituted by a plurality of frequency subcarrier signals, and the digital signal processing unit may comprise: serial-parallel conversion means for branching transmission information data in parallel; symbol mapping means for making symbol mapping for the branched data and for generating a subsymbol sequence constituted by a plurality of subsymbols to be carried on the plurality of subcarriers, respectively; means for generating a subsymbol that is folded in a frequency band corresponding to the low-frequency signal by making a shift on the frequency axis with respect to a part of subsymbols, out of the plurality of subsymbols, corresponding to the positive frequency component and the negative frequency component; means for obtaining an intermediate subsymbol sequence by adding or subtracting a subsymbol corresponding to the low-frequency signal and subsymbols obtained by multiplying the folded subsymbols by the constant; IDFT computation means for making inverse-discrete Fourier transform (IDFT) for the intermediate subsymbol sequences; and parallel-serial conversion means for arranging an output data sequence from the IDFT computation means in serial. Here, the multicarrier signal includes, but not limited to, for example, an orthogonal frequency-division multiplexing (OFDM) signal, a discrete multi-tone (DMT) signal, and the like.

Further, a signal generating device of still another aspect of the present invention comprises a configuration of N+1 stage nest type obtained by repeating an operation of replacing each of the two DACs with any of the above-described signal generating devices themselves by N times (where N is any integer of 1 or more), wherein, when a frequency for switching the analog multiplexer in the signal generating devices by the number of 2n−1 positioned at nth stage (where n is an integer of 1 or more and N+1 or less) from an outer side in the N+1 stage nest-type configuration is $f_{c,n}$, a range may be $f_{c,k}/2<f_{c,k+1}<f_{c,k}$ (where k is an integer of 1 or more and N or less).

A signal generating device of yet another aspect of the present invention comprises: a digital signal processing unit; two digital-to-analog converters (DACs); and an analog multiplexer that alternatingly switches analog signals outputted from the two DACs with a frequency $f_c/2$ for outputting as analog signals, wherein the digital signal processing unit includes: when a signal, among desired output signals having an upper limit frequency of less than $f_c$, made of a component having an absolute value of a frequency being substantially $f_c/2$ or less is assumed as a low-frequency signal, when, for a positive frequency component and a negative frequency component which are made of a component having an absolute value of a frequency being substantially $f_c/2$ or more among the desired output signals, a signal in which the positive frequency component is shifted by $-f_c$ on a frequency axis and a signal in which the negative frequency component is shifted by $+f_c$ on the frequency axis are assumed as a folded signal, and when a signal in which the positive frequency component is shifted by $-f_c/2$ on the frequency axis and a signal in which the negative frequency component is shifted by $+f_c/2$ on the frequency axis are assumed as a parallel shifted signal, means for generating a third signal that is equal to a signal obtained by adding a signal obtained by multiplying the parallel shifted signal by a constant to the low-frequency signal and then subtracting the folded signal from a resultant; and means for generating a fourth signal that is equal to a signal obtained by subtracting a signal obtained by multiplying the parallel shifted signal by the constant from the low-frequency signal and further subtracting the folded signal from a resultant, and wherein: a digital signal corresponding to the third signal generated in the digital signal processing unit is inputted into one of the two DACs; and a digital signal corresponding to the fourth signal generated in the digital signal processing unit is inputted into the other one of the two DACs. In the above-described signal generating device, the digital signal processing unit may further comprise compensation means for performing processing of compensating a response characteristic of the DACs for the third signal and the fourth signal.

Preferably, the desired signal is a multicarrier signal constituted by a plurality of frequency subcarriers, and the digital signal processing unit may comprise: serial-parallel conversion means for branching transmission information data in parallel; symbol mapping means for making symbol mapping for the branched data and for generating a subsymbol sequence constituted by a plurality of subsymbols to be carried on the plurality of subcarriers, respectively; means for generating a subsymbol that is folded in a frequency band corresponding to the low-frequency signal and a subsymbol that is parallel-shifted in a frequency band corresponding to the low-frequency signal by making a shift operation on the frequency axis with respect to a part of subsymbols, out of the plurality of subsymbols, corresponding to the positive frequency component and the negative frequency component; means for obtaining an intermediate subsymbol sequence by adding or subtracting a subsymbol obtained by multiplying subsymbols corresponding to the low-frequency signal, the folded subsymbols, and the parallel-shifted subsymbols by the constant; IDFT computation means for making inverse-discrete Fourier transform (IDFT) for the intermediate subsymbol sequences; and parallel-serial conversion means for arranging an output data sequence from the IDFT computation means in serial.

A signal generating device of a different aspect of the present invention comprises: a digital signal processing unit; two digital-to-analog converters (DACs); an analog addition/subtraction processing unit that outputs a first analog output signal in which a relative amplitude of analog input signals of a dual system is adjusted and which is equal to a sum of the analog input signals of the dual system whose relative amplitude has been adjusted and a second analog output signal which is equal to a difference in the analog input signals of the dual system whose relative amplitude has been adjusted; and an analog multiplexer that alternatingly switches the first analog output signal and the second analog output signal outputted from the analog addition/subtraction processing unit with a frequency $f_c$ for outputting as analog signals, wherein the digital signal processing unit includes: when a signal, among desired output signals having an upper limit frequency of less than $f_c$, made of a component having an absolute value of a frequency being substantially $f_c/2$ or less is assumed as a low-frequency signal, and when, for a positive frequency component and a negative frequency component which are made of a component having an absolute value of a frequency being substantially $f_c/2$ or more among the desired output signals, a signal in which the positive frequency component is shifted by $-f_c$ on a frequency axis and a signal in which the negative frequency component is shifted by $+f_c$ on the frequency axis are assumed as a folded signal, means for generating a first signal that is equal to the low-frequency signal; and means for generating a second signal that is equal to the folded signal, and wherein: a digital signal corresponding to the first signal generated in the digital signal processing unit is inputted into one of the two DACs; a digital signal corresponding to the second signal generated in the digital signal processing unit is inputted into the other one of the two DACs; and analog outputs from the two DACs are each inputted into the analog addition/subtraction processing unit as the analog input signals of the dual system.

As described above, according to the present invention, the signal generating device using the plurality of DACs allows outputting any signal of a broader bandwidth compared to the output bandwidth for individual DACs and allows requiring no complicated adjustment for the plurality of DACs.

DESCRIPTION OF EMBODIMENTS

Figure 13A:
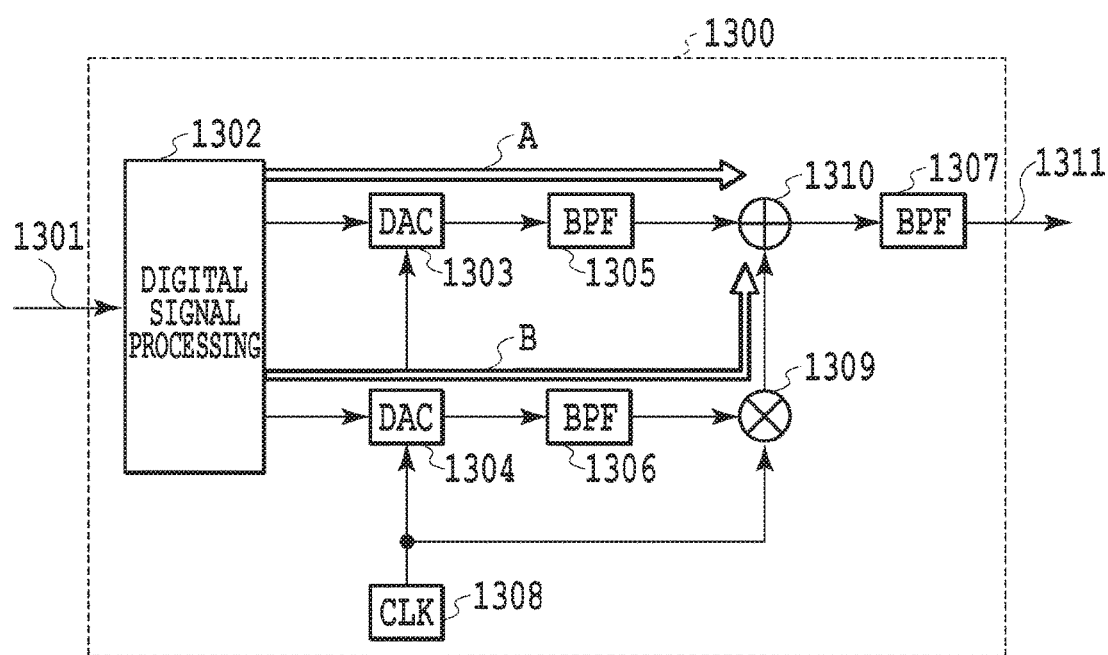
FIG. 13A is a diagram showing a configuration of a conventional technique of a high-speed DAC technique.
Figure 13B:
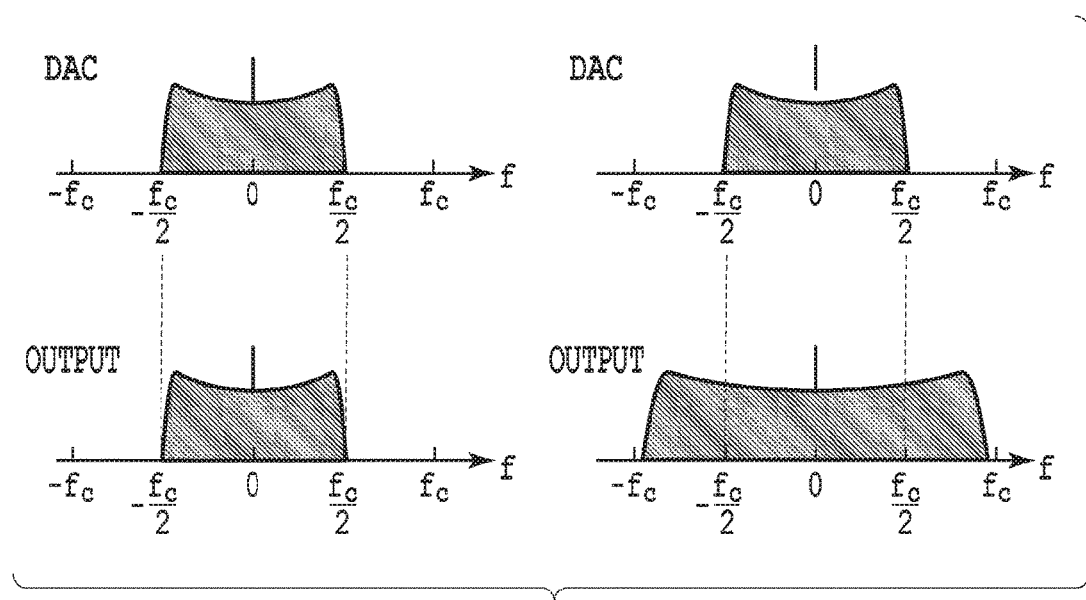
FIG. 13B is a diagram illustrating a difference between an operation of a signal generating device of the conventional technique and an operation of that of the present invention.

In the explanation below, a signal generating device capable of outputting an analog signal of a broader bandwidth beyond an intrinsically outputtable band by using a single DAC is disclosed. As already described above, in the conventional technique, as conceptually shown on the left side of FIG. 13B, only an output having a bandwidth identical to the bandwidth of individual DACs has been obtained even by using a plurality of DACs (NPL 1). Besides, even when the output of a broader bandwidth is obtained, there has been a problem associated with asymmetricity of a circuit configuration (NPL 2). In the signal generating device of the present invention, a plurality of normal DACs are combined, as conceptually shown on the right side of FIG. 13B, to realize analog output of a broader bandwidth beyond the output bandwidth of individual DACs, and further, the problem of the asymmetricity of the circuit configuration is also resolved.

Various embodiments of the signal generating device of the present invention will be explained in detail with reference to the drawings. In the following explanations, when referring to the upper limit frequency and lower limit frequency of a signal, the power of a frequency component of the upper limit frequency or more and the lower limit frequency or less which is included in a target signal is meant to be so small to the extent that it can be substantially disregarded. To be more specific, it refers to the case where the power of a signal component having a certain frequency or more or less amounts to no more than −20 dB of the overall signal power.

Further, an output bandwidth for a DAC and an analog multiplexer, for example, refers to an upper limit frequency of an analog signal that can be substantially outputted by the device. In general, it refers to a frequency attenuated by about 3 dB to 6 dB compared to a case where an output level is a level in the vicinity of DC. Further, the cutoff frequency of a filter refers to a frequency in which a passage gain is attenuated by 3 dB from a gain from a passband.

Firstly, an explanation will be given in detail on the most basic configuration of the signal generating device of the present invention and its operation principle.

First Embodiment

Figure 1:
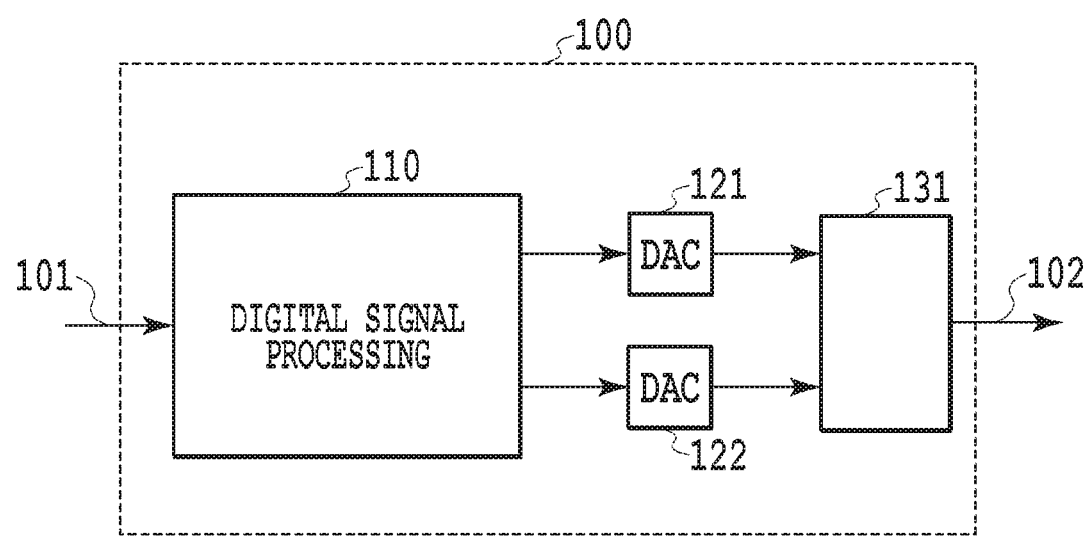
FIG. 1 is a diagram schematically showing a configuration of a signal generating device according to a first embodiment of the present invention.

FIG. 1 is a diagram schematically showing a configuration of a signal generating device according to the first embodiment of the present invention. A signal generating device 100 includes a digital signal processing unit 110, two DACs 121, 122, and an analog multiplexer 131. An input signal 101 to the signal generating device 100 undergoes digital signal processing specific to the present invention in the digital signal processing unit 110. A digital data signal having been signal-processed, which will be described later, by the digital signal processing unit 110 is converted into analog signals in a first DAC 121 and a second DAC 122, respectively. Lastly, analog signal outputs from the two DACs are converted into an output signal 102 by the analog multiplexer 131.

It should be noted that, in the signal generating device of the present invention, a signal inputted to the digital signal processing unit 110 is a sampled digital signal. The generation of an input signal to the digital signal processing unit is typically implemented by DSP, although not limiting to this, and an input signal to the digital signal processing unit 110 from the DSP is digital data information or a digital signal in which a desired analog signal has been digitized (sampled). In addition, the desired analog signal is generated by computing processing within the DSP or the like, and the digitized signal is inputted into the digital signal processing unit in the signal generating device of the present invention. Therefore, in the following explanation, even when there is a description that a desired signal is to be sampled, it does not mean that an actual analog-digital conversion is made by an analog-digital converter (ADC). It should be noted that it is only a concept as one process of computing processing by the DSP, and is not an actual signal. Data directly digitizing virtual analog waveform within the DSP is firstly generated, and thus digitized data is supplied to the signal generating device of the present invention to add signal processing specific to the present invention as will be described later. Pieces of digital data having been signal-processed are inputted into the two DACs 121, 122, and an actual desired analog signal is outputted through the analog multiplexer 131. The present invention employs a combination of the configuration of the signal generating device shown in FIG. 1 and the signal processing specific to the present invention which is carried out by the digital signal processing unit so as to make the DACs 121, 122 having insufficient output bandwidths achieve an analog output of a broader bandwidth compared to the output bandwidth of the DACs 121, 122 as individual units.

The two DACs 121, 122 are both connected to the analog multiplexer 131 with wirings having the same length. Further, as will be described later, the analog multiplexer 131 also has a symmetric configuration with respect to a virtual signal-traveling direction from the two input ports to an output point thereof. Accordingly, an analog signal path from an output point of the DAC 121 to the output point of the analog multiplexer 131 and an analog signal path from an output point of the DAC 122 to the output point of the analog multiplexer 131 have the same configuration. When viewing those two signal paths along the electric signal-traveling direction in the circuit diagram as well as in the aspect of the actual analog circuit configuration, a symmetric configuration is formed when regarding the traveling direction as a virtual center axis. By using the two DACs 121, 122 having equivalent circuit configurations and electric properties, the two analog signal paths have the same length, and a signal delay does not need to be adjusted if the two DACs are driven by a clock of the same phase.

Therefore, in the signal generating device of the present invention, adjustment is particularly facilitated compared to the signal generating device using the plurality of DACs of a conventional technique disclosed in NPL 2. Incidentally, in the above explanation, the symmetry of a circuit configuration in the circuit diagram or for the analog signal path does not necessarily require the physical shapes and locations of a device substrate of actual circuit components and a substrate of semiconductor chips to be identical or symmetric. If loss or delay for the signal paths relating to the above-described two DACs is the same, the adjustment of the DACs can still be significantly simplified. Therefore, it should be noted that, even if the shapes and locations of the signal paths along with analog operation of the two DACs slightly differ, the feature of the present invention is to be exerted as long as the signal paths from the respective DACs to the output point of the analog multiplexer substantially have the same length to achieve the same loss or delay.

In the signal generating device of the present embodiment, the analog multiplexer 131 is driven by a clock frequency $f_c$, and further, an output bandwidth for the DACs 121, 122 is about $f_c/2$ and an output bandwidth for the analog multiplexer 131 is $f_c$ or more. First of all, in explaining the fundamental operation of the signal generating device 100 of the present invention, the operation of the analog multiplexer 131 will be explained below.

Figure 2A:
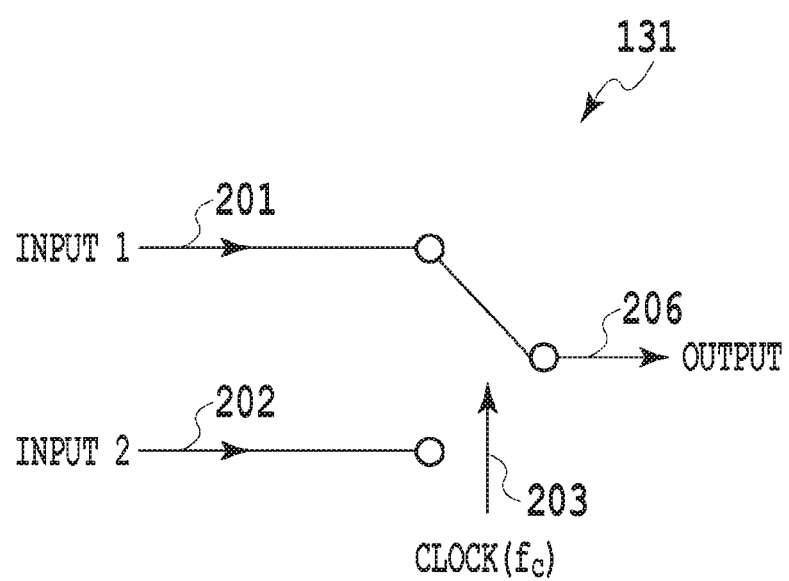
FIG. 2A is a diagram illustrating an operation of an analog multiplexer in the signal generating device of the present invention.
Figure 2B:
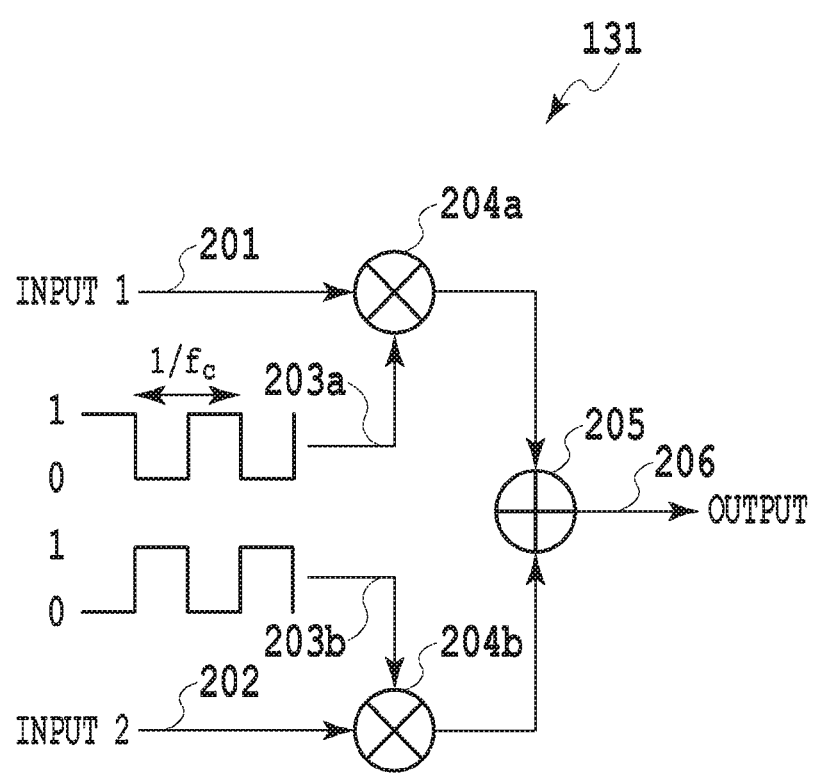
FIG. 2B is another diagram illustrating an operation of the analog multiplexer in the signal generating device of the present invention.

FIGS. 2A and 2B are diagrams illustrating an operation of the analog multiplexer in the signal generating device of the present invention. As shown in FIG. 2A, the analog multiplexer 131 is a switching circuit that outputs input analog signals 201, 202 of a dual system while switching them to a high speed by using a clock signal 203 having the frequency $f_c$. It can be assumed that this switching circuit operates equally to an equivalent circuit shown in FIG. 2B. In other words, it can be assumed that the analog multiplexer 131 is a circuit to obtain, in multipliers 204a, 204b, an output 206 by multiplying input signals 201, 202 by pulse trains 203a, 203b, respectively, that alternately cut out in a time domain and then by combining those two multiplier outputs in an adder 205. A time waveform for the two pulse trains 203a, 203b ideally takes a binary of 0 and 1, which is a square wave of the frequency $f_c$ that immediately changes values. In an actual circuit, since a transition time of switching a switch is not zero but requires a certain time, the time waveform is a waveform in which its square wave is somewhat blunt.

Figure 3A:
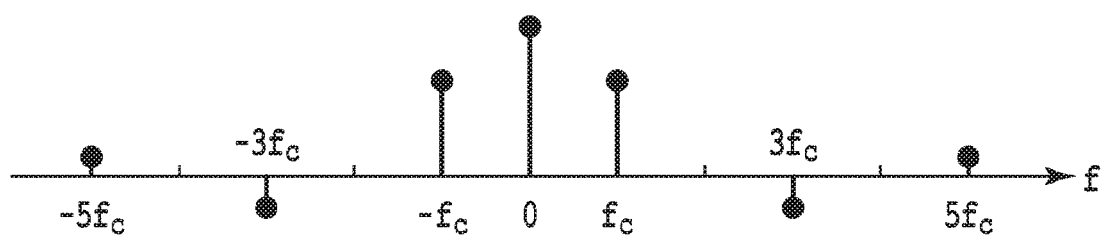
FIG. 3A is a diagram showing a frequency spectrum of a pulse train to be multiplied by a first signal of the analog multiplexer.
Figure 3B:
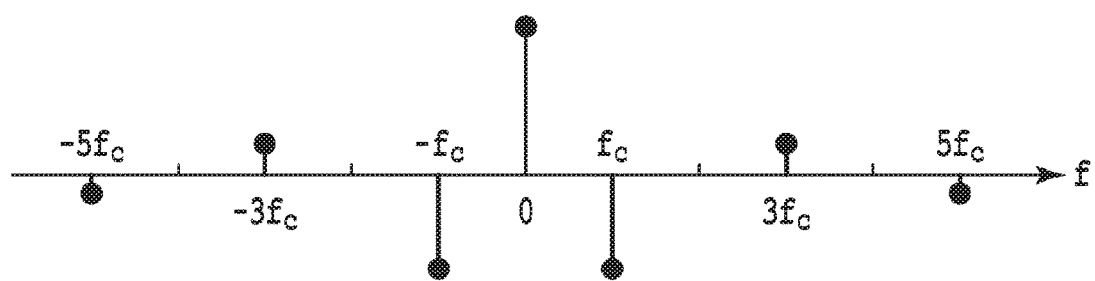
FIG. 3B is a diagram showing a frequency spectrum of a pulse train to be multiplied by a second signal of the analog multiplexer.

FIGS. 3A and 3B are diagrams each showing a frequency spectrum of a pulse train to be multiplied by the analog multiplexer. FIG. 3A schematically shows a spectrum of the pulse train 203a multiplied by a first input signal 201 in the model of FIG. 2B, and FIG. 3B schematically shows a spectrum of the pulse train 203b multiplied by a second input signal 202 therein. With reference to FIG. 3A and FIG. 3B, it is recognized that, when making Fourier transform on time waveforms of the pulse trains 203a, 203b, a line spectrum composed of a DC component and an odd multiple of $f_c$ component can be obtained. Here, a case where the pulse train time waveform is an ideal square wave is assumed, and when an amplitude of the DC component (f=0) is 1, an amplitude of a high frequency component of a frequency$\pm(2k-1)f_c$ for an integer k becomes $2/\{(2k-1)\pi\}$. Incidentally, in a case where a blunt pulse train time waveform is large and the pulse train has a waveform that can be approximated by a squared cosine wave, where an amplitude of the DC component is 1, an amplitude of the frequency$\pm f_c$ component is substantially ½, and the intensity for other high frequency components is substantially zero.

Also, as a very special case, in the case of expressing with a short pulse train whose time taking a value of 1 for the pulse train time waveform is shorter than a time taking a value of 0, where an amplitude of the DC component is 1, an amplitude of the frequency$\pm f_c$ component becomes larger than $2/\pi$. As such, the analog multiplexer expressed with the short pulse train for the pulse train time waveform operates in a manner of, for example, outputting the input analog signal 201 for a very short time, and then outputting zero for a while, and subsequently outputting the input analog signal 202 for a very short time, and again outputting zero for a while. In other words, the analog multiplexer expressed with the short pulse train as such is operated in a manner close to an operation of alternate sampling rather than switching. Such an operation is technically possible, but not very common.

The phase of each frequency component of the pulse train signal depends on a manner of taking a time origin for a waveform of a pulse train. When a center point of a time slot in which the pulse train 203a to be multiplied by the first input signal 201 takes a value of 1 is set as a time origin, a phase of a component of the frequency$\pm(2_{k-1})f_c$ in the spectrum shown in FIG. 3A is zero when k has an odd number, and is $\pi$ when k has an even number. Also, irrespective of a manner of taking a time origin, a phase difference between the components of the same frequency between the spectrum of FIG. 3A and the spectrum of FIG. 3B is zero in the DC component and is $\pi$ in components other than the DC. In the following explanation, when an intensity of the DC component of the pulse train signal is 1, an intensity for the frequency$\pm f_c$ component is set to 1/r. A value of r is a constant in the present embodiment of the present invention.

Figure 4:
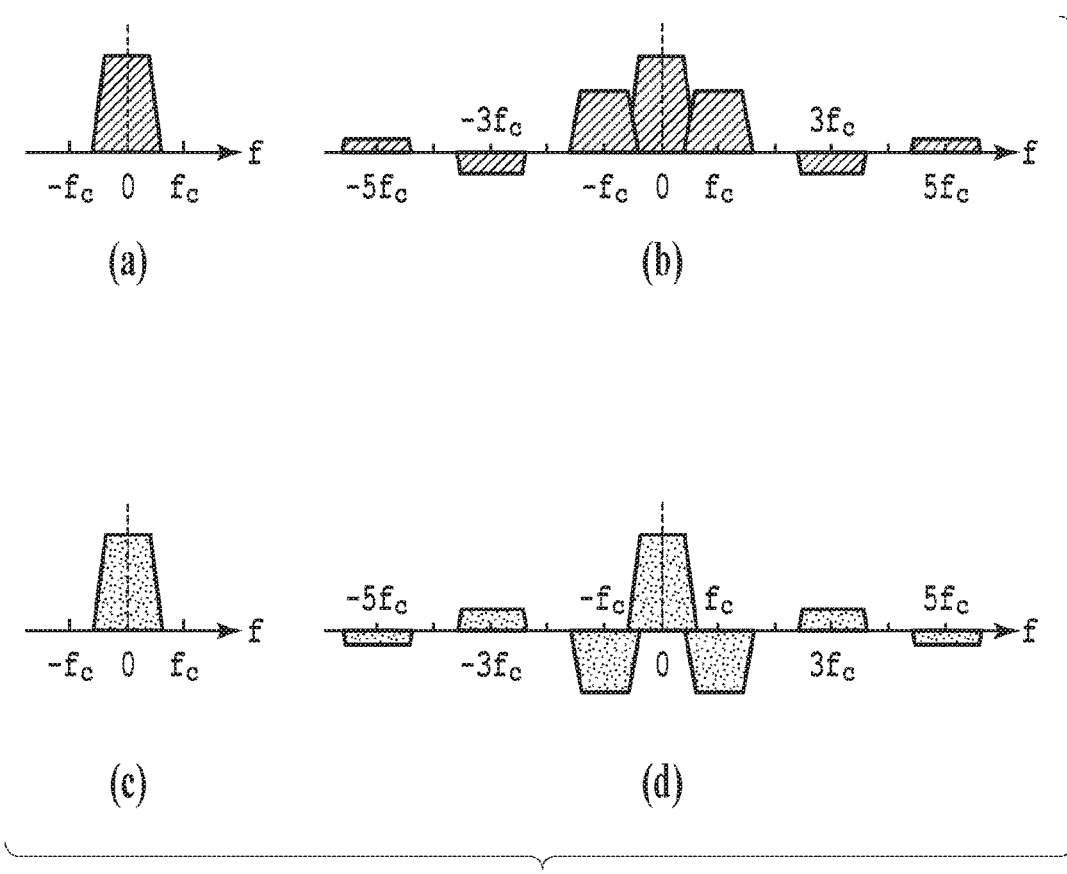
FIG. 4 is a diagram schematically showing an operation of the analog multiplexer in a frequency domain.

FIG. 4 is a diagram schematically showing an operation of the analog multiplexer in a frequency domain in the signal generating device of the present invention. FIGS. 4(a) and 4(c) represent spectra for the first input signal 201 and the second input signal 202, and here, each of the cases of their signal bandwidths having about $f_c/2$ on one side is to be considered. FIG. 4(b) represents a spectrum of a signal after multiplying the first input signal 201 by the pulse train 203a in the model shown in FIG. 2B, and FIG. 4(d) represents a spectrum of a signal after multiplying the second input signal 202 by the pulse train 203b in the model of FIG. 2B. FIG. 4(b) is a resultant of superimposing the pulse train spectrum of FIG. 3A on the signal spectrum of FIG. 4(a), and FIG. 4(d) is a resultant of superimposing the pulse train spectrum of FIG. 3B on the signal spectrum of FIG. 4(b).

As defined earlier, a signal intensity superimposed on the frequency$\pm f_c$ component is an intensity of 1/r relative to a signal superimposed on the DC component. An output signal of the analog multiplexer 131 is the addition of signals shown in FIGS. 4(b) and 4(d). Taking a look at a phase difference between each of the frequency components in the spectra in FIGS. 4(b) and 4(d), a phase difference between the input signals superimposed on the DC component is zero, and a phase difference between the input signals superimposed on the odd multiple of $f_c$ component is $\pi$. Incidentally, since a signal component superimposed on a frequency$\pm 3f_c$ and the high frequency component of a higher order does not overlap with a signal superimposed on the frequency$\pm f_c$ component, the signal component can easily be removed by appropriately using a low pass filter. Further, these high frequency components are naturally cut off in the output side of the circuit of the analog multiplexer 131 or a transmission path, or further, in a receiving side. Accordingly, in the following explanation, a focus is placed only on the signal component superimposed on the DC component and frequency$\pm f_c$.

In the signal generating device of the present invention, in light of the operation properties of the analog multiplexer 131 shown in FIG. 3A, FIG. 3B, and FIG. 4, signal processing specific to the present invention is added to a digital signal digitalizing a desired analog signal in the digital signal processing unit 110. A focus should be placed on an aspect that, when an upper limit frequency (output bandwidth) of the output signal of each of the two DACs 121, 122 slightly exceeds $f_c/2$, signal processing specific to the present invention is added to the digital signal processing unit 110 so that the final upper limit frequency of the output signal 102 has a signal of a sufficiently broader bandwidth than $f_c/2$.

Figure 5:
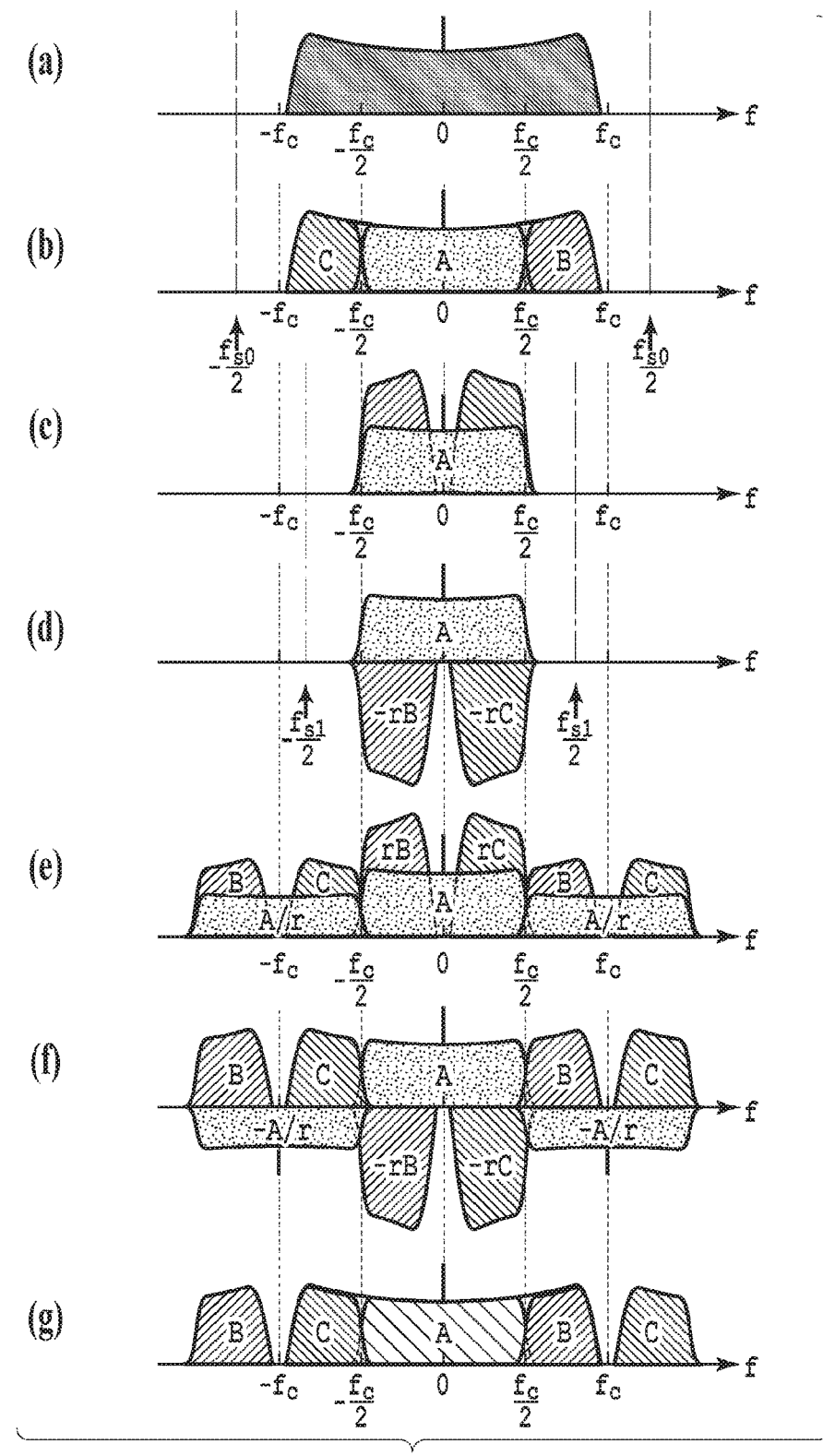
FIG. 5 is a diagram schematically representing a waveform synthesizing operation in the frequency domain in the signal generating device according to the first embodiment of the present invention.

FIG. 5 is a diagram schematically representing a waveform synthesizing operation in the frequency domain in the signal generating device according to the first embodiment of the present invention. The signal processing of the waveform synthesizing operation illustrated in FIG. 5 is, in the signal generating device of the present invention in FIG. 1, is performed by elements from the digital signal processing unit 110 to the analog multiplexer 131. All the drawings in FIGS. 5(*a*) through 5(*g*) schematically show frequencies in horizontal axis and signal levels (amplitudes) in vertical axis. A signal below the level of the horizontal axis shows that a phase difference between a signal above the horizontal axis and the signal below the horizontal axis is $\pi$. In the process of the explanation on FIG. 5 based on the spectra of the pulse trains shown in FIG. 3A and FIG. 3B, the phase difference between each of the signal components is limited to the case of 0 or $\pi$. As signal levels are simplified for an explanation in accordance with the case of the difference between the two phases, three-dimensional notation instead of two-dimensional notation is required to precisely express phases of signals. Therefore, it should be noted that each of the diagrams of FIGS. 5(*a*) to 5(*g*) is simplified for expression in order to schematically explain signal processing in the signal generating device of the present invention.

FIG. 5(*a*) is a spectrum of a desired signal to be finally outputted from the signal generating device of the present invention. As long as the desired signal is a real-valued signal on a time axis and an upper limit frequency is less than $f_c$, any signal can be set. The desired signal is firstly supplied to the digital signal processing unit 110 as digitized (sampled) input data, which is only virtual as one process of the series of digital signal processing, and digital data is directly generated by computing processing. Input to the digital signal processing unit 110 will be explained later again together with the block diagram of the specific digital signal processing unit in FIG. 6 which will be described later. In the explanation of FIG. 5 below, the series of signal processing is schematically explained as an operation on a frequency axis.

In the digital signal processing unit 110, first of all, the desired signal shown in FIG. 5(*a*) is separated into each of signal components shown in symbols A, B, and C as shown in FIG. 5(*b*). The signal component A is a real-valued low-frequency signal on the time axis, and signals that combine the signal component B and the signal component C are also real-valued high-frequency signals on the time axis. The signal component B is a positive frequency component, and the signal component C is a negative frequency component. The signal component B and the signal component C establish a mutual relation by folding into a center where a frequency is zero and by taking a complex conjugate. At this time, separation should be made such that a signal power of the low-frequency signal of A substantially falls within the range of $|f| \leq f_c/2$ and respective signal powers for high-frequency signals of B and C substantially fall within the range of $|f| \geq f_c/2$.

Next, in the digital signal processing unit 110, among signal components separated in FIG. 5(*b*), the signal component B and the signal component C are each r-folded on the vertical axis (amplitude axis), and the signal component C is horizontally shifted by $+f_c$ whereas the signal component B is horizontally shifted by $-f_c$ on the frequency axis.

The order of the r-folding operation and the horizontal shifting operation does not matter. Each of the signal components shifted on the frequency axis is added to the signal component A, and a first signal having a spectrum shown in FIG. 5(*c*) is obtained. The operations of r-folding the amplitude of the spectrum and shifting them on the frequency axis for the above-described signal component B and signal component C are equivalent to operations of folding in the signal component B and signal component C over a center of $f_c/2$ and $f_c/2$, respectively, taking their complex conjugates, and r-folding them to add resultants to the signal component A.

Meanwhile, in the case where addition processing to the signal component A, which is final processing, in the operation of obtaining the above-described first signal is replaced with processing of subtraction from the signal component A, a second signal having a spectrum shown in FIG. 5(*d*) is obtained. Here, a value of a constant r for changing an amplitude is, as described above, set in accordance with the transition characteristic of switching the switch in the analog multiplexer 131, that is, the waveform of the pulse train in the model of FIG. 2B. In the case where the pulse train is expressed in an ideal square wave, $r=\pi/2$ is assumed, and in the case where the pulse train has a waveform which is significantly blunt and which can be approximated by a squared cosine wave, $r=2$ is assumed. The constant r is normally set within the range of $\pi/2 < r < 2$. The power of respective spectra in the first signal of FIG. 5(*c*) and the second signal of FIG. 5(*d*) both substantially fall within the frequency range of $|f| < f_c/2$. Therefore, both the first signal and the second signal are sufficiently generated even with the DAC of about $f_c/2$ for the output bandwidth. The first signal having the spectrum of FIG. 5(*c*) and the second signal having the spectrum of FIG. 5(*d*) become signals as the output analog signals from the DACs 121, 122, respectively. Therefore, digital signals outputting the first signal and the second signal are given to the DACs 121, 122, respectively, from the digital signal processing unit 110 in FIG. 1. In the case where the output characteristics of the two DACs 121, 122 have frequency dependency, the digital signal processing unit 110 can further undergo processing for compensating this frequency dependency. The digital signal processing unit 110 supplies digital signals which are compensated for outputting the above-described first signal and second signal to the DACs 121, 122.

The analog signal having the spectrum shown in FIG. 5(*c*) is supplied from the DAC 121 to the analog multiplexer 131 as a first input signal. Similarly, the analog signal having the spectrum shown in the FIG. 5(*d*) is supplied from the DAC 122 to the analog multiplexer 131 as a second input signal. At this time, referring to the respective spectra in FIGS. 4(*b*) and 4(*d*) when multiplying the input signals 201, 202 in the model of FIG. 2B by the pulse trains 203*a*, 203*b*, output signals corresponding to the first input signal and second input signal from the analog multiplexer 131 become spectra shown in FIGS. 5(*e*) and 5(*f*), respectively.

Between signals of the respective spectra shown in FIGS. 5(*e*) and 5(*f*), the signal components of A are mutually in the same phase for the signals superimposed on the DC components. Meanwhile, signal components indicated as rBs that have been obtained by r-folding the amplitude and shifting them on the frequency axis are mutually in opposite phases (rB and –rB), and similarly, signal components indicated as rCs that have been obtained by r-folding the amplitude and shifting them on the frequency axis are also mutually in the opposite phases (rC and –rC). As to the signals superimposed on frequency$\pm f_c$, signal components indicated as A/r are mutually in the opposite phases. Meanwhile, signals indicated as B and signals indicated as C are mutually in the same phase, respectively. Here, the signal indicated as B which has been superimposed on the frequency±$f_c$ in FIG. 5(e) is obtained by multiplying the component indicated as rB that has been superimposed on the DC component in FIG. 5(c) by the pulse train. Accordingly, it should be noted that, as defined earlier in FIG. 3A and FIG. 3B, the level of the frequency±$f_c$ component by multiplying the pulse train is in 1/r relation relative to the DC component, and thus, the amplitude becomes (rB)×(1/r)=B. Similarly, as to the signal indicated as C which has been superimposed on the frequency±$f_c$, the amplitude also becomes (rC)×(1/r)=C.

The spectra in FIGS. 5(e) and 5(f) are added by the analog multiplexer 131, and a signal finally obtained from the output point of the analog multiplexer 131 is a signal having a spectrum shown in FIG. 5(g). In FIG. 5(g), the components (rB, rC) mutually in the opposite phases between signals shown in FIGS. 5(e) and 5(f) are offset, and only the in-phase components (A, B, and C) remain. As a result, the desired signal shown in FIGS. 5(a) and 5(b) is obtained in the frequency range of |f|<$f_c$. In the frequency ranges of f<−$f_c$ and $f_c$<f, an unnecessary component indicated as B and an unnecessary component indicated as C, respectively, remain. These unnecessary components can be easily removed by using a low pass filter having a cutoff frequency in the vicinity of the frequency $f_c$. Alternatively, as the case may be, they are naturally cut in a circuit on the output side of the analog multiplexer 131 or a subsequent transmission path, and further, in a circuit on the corresponding receiving side.

With reference to the series of spectrum operation from FIGS. 5(a) to 5(g), the spectra of the signals to be outputted from the DACs 121, 122 are 5(c) and 5(d). Therefore, even if the output bandwidth of the DACs 121, 122 is about $f_c$/2, as the final output signal 102 of the signal generating device of the present invention, any desired signal having an upper limit frequency sufficiently larger than $f_c$/2 (but smaller than $f_c$) as shown in FIGS. 5(a) and 5(g) can be obtained.

The process of operating spectra from FIGS. 5(a) to 5(g) in the present invention is expressed as follows. The spectrum of the desired signal shown in FIG. 5(a) is denoted as Strg(f), while the signal component A, signal component B, and signal component C in FIG. 5(b) are denoted as SA(f), SB(f), and SC(f), respectively. Here, spectrum S1(f) of an output analog signal for the first DAC 121 shown in FIG. 5(c) and spectrum S2(f) of an output analog signal for the second DAC 122 shown in FIG. 5(d) are each expressed as follows:

$$S_{trg}(f)=S_A(f)+S_B(f)+S_C(f):S_C(f)=S_B^*(-f)$$

$$S_1(f)=S_A(f)+r\{S_B(f+f_c)+S_C(f-f_c)\}$$

$$S_2(f)=S_A(f)-r\{S_B(f+f_c)+S_C(f-f_c)\} \quad \text{Equations (1)}$$

Meanwhile, in the operation model of the analog multiplexer in FIG. 2B, when the components of the frequency range of |f|≥3$f_c$ are disregarded, spectra $P_1$(f) and $P_2$(f) for the pulse trains multiplied by the first input signal and the second input signal sent to the analog multiplexer, respectively, are given by the following equations:

$$P_1(f) = \frac{1}{2}\left\{\delta(f) + \frac{\delta(f-f_c)+\delta(f+f_c)}{r}\right\} \quad \text{Equation (2)}$$

-continued
$$P_2(f) = \frac{1}{2}\left\{\delta(f) - \frac{\delta(f-f_c)+\delta(f+f_c)}{r}\right\}$$

Here, δ is a Dirac delta function. When a superimposing computation is denoted by a symbol *, the output signal $S_{out}$(f) of the analog multiplexer 131 shown in FIG. 5(g) as a result of Equations (1) and Equations (2) is given by the following equation:

Equation (3)
$$\begin{aligned}
S_{out}(f) &= P_1(f)*S_1(f) + P_2(f)*S_2(f) \\
&= \frac{1}{2}\Big[S_1(f)+S_2(f)+\frac{1}{r}\{S_1(f-f_c)-S_2(f-f_c)+\\
&\quad S_1(f+f_c)-S_2(f+f_c)\}\Big] \\
&= S_A(f)+S_B(f)+S_C(f)+S_B(f+2f_c)+S_C(f-2f_c) \\
&= S_{trg}(f)+S_B(f+2f_c)+S_C(f-2f_c)
\end{aligned}$$

As in Equation (3), the output signal $S_{out}$(f) of the analog multiplexer 131 is a signal in which the signal component B is horizontally shifted by −2$f_c$ on the frequency axis and the signal component C is horizontally shifted by +2$f_c$ on the frequency axis are added to the desired signal $S_{trg}$(f). It is understood from the above-described Equation (3) that the processing is identical to processing performed by the digital signal processing unit 110 explained in FIGS. 5(c) and 5(d), and thus the processing explained in FIG. 5 and the processing obtained from Equation (3) are consistent with each other. As described above, the spectrum of the desired signal $S_{trg}$(f) substantially has a signal level of zero in the range of |f|≥$f_c$. Therefore, the signal power of a signal component $S_B$(f+2$f_c$) in Equation (3) is substantially zero in f≥−$f_c$ and the signal power of a signal component $S_C$(f−2$f_c$) therein is substantially zero in f≤−$f_c$, and thus they do not overlap with the spectrum $S_{trg}$(f) of the desired signal on the frequency axis.

Incidentally, in the explanations using the above equations, an extrinsic scaling factor is omitted. In order to describe the actual circuit operation of the signal generating device of the present invention, it is necessary, for example, to multiply a constant corresponding to a loss or gain (when an amplifier circuit is included) of the analog multiplexer 131 by the right side of Equation (3).

As described above, a role produced by the digital signal processing unit 110 in the signal generating device of the present invention is to generate digital signals and to supply them to each of the DACs 121, 122 so that the respective output analog signals from the two DACs 121, 122 become signals having the spectra shown in FIGS. 5(c) and 5(d). In order to do so, in accordance with a desired signal, respective signals corresponding to FIGS. 5(c) and 5(d) are generated in the digital domains, and, if the DACs 121, 122 have the output characteristics of frequency dependency, processing to compensate this should be performed at the same time.

Figure 6:
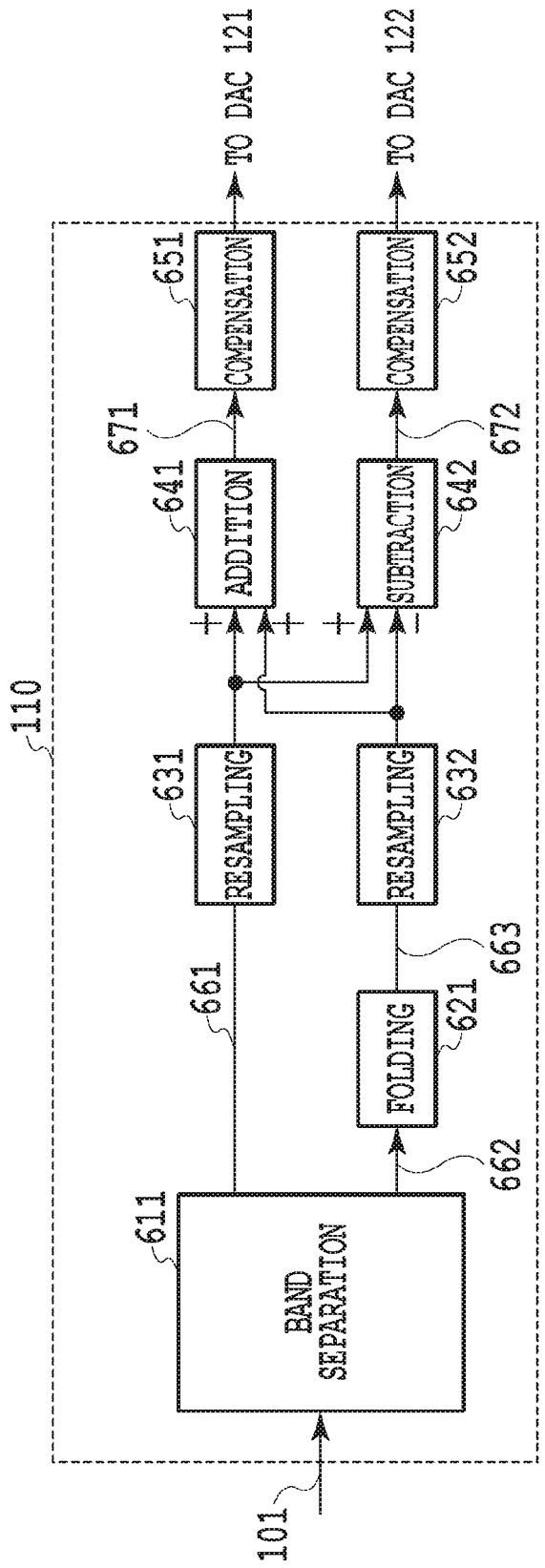
FIG. 6 is a block diagram illustrating a configuration and flow of a digital signal processing unit according to the first embodiment of the present invention.

FIG. 6 is a block diagram illustrating a configuration and flow of the digital signal processing unit according to the first embodiment of the present invention. The digital signal processing unit 110 in FIG. 6 is represented as a functional block diagram, but each of block functions of the digital signal processing unit 110 can be performed by the computing processing using DSP, for example. Therefore, FIG. 6 can be recognized to show a substantial flow of computation that is performed in the direction of arrows. A part of processing in each block can be, of course, achieved by hardware processing, or can be achieved by the combination of hardware processing and computing processing. Processing in each functional block in the digital signal processing unit 110 will be explained below in order along the flow of signals.

As the input signal 101 for the signal generating device of the present invention, a digital signal in which a desired signal is sampled with a sampling rate $f_{s0}$ is used. As described earlier, the input signal 101 is a signal in which a desired signal to be generated is generated in the digital domain, and thus, no actual desired signal exists. The sampling rate $f_{s0}$ is set to a value larger than twice the upper limit frequency of the spectrum Strg(f) of the desired signal. As is evident from a sampling theorem, this setting allows handling of the desired signal in the digital domain without substantially losing information. For simplification, the analog multiplexer 131 is assumed to have ideal characteristics in which a frequency response on the output side is flat. It is general that a multiplexer actually has a response characteristic of attenuation in the high-frequency side. In such a case, as the input signal 101, a digital signal that further undergoes processing of compensating the response characteristic of the analog multiplexer 131 for a signal in which a desired signal is sampled is inputted.

In the band separation unit 611 in FIG. 6, the inputted input signal 101 is separated into a low-frequency signal 661 and a high-frequency signal 662. The low-frequency signal 661 is the signal component indicated as A in FIG. 5(b), that is, this corresponds to the signal indicated as SA(f) in Equations (1). The high-frequency signal 662 is the signal component indicated as B in FIG. 5(b) and the signal component indicated as C, that is, this corresponds to the signal indicated as $S_B(f)+S_C(f)$ in Equations (1). Specifically, for instance, using a digital low pass filter (LPF) having the cutoff frequency of about $f_c/2$, a low frequency component of the input signal 101 is cut out to obtain the low-frequency signal 661. Furthermore, the low-frequency signal 661 obtained from a copy of the input signal 101 is subtracted to obtain the high-frequency signal 662. At this time, a passage gain in a passband of the LPF is assumed as 0 dB.

As another method, using a high pass filter (HPF), the low-frequency signal 661 can be obtained by obtaining the high-frequency signal 662 directly from the input signal 101 and then by subtracting it from the input signal 101. Alternatively, the LPF and the HPF can be separately used to obtain the low-frequency signals 661 and 662, respectively, from the input signal 101. As the LPF, for example, a finite impulse response (FIR) filter or the like having cosine roll-off characteristics of the cutoff frequency $f_c/2$ can be used. As described above, various implementation methods can be employed for digital signal processing in the signal generating device of the present invention, and specific signal processing methods are not limited only to those described in the specification including processing for other blocks which will be described later.

In the folding unit 621 in FIG. 6, a positive frequency component of the high-frequency signal 662 in the frequency domain is shifted by $-f_c$, and a negative frequency component thereof is shifted by $+f_c$, and further, the amplitude is r-folded to output a folded signal 663. Specifically, using Hilbert transform, for example, the following computation should be performed. The Hilbert transform can be generally achieved by using a FIR filter. In other words, assuming that Hilbert transform of x(n) is Hilbert[x(n)], the following equation is given:

$$x_{\pm}(n) = \frac{x(n) \pm j \cdot \text{Hilbert}[x(n)]}{2} \quad \text{Equation (4)}$$

where x(n) (n is an integer index) is the high-frequency signal 662 to be inputted, x+(n) is a positive frequency component, and x_(n) is a negative frequency component.

Furthermore, an operation of shifting the spectrum by $\pm f_c$ in the frequency domain corresponds to multiplying it by $\exp(\pm j2\pi f_c n/f_{s0})$ in the time domain. Therefore, in the folding unit 621, the computation of the following equation is performed to output a folded signal 663 y(n):

$$\begin{aligned} y(n) &= r \cdot \left\{ x_+(n) \cdot \exp\left(-j2\pi \frac{f_c}{f_{s0}} n\right) + x_-(n) \cdot \exp\left(j2\pi \frac{f_c}{f_{s0}} n\right) \right\} \\ &= r \cdot \left\{ x(n) \cdot \cos\left(2\pi \frac{f_c}{f_{s0}} n\right) + \text{Hillbert}[x(n)] \cdot \sin\left(2\pi \frac{f_c}{f_{s0}} n\right) \right\} \end{aligned}$$

Equation (5)

The folded signal 663 obtained by Equation (5) corresponds to the signal component indicated as rB in the frequency domain shown in FIG. 5(c) and the signal component indicated as rC therein. In other words, this corresponds, in Equations (1), to signals in which each of second clauses $r\{S_B(f+f_c)+S_C(f-f_c)\}$ of the spectra $S_1(f)$, $S_2(f)$ of the analog signals to be outputted from the two DACs 121, 122 sampled with the sampling rate $f_{s0}$ in the time domain. In practice, the computation in the 2nd line of Equation (4) and Equation (5) needs to be performed by delaying the first clause x(n) by a delay caused by Hilbert transform, but for simplification, delay operation is omitted in the description.

In resampling units 631, 632 in FIG. 6, the sampling rates for the digital signals of the low-frequency signal 661 and folded signal 663 are converted from $f_{s0}$ to $f_{s1}$, respectively. Here, fs1 is a sampling rate for the DACs 121, 122, and, as described above, it is necessary to set a value larger than twice the upper limit frequency of the output signal of S1(f) for the DAC 121 and the output signal of $S_2(f)$ for the DAC 122. The upper limit frequency for S1(f) and S2(f) is somewhat larger than about $f_c/2$ and smaller than the upper limit frequency of the desired signal Strg(f), and therefore can be assumed to be fs1<$f_{s0}$ in general. However, fs1=$f_{s0}$ is also possible, and in such a case, the resampling units 631, 632 can naturally be omitted. Assuming $f_{s1}=f_{s0}$ refers to a case where, for example, a sampling rate operable for the DACs 121, 122 is relatively larger by about four times the output bandwidth $f_c/2$ of that DAC.

In an addition unit 641 in FIG. 6, the resampled folded signal 663 is added to the resampled low-frequency signal 661, a first signal 671 is generated. The first signal 671 corresponds to the sum of all spectra shown in FIG. 5(c), that is, corresponds to the first signal denoted as S1(f) in Equations (1). In the subtraction unit 642, a second signal 672 is generated by subtracting the resampled folded signal 663 from the resampled low-frequency signal 661. The second signal 672 corresponds to the sum of all spectra shown in FIG. 5(d), that is, corresponds to the second signal denoted as S2(f) in Equations (1). It should be noted that the first signal 671 and the second signal 672 are still digital signals.

Therefore, the present invention may be carried out using a signal generating device comprising: a digital signal processing unit 110; two digital-to-analog converters (DACs) 121, 122; and an analog multiplexer 131 that alternatingly switches analog signals outputted from the two DACs with a frequency $f_c$ for outputting as analog signals, wherein the digital signal processing unit includes: when a signal, among desired output signals having an upper limit frequency of less than $f_c$, made of a component having an absolute value of a frequency being substantially $f_c/2$ or less is assumed as a low-frequency signal (signal component A), and when, for a positive frequency component (signal component B) and a negative frequency component (signal component C) which are made of a component having an absolute value of a frequency being substantially $f_c/2$ or more among the desired output signals, a signal in which the positive frequency component is shifted by $-f_c$ on a frequency axis and a signal in which the negative frequency component is shifted by $+f_c$ on the frequency axis are assumed as a folded signal, means for generating a first signal 671 that is equal to a signal obtained by multiplying the folded signal by a constant (r) and adding a resultant to the low-frequency signal; and means for generating a second signal 672 that is equal to a signal obtained by multiplying the folded signal by the constant (r) and subtracting a resultant from the low-frequency signal, and wherein: a digital signal corresponding to the first signal generated in the digital signal processing unit is inputted into one of the two DACs; and a digital signal corresponding to the second signal generated in the digital signal processing unit is inputted into the other one of the two DACs.

Lastly, in compensation units 651, 652 in FIG. 6, frequency response characteristics intrinsically owned by the DACs 121, 122 are compensated. Specifically, a filter having a response characteristic of a reverse characteristic that approximately cancels the frequency response characteristics of the DACs 121, 122 may be employed. Such compensation processing is sometimes called as pre-equalization and is commonly performed in a high-speed communication system using the DAC. Output digital signals from the compensation units 651, 652 are supplied to the DACs 121, 122, respectively, as outputs of the digital signal processing unit 110. As for the output of the DAC 121, the first signal having the spectrum shown in FIG. 5(c) as the analog signal and which is denoted as S1(f) in Equations (1), is obtained. Similarly, as for the output of the DAC 122, the second signal having the spectrum shown in FIG. 5(d) as the analog signal and which is denoted as S2(f) in Equations (1) is obtained. In the case where the frequency response characteristics of the DACs 121, 122 are substantially flat within the bandwidths up to the upper limit frequency of the first signal S1(f) and second signal S2(f), the compensation units 651, 652 can be omitted.

In the case where the sampling rate $f_{s0}$ of the input signal 101 in the signal generating device of the present invention satisfies a certain condition, the computation in the folding unit 621 in FIG. 6 can be performed without using the above-described Hilbert transform. Another implementation method of performing computation in the folding unit 621 without using the Hilbert transform will be shown below. Here, the high-frequency signal 662 to be inputted is denoted as x(n), and the spectrum of x(n) (discrete-time Fourier transform) is denoted as X(f). The spectrum X(f) is a periodic function of periodic $f_{s0}$ on the frequency axis, and can be represented as the following equation using SB(f) and SC(f) in Equations (1):

$$X(f) = \sum_{k=-\infty}^{+\infty} \{S_B(f - kf_{s0}) + S_C(f - kf_{s0})\} \quad \text{Equation (6)}$$

A signal obtained by multiplying x(n) by the cosine wave of the frequency $f_c$ in the time domain and by 2r-folding the resultant is denoted as y'(n) as in the following equation:

$$y'(n) = 2r \cdot x(n) \cdot \cos\left(2\pi \frac{f_c}{f_{s0}} n\right) \quad \text{Equation (7)}$$

At this time, Y'(f), the spectrum of y'(n)(discrete-time Fourier transform) is represented by the following equation:

Equation (8)

$$\begin{aligned} Y'(f) &= 2r \cdot X(f) * \frac{\delta(f - f_c) + \delta(f + f_c)}{2} \\ &= r \cdot \{X(f - f_c) + X(f + f_c)\} \\ &= r \sum_{k=-\infty}^{+\infty} \{S_B(f - f_c - kf_{s0}) + S_C(f - f_c - kf_{s0}) + \\ &\quad S_B(f + f_c - kf_{s0}) \text{ Equation (8) + Expression (8)} \\ &\quad S_C(f + f_c - kf_{s0})\} \end{aligned}$$

Meanwhile, as described above, a signal y(n) to be obtained as the output of the folding unit 621 is a signal in which $r\{S_B(f+f_c)+S_C(f-f_c)\}$ in Equations (1) is sampled with the sampling rate $f_{s0}$ in the time domain. Therefore, Y(f), the spectrum of y(n) (discrete-time Fourier transform) is represented by the following equation:

$$Y(f) = r \sum_{k=-\infty}^{+\infty} \{S_B(f + f_c - kf_{s0}) + S_C(f - f_c - kf_{s0})\} \quad \text{Equation (9)}$$

recognized that, when filtering processing so as to remove $S_B(f-f_c-kf_{s0})$ in the first clause of the third row on the right side and $S_C(f+f_c-kf_{s0})$ in the fourth clause thereof in Equation (8) is performed for y'(n) which corresponds to Equation (8), y(n) can be obtained.

Figure 7A:
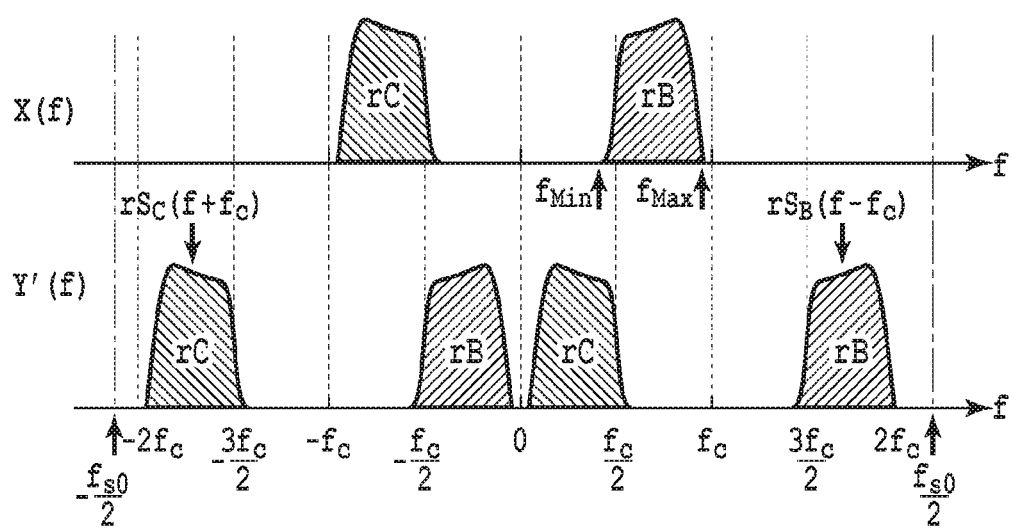
FIG. 7A is a spectrum diagram illustrating the computing operation of a folding unit when Hilbert transform is not used in the signal generating device according to the first embodiment of the present invention.
Figure 7B:
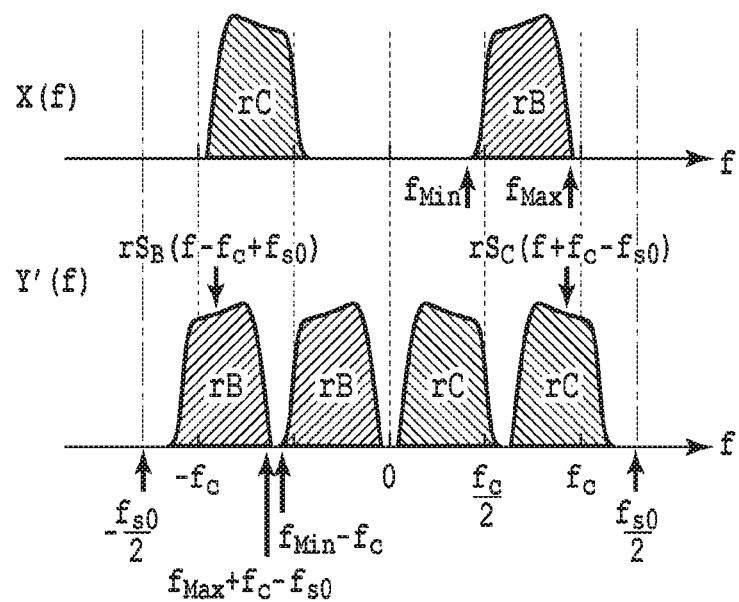
FIG. 7B is another spectrum diagram illustrating the computing operation of the folding unit when Hilbert transform is not used in the signal generating device according to the first embodiment of the present invention.

FIG. 7A and FIG. 7B are spectrum diagrams illustrating the computing operation of the folding unit when Hilbert transform is not used. Hereafter, $S_B(f-f_c-kf_{s0})$ in the first clause of the third row on the right side in Equation (8) will be focused. The first clause of Equation (8) represents a spectrum which is obtained by r-folding the signal component B in FIG. 5(b) and shifting it by $+f_c$ on the frequency axis and which repeatedly appears in an $f_{s0}$ interval. Here, the upper limit frequency of the signal component B is denoted as $f_{Max}$ and the lower limit frequency is denoted as $f_{Min}$. As for a spectrum of the first clause of Equation (8), in the case where the sampling rate $f_{s0}$ of the input signal 101 is $f_{s0} > f_{Max} + f_c$, as shown in FIG. 7A, a component of k=0, that is, $S_B(f-f_c)$, only appears in a Nyquist band, that is, $|f| < f_{s0}/2$. This can be easily removed by using, for example, the LPF of the cutoff frequency of about $f_c$.

Meanwhile, in the case where the sampling rate $f_{s0}$ of the input signal 101 is $f_{s0} < f_{Max} + f_c$, as shown in FIG. 7B, the component of k=−1, that is, $S_B(f-f_c+f_{s0})$ appears on the negative frequency side. The upper limit frequency of the unnecessary component that appears on this negative frequency side is $f_{Max}+f_c-f_{s0}$, whereas the lower limit frequency of $S_B(f+f_c)$, which is a necessary component, is $f_{Min}-f_c$. Therefore, if the relation of $f_{Max}+f_c-f_{s0}<f_{Min}-f_c$ is established, this unnecessary component which appears on the negative frequency side can be removed by using the LPF of the cutoff frequency of substantial $|f_{Min}-f_c|$. The above discussion is similarly established for $S_C(f+f_c-kf_{s0})$ in the fourth clause of the third row on the right side in Equation (8) as well. In other words, if $f_{Max}+f_c-f_{s0}<f_{Min}-f_c$, as for processing in the folding unit 621, an unnecessary frequency component may be removed by an appropriate LPF after multiplying the input signal represented in Equation (7) by the cosine wave of the frequency $f_c$.

Furthermore, when $f_{s0}=2 f_c$, the unnecessary component $S_B(f-f_c+f_{s0})$ resulted from multiplication of the cosine wave matches exactly with the necessary component $S_B(f+f_c)$, and therefore, there is no need to make removal. Accordingly, processing in the folding unit 621 is more simple, and a desired folded signal of y(n) can be obtained only by the computation in the following equation without using the LPF.

$$y(n) = r \cdot x(n) \cdot \cos\left(2\pi \frac{f_c}{f_{s0}} n\right) = r \cdot x(n) \cdot \cos(\pi n) \qquad \text{Equation (10)}$$

In other words, the signs of r·x(n) alternately inverted may be assumed as y(n). In order to confirm this, the spectrum of Equation (10) (discrete-time Fourier transform) Y(f) is sought for and the following equation can be expanded:

$$\begin{aligned} Y(f) &= \frac{r}{2}\sum_{k=-\infty}^{+\infty} \{S_B(f-f_c-kf_{s0}) + S_C(f-f_c-kf_{s0}) + \\ &\qquad S_B(f+f_c-kf_{s0}) + S_C(f+f_c-kf_{s0})\} \\ &= \frac{r}{2}\sum_{k=-\infty}^{+\infty} [S_B\{f-(1+2k)f_c\} + S_C\{f-(1+2k)f_c\} + \\ &\qquad S_B\{f+(1-2k)f_c\} + S_C\{f+(1-2k)f_c\}] \\ &= r\sum_{k'=-\infty}^{+\infty} \{S_B(f+f_c-2k'f_c) + S_C(f-f_C-2k'f_c)\} \end{aligned} \qquad \text{Equation (11)}$$

Equation (11) is identical to the result indicated as $f_{s0}=2 f_c$ in Equation (9).

Furthermore, as another implementation method, the entire processing flow in the digital signal processing unit 110 shown in FIG. 6 can be achieved by using processing in the frequency domain instead of using the time domain as explained above. For instance, a time-domain signal of the input signal 101 is firstly converted into a frequency-domain signal at the pre-stage of the band separation unit using the discrete Fourier transform (DFT). Thereafter, processing of each of the band separation unit 611, folding unit 621, addition unit 641, subtraction unit 642, and compensation units 651, 652 are all performed in the frequency domain. Lastly, the outputs of the frequency-domain signals of the compensation units 651, 652 are reconverted into the time-domain signals using inverse-discrete Fourier transform (IDFT), which are outputted to the DACs 121, 122. In the frequency domain, each of the operations for band separation and the compensation of DAC response characteristics can be easily achieved by multiplying them by an appropriate filter shape function. Also, the folding operation (frequency shift) can be easily achieved by index replacements (rearrangement of data points) in the frequency domain. In this case, block processing for every number of points for DFT and IDFT is to be performed, and overlapping processing which is typically used may be performed to remove the influence of the inter-block interference.

As described above, variations of different implementation methods for processing in each of the blocks in the digital signal processing unit 110 have been presented, but the feature of the present invention does not depend on the method of implementing specific computing processing. The present invention has a feature of operating the digital signal processing unit 110 so as to output, to the analog multiplexer 131, the first signal having the spectrum shown in FIG. 5(c) and the second signal having the spectrum shown in FIG. 5(d) as the analog signals outputted from the two DACs 121, 122. In other words, the following advantageous result specific to the present invention is exerted such that the digital signal processing unit 110 supplies digital signals to the two DACs by outputting signals indicated as the first signal $S_1(f)$ and the second signal $S_2(f)$ in Equations (1).

In other words, due to signal processing specific to the present invention in the digital signal processing unit 110, in the signal generating device that includes the two DACs and the analog multiplexer, it is possible to output any signal of a broader bandwidth compared to the output bandwidth of individual DACs. Specifically, by combining an on-going CMOS-DAC with the present invention, the output bandwidth of about 30 GHz can be achieved. The band of the single CMOS-DAC has become wider recently, and further, by using a compound semiconductor device such as SiGe and InP, the output bandwidth of up to about 50 GHz can be expected by combining the device with the present invention.

Further, as is evident from the entire configuration of the signal generating device shown in FIG. 1, each of the output points of the DACs 121, 122 through the output of the analog multiplexer 131 forms, when two signal paths are viewed along the traveling direction of electric signals, a symmetric configuration by regarding the traveling direction as a virtual central axis. Therefore, the adjustment of the amplitude and delay of the DACs can be suppressed to the minimum. There may be a case where the signal generating device of the present invention needs adjustment between the DACs caused by variations in manufacturing semiconductor chips, adjustment between connection cables in the device, and adjustment for compensating the characteristic difference between the input ports of the analog multiplexer. For instance, when one of the DACs has a smaller output amplitude than that of the other DAC, the other DAC needs to be adjusted so as to suppress the output. Generally, such adjustments may only require simple and fine tunings as long as DACs manufactured in the same design and the same process are used. Such advantageous results specific to the present invention do not depend on the details of the specific implementation method of the processing flow in the digital signal processing unit 110 for obtaining the first signal $S_1(f)$ and second signal $S_2(f)$.

Second Embodiment

Figure 8:
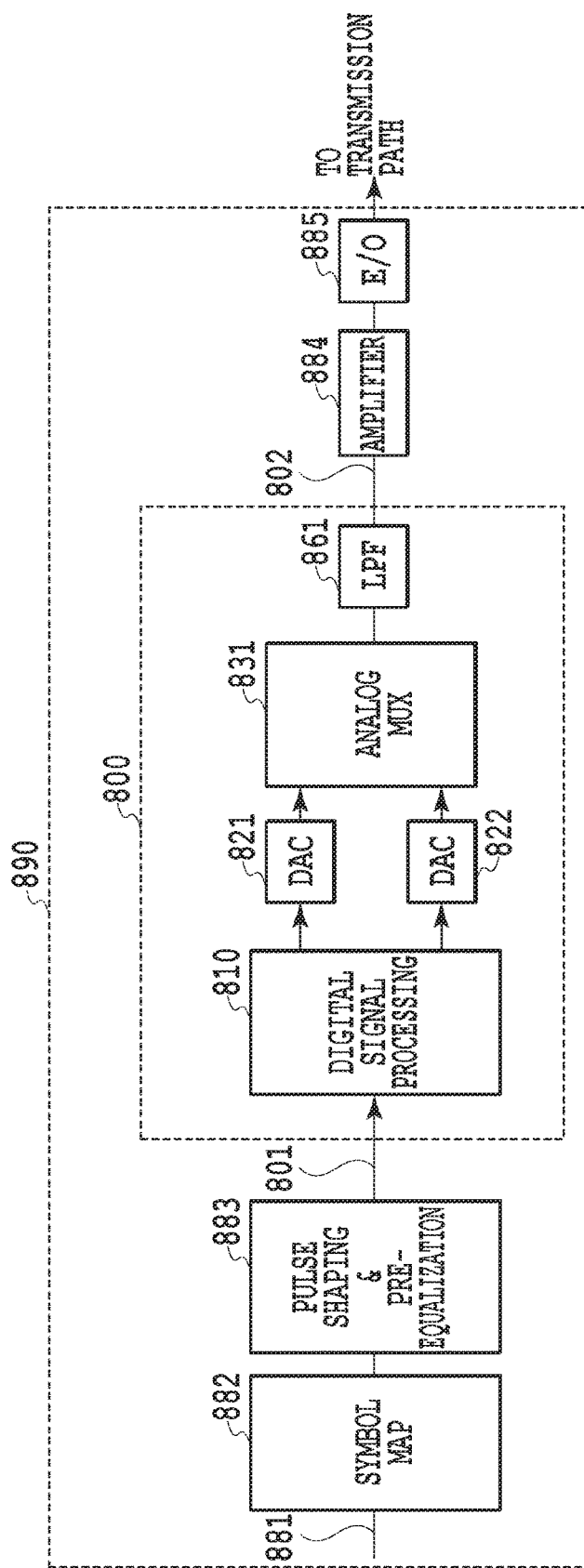
FIG. 8 is a diagram schematically showing a configuration example of an optical transmitter including a signal generating device according to a second embodiment of the present invention.

FIG. 8 is a diagram schematically showing a configuration example of an optical transmitter including the signal generating device according to the second embodiment of the present invention. In the present embodiment, a signal generating device 800 equivalent to the signal generating device shown in FIG. 1 is incorporated into an optical transmitter 890. The signal generating device 800 of the present embodiment is different from the signal generating device 100 shown in FIG. 1 in an aspect that a low pass filter (LPF) 861 is connected to an analog multiplexer 831 at its post-stage. The LPF 861 can be achieved by an analog LPF of the cutoff frequency of about $f_c$. The LPF 861 removes the signal component B which exists in $f<-f_c$ and the signal component C which exists in $f>f_c$, among the outputted signal spectrum shown in FIG. 5(g), as unnecessary signal components. As described above, there may be a case where these unnecessary components are naturally removed due to the output characteristics owned by the analog multiplexer 831, or, these unnecessary components can also be removed in the receiving side of the device which is responsive to the optical transmitter 890. As in the present embodiment, by inserting the LPF 861 to the post-stage of the analog multiplexer 831, these unnecessary components can certainly be removed in the transmitting side of the device. Due to the configuration including the LPF in the present embodiment, an interference to a desired signal component caused by the unnecessary component, when the nonlinearity of a transmission path is large, for example, can be prevented. Also, in the case where a signal generated by the signal generating device of the present invention is transmitted by multiplexing the frequency (wavelength) with other signals on a carrier such as light, crosstalk to an adjacent channel caused by the unnecessary component can be suppressed.

The optical transmitter 890 of the present embodiment is an optical transmitter that uses light intensity modulation, and is used in an optical transmission system using an intensity modulation-direct detection system and the like. In the present embodiment, a digital signal processing unit 810 of the signal generating device 800 generates a baseband signal for the transmitter that uses light intensity modulation. The signal generating device 800 outputs a real-valued digital waveform 802 in which digital modulation and other processing which will be described later are added to transmission information data. In the optical transmitter 890, first of all, a symbol mapping according to a predetermined modulation system is made in the digital modulation unit 882 for transmission information data 881 that has underwent error correcting coding beforehand. In a waveform shaping and compensating unit 883, pulse shaping, channel response compensation processing (pre-equalization), processing of compensating nonlinearity of voltage response for an electro-optic conversion (E/O) device which is arranged at the post-stage of the optical transmitter 890, and the like are made. As for the signal generating device 800, digitized data that underwent the above series of processing is supplied, as input data 801, to the digital signal processing unit 810. Functions such as the above-described error correcting coding, symbol mapping, pulse shaping, and channel pre-equalization can normally be all implemented physically by the transmitting side of the DSP. Therefore, the input data 801 to the signal generating device 800 is typically supplied from the transmitting side of the DSP. In the optical transmitter 890 of the present embodiment, functions of the digital signal processing unit 810 included in the signal generating device 800 may also be configured to be integrally incorporated into the above-described transmitting side of the DSP.

An analog output signal 802 from the signal generating device 800 is, after amplified by an amplifier 884, converted into an optical signal by an E/O device 885 and outputted to a transmission path. As the E/O device 885, a device such as a direct modulation laser and an absorption-type modulator integrated laser which converts an electric signal into light intensity information is used. In the optical transmitter 890 including the signal generating device 800 in the present embodiment, the digital signal processing unit 810 is operated such that two DACs 821, 822 output, to the analog multiplexer 831, the first signal having the spectrum shown in FIG. 5(c) and the second signal having the spectrum shown in FIG. 5(d) as output analog signals. In the present embodiment, the digital signal processing unit 810 generates the baseband signal for the transmitter that uses light intensity modulation. An advantageous result of the present invention is exerted when the digital signal processing unit 810 supplies digital signals by outputting signals indicated as the first signal $S1(f)$ and the second signal $S2(f)$ in Equations (1) to the two DACs. Due to the signal processing specific to the present invention in the digital signal processing unit 810, the signal generating device including the two DACs 821, 822 and the analog multiplexer 831 allows outputting any signal of a broader bandwidth compared to the output bandwidth for individual DACs. Further, as is evident from the entire configuration of the digital signal processing unit 810 shown in FIG. 8, each of the output points of the DACs 821, 822 through the output of the analog multiplexer 131 forms, when two signal paths are viewed along the traveling direction of electric signals, a symmetric configuration by regarding the traveling direction as a virtual central axis. Therefore, as in the signal generating device of the first embodiment, the adjustment of the amplitude and delay of the DACs can be suppressed to the minimum in the present embodiment as well.

Third Embodiment

Figure 9:
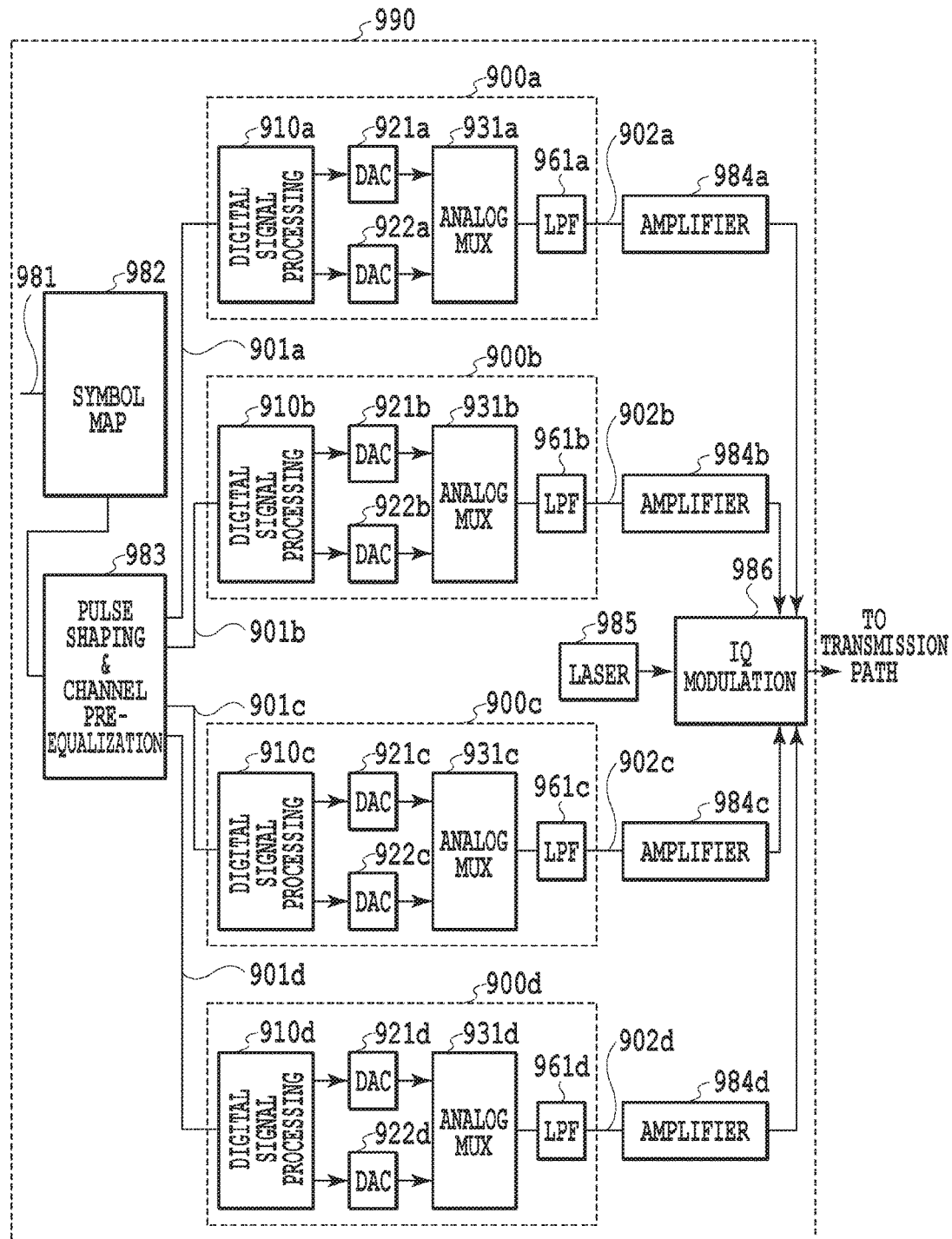
FIG. 9 is a diagram schematically showing a configuration of an optical transmitter including a signal generating device according to a third embodiment of the present invention.

FIG. 9 is a diagram schematically showing a configuration of an optical transmitter including the signal generating device according to the third embodiment of the present invention. An optical transmitter 990 includes four signal generating devices 900a to 900d. A configuration of each of the signal generating devices 900a to 900d is identical to the signal generating device 800 of the second embodiment shown in FIG. 8. The optical transmitter 990 of the present embodiment is a transmitter using the intensity and phase of two light-orthogonal polarization waves, and is used in a coherent optical transmission system and the like. When the two orthogonal polarization waves are represented as an X polarization wave and a Y polarization wave, an in-phase component as I, and an orthogonal phase component as Q, each of the signal generating devices 900a to 900d generates four types of real-valued waveforms which correspond to an I component of X polarization wave, a Q component of X polarization wave, an I component of Y polarization wave, and a Q component of Y polarization wave.

In the optical transmitter 990, first of all, a symbol mapping according to a modulation system using the two orthogonal polarization waves is made for transmission information data 981 that has underwent error correcting coding beforehand. Further, after undergoing pulse waveform shaping and necessary channel pre-equalization, digitized data corresponding to each of the real-valued waveforms for the I component of X polarization wave, the Q component of X polarization wave, the I component of Y polarization wave, and the Q component of Y polarization wave is supplied to each of the signal generating devices 900a to 900d as pieces of input data 901a to 901d. The analog output signals from the signal generating devices 900a to 900d are amplified by amplifiers 984a to 984d, respectively. The amplified signals are inputted to a polarization multiplexed IQ modulator 986 to which a transmission laser 985 is connected and outputted to a transmission path as an optical signal. In the optical transmitter 990 of the present embodiment as well, functions such as the error correcting coding, symbol mapping, pulse shaping, channel response compensation, response nonlinearity compensation for the IQ modulator can all be implemented at the transmitting side of the DSP. Therefore, input data 901a to 901d to the signal generating devices 900a to 900d can be typically supplied from the transmitting side of the DSP. In the optical transmitter 990 of the present embodiment, each of the functions of digital signal processing units 910a to 910d included in the signal generating devices 900a to 900d may also be configured to be integrally incorporated into the above-described transmitting side of the DSP.

In the optical transmitter 990 including the signal generating devices 900a to 900d in the present embodiment as well, in each of the signal generating devices, that is, for example, in the signal generating device 900a, the digital signal processing unit 910a is operated such that two DACs 921a, 922a output the first signal having the spectrum shown in FIG. 5(c) and the second signal having the spectrum shown in FIG. 5(d) to an analog multiplexer 931a as output analog signals. In the signal generating devices 900a to 900d of the optical transmitter 990 in the present embodiment, each of the digital signal processing units generates four types of baseband signals for a modulator that uses modulation using two orthogonal polarization waves. An advantageous result of the present invention is exerted when each of the digital signal processing units supplies digital signals by outputting signals indicated as the first signal S1(f) and the second signal S2(f) in Equations (1) to the two corresponding DACs. Due to the signal processing specific to the present invention in the digital signal processing unit, the signal generating device including the two DACs and the analog multiplexer allows outputting the baseband signal of a broader bandwidth compared to the output bandwidth for individual DACs. As in each of the first embodiment and each of the second embodiment, the adjustment of the amplitude and delay of the DACs can also be suppressed to the minimum.

Fourth Embodiment

Figure 11:
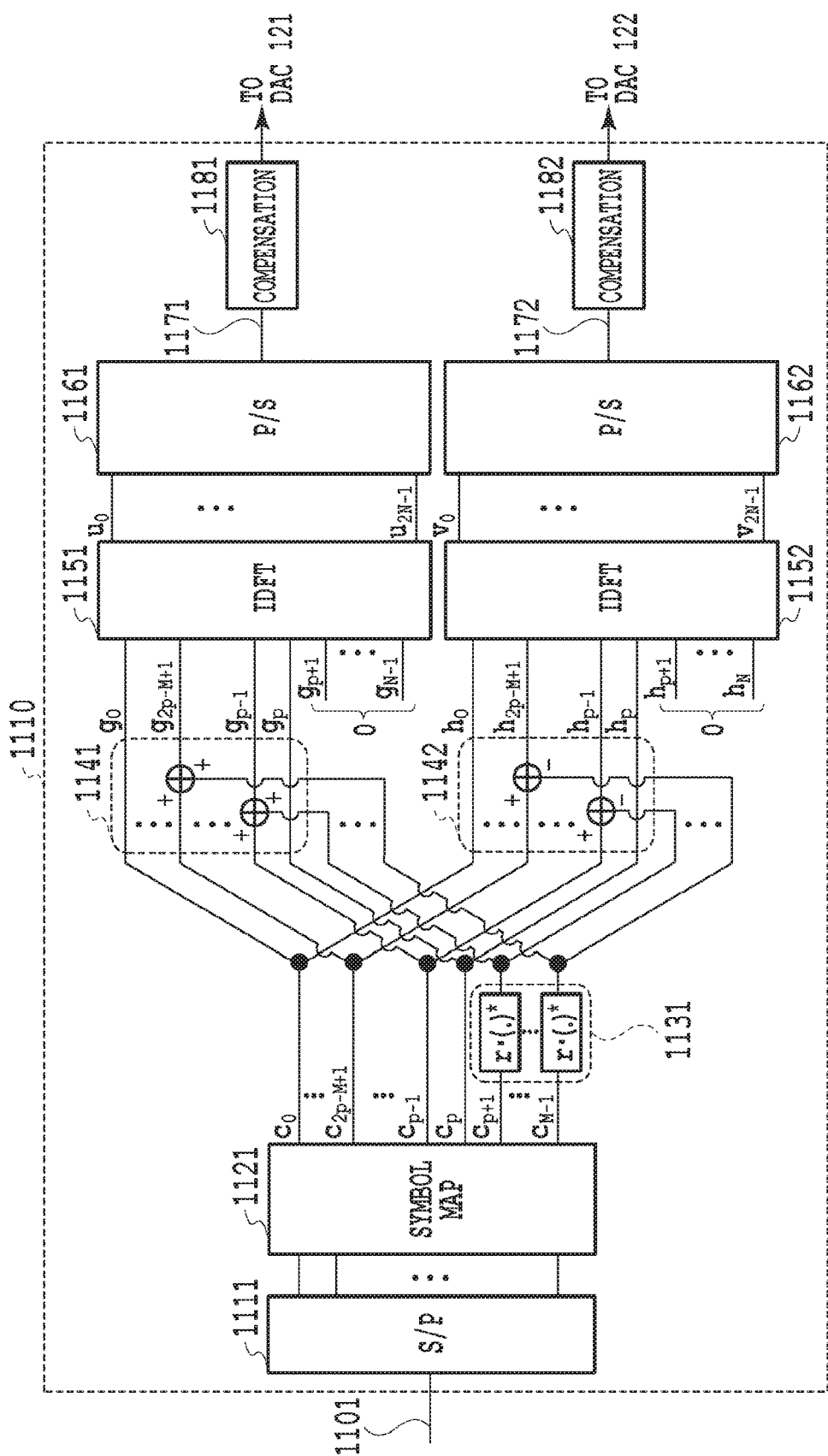
FIG. 11 is a diagram showing a configuration and flow of the digital signal processing unit in the signal generating device according to the fourth embodiment of the present invention.

FIG. 11 is a diagram showing a configuration of the digital signal processing unit in the signal generating device according to the fourth embodiment of the present invention. The entire configuration of the signal generating device of the present embodiment is identical to the signal generating device 100 of the first embodiment shown in FIG. 1, but is different from the first embodiment in the aspect of providing, as a digital signal processing unit, a digital signal processing unit 1110 that performs processing shown in FIG. 11. In addition, the signal generating devices according to the first embodiment through the third embodiment can generate any desired signal less than the upper limit frequency $f_c$, when the clock frequency of the analog multiplexer is $f_c$. A signal that can be generated by the signal generating device of the present embodiment is limited to a multicarrier signal such as an orthogonal frequency-division multiplexing (OFDM) signal and a discrete multi-tone (DMT), and thus the signal generating device of the present embodiment is adapted to the multicarrier signal.

A general flow of generating a multicarrier signal such as the OFDM signal and the DMT is, for example, shown in NPL 3 as follows. Its outline is, first of all, to convert input data from serial to parallel (S/P conversion) in a digital domain to split it into subchannels, and to map data of each of the subchannels to a transmission constellation to create a complex symbol value (subsymbol value) for each frequency subcarrier. Next, by inverse-discrete Fourier transforming (IDFT) a subsymbol sequence, a time domain data sequence corresponding to a signal in which each subcarrier is modulated with the corresponding subsymbol is obtained. Lastly, it is parallel-serial converted (P/S conversion) and sent to the DAC to obtain a multicarrier signal as a DAC output. These series of processing are performed as block processing for every number of points in the IDFT. In most cases, at the pre-stage or post-stage of the P/S conversion, a guard interval such as a cyclic prefix (CP) is added to each symbol so that an inter-block interference caused by dispersion of transmission paths or the like can be removed on the receiving side. Also, an inverse fast Fourier transform (IFFT), which is an algorithm to rapidly perform the IDFT, is generally used for conversion from a frequency-domain signal to a time-domain signal. In the case of the OFDM, the same modulation constellation for all subcarriers is basically used, and in the case of the DMT, a modulation constellation in which modulation multilevels and intensity are optimized for every subcarrier according to the frequency response characteristic of the transmission path is used (NPL 4).

In the case where the output of a multicarrier signal of a broader bandwidth compared to an output bandwidth for individual DACs needs to be obtained using the principle of the signal generating device of the present invention as explained in FIGS. 5(a) to 5(g), the multicarrier signal may simply be set as a desired signal in the first embodiment. In other words, a digital signal processing circuit that performs multicarrier signal generation processing shown in NPL 3 is separately provided outside the signal generating device of the present invention, and an outputted digital data signal from the digital signal processing circuit may be applied to the input signal 101 to be sent to the digital signal processing unit 110 in FIG. 6. However, in the case where a desired signal is a multicarrier signal, the multicarrier signal can be more efficiently generated by including the processing of multicarrier signal generation processes in the digital signal processing unit of the present invention, instead of separately providing the digital signal processing circuit for generating the multicarrier signal as shown in NPL 3. A configuration example of further introducing processing of modified multicarrier signal generation processes into the digital signal processing unit of the signal generating device of the present invention, its operation, and its implementation method will be explained below.

Figure 10:
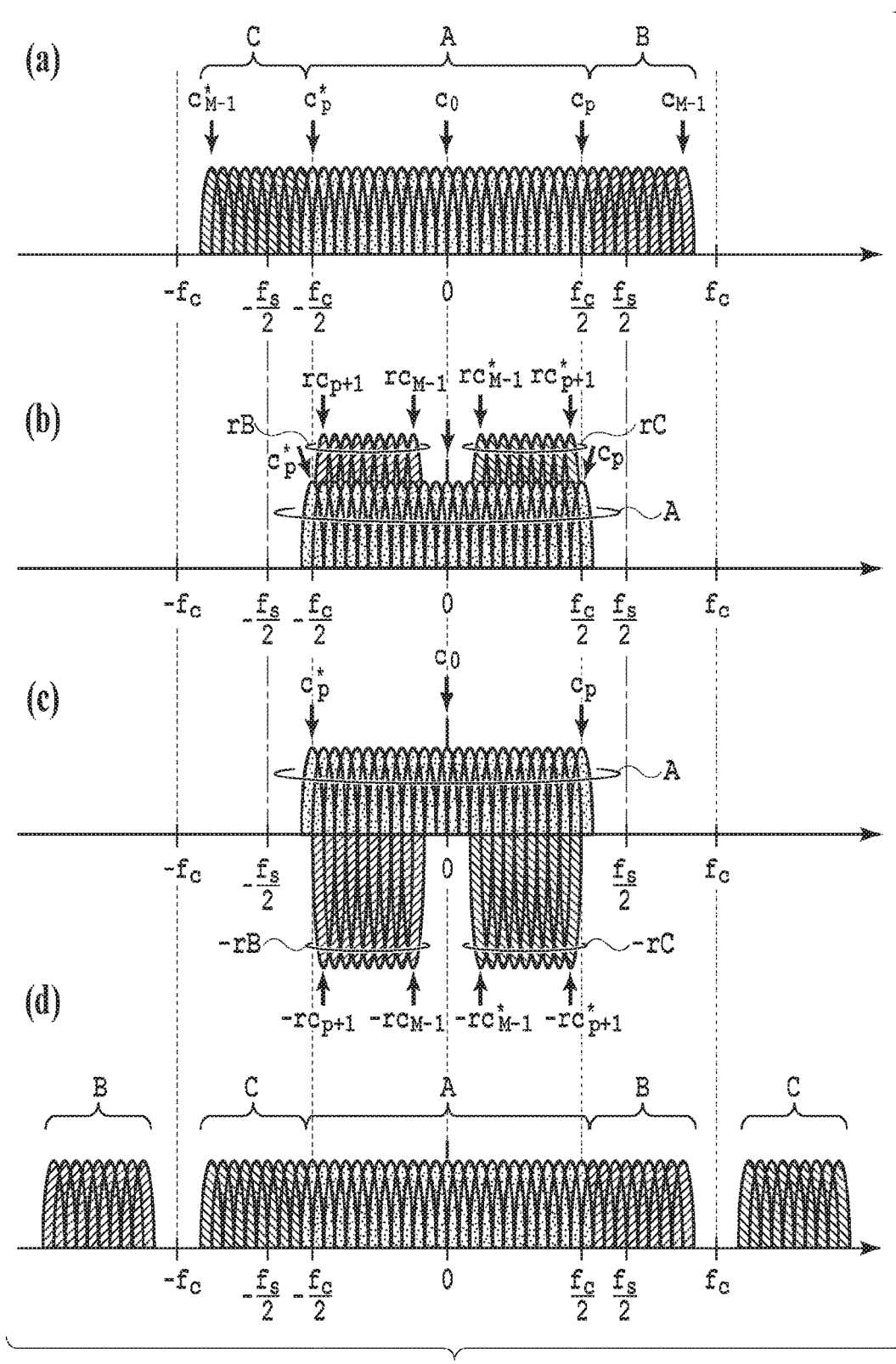
FIG. 10 is a diagram schematically illustrating processing until an OFDM signal is generated in the frequency domain by a signal generating device according to a fourth embodiment of the present invention.

FIG. 10 is a diagram illustrating processing until an OFDM signal is generated in the frequency domain by the signal generating device of the present embodiment. FIG. 10(a) shows a baseband OFDM signal, which is a desired signal. Here, the number of subcarriers is denoted as M, a subsymbol value for m-th (m=0, 1, . . . , M−1) subchannel as cm(t), and a subcarrier frequency as mΔf. Therefore, Δf is a subcarrier frequency interval. Further, Δf and $f_c$ are set so that the relation of the following equation is established between the drive clock frequency $f_c$ of the analog multiplexer 131 in the signal generating device and a p-th subcarrier frequency pΔf:

$$p\Delta f = \frac{f_c}{2} \qquad \text{Equation (12)}$$

Similar to the signal generating device of the first embodiment, the entire upper limit frequency of a desired signal is assumed to be less than the clock frequency $f_c$ of the analog multiplexer. Accordingly, the relation of M−1<2p is established in Equation (12). Each complex symbol value $c_m(t)$ varies depending on a symbol rate Δf, but a time variation t is omitted in each of the diagrams illustrated in FIG. 10 for simplification.

A desired OFDM signal having a spectrum shown in FIG. 10(a) is divided into different frequency components to perform the following signal processing based on a concept similar to the series of digital signal processing in the frequency domain shown in FIGS. 5(a) to 5(g). Similar to FIGS. 5(a) to 5(d), the desired signal is separated into a low-frequency signal indicated as A, a high-frequency signal (positive frequency component) indicated as B, and a high-frequency signal (negative frequency component) indicated as C. Further, the series of operation are performed such that the respective amplitudes of the signal component B and the signal component C are r-folded in a vertical axis direction, and the signal component C is horizontally shifted by $+f_c$ and the signal component B is horizontally shifted by $-f_c$ in their lateral directions, respectively, to superimpose them on the signal component A. Provided, however, in the present embodiment, instead of cutting out each signal component by using the LPF or the like from the desired signal generated in the digital domain, the above-described amplitude change and frequency shift operation are made on the frequency domain in the stage of signal generation. In other words, as shown in FIG. 10(a), 0 to p-th subchannel signals are treated as a signal component A, the positive frequency component of p+1 to M−1th subchannel signals as a signal component B, and the negative frequency component as a signal component C, and further, the signal component B and the signal component C are shifted and are superimposed on the signal component A in the frequency domain at the generation stage of the OFDM signal. Operation at the time of generating the OFDM signal will be explained below in detail.

FIG. 10(b) shows a first spectrum after folding the signal component B and the signal component C, which are the high-frequency signals of the OFDM signal, and this state corresponds to the state of the spectrum shown in FIG. 5(c). In order to generate the spectrum of FIG. 10(b), an IDFT computation may be performed by r-folding the p+1th through M−1th subsymbol values of OFDM signal for a desired signal at the OFDM signal generation stage beforehand, taking their complex conjugates, and adding them to p−1th through 2p−M+1th subsymbol values. FIG. 10(c) shows a second spectrum after folding the signal component B and the signal component C, which are the high-frequency signal of the OFDM signal, and this state corresponds to the state of the spectrum shown in FIG. 5(d). In order to generate the spectrum of FIG. 10(c), the addition in the above-described signal generation procedure shown in FIG. 10(b) may be replaced with subtraction. The setting of a coefficient r value for changing amplitudes is identical to that of the first embodiment. The upper limit frequency of a signal having the spectrum shown in FIGS. 10(b) and 10(c) is substantially $f_c/2+Δf/2$. If the subcarrier frequency interval Δf is sufficiently small, the waveform can be sufficiently generated even with the DACs having the output bandwidth of about $f_c/2$.

When a signal having the first spectrum of FIG. 10(b) and a signal having the second spectrum of FIG. 10(c) are outputted from the DACs 121, 122, respectively, due to the same principle as the spectrum operation shown in FIGS. 5(e) to 5(g), a spectrum signal shown in FIG. 10(d) as the output of the analog multiplexer 131 can be obtained. As in the spectrum shown in FIG. 5(g), each of unnecessary signal component B and signal component C remains in the frequency domain of $f<-f_c$ and $f_c<f$. These unnecessary signal components can be easily removed by using the low pass filter having a cutoff frequency in the vicinity of frequency $f_c$. As the case may be, they are naturally cut on the output side of a circuit of the analog multiplexer or the transmission path, and further, on the receiving side of the device which is responsive to the signal generating device of the present invention. As such, even if the output bandwidth for the DACs 121, 122 is about $f_c/2$, in the signal generating device of the present embodiment, as a final output signal of the analog multiplexer 131, any OFDM signal having the upper limit frequency sufficiently larger than $f_c/2$ (but smaller than $f_c$) can be obtained. The example of the series of processing of generating the OFDM signal explained in FIG. 10 can also be applied to a multicarrier signal such as a DMT signal.

The series of processing on the frequency domain for the above-described multicarrier signal along with FIG. 10 can be expressed in the following equation. First of all, time waveform Strg(t) and spectrum Strg(f) of a desired signal can be expressed in the following equation when omitting an extrinsic scaling factor.

$$S_{trg}(t) = \sum_{m=0}^{M-1} \{c_m(t) \cdot \exp(j2\pi m\Delta ft) + c_m^*(t) \cdot \exp(-j2\pi m\Delta ft)\}$$

$$S_{trg}(f) = \sum_{m=0}^{M-1} \{C_m(f - m\Delta f) + C_m^*(f + m\Delta f)\}$$

Equation (13)

Provided, however, $C_m(f)$ indicates Fourier transform of $c_m(t)$. The pulse waveform of $c_m(t)$ is ideally a rectangular pulse having a time width 1/Δf, and in this case, the envelope curve of $C_m(f)$ is a sinc function having a null point on the integral multiple of Δf on the frequency axis. Spectrum $S_A(f)$ for the signal component A which is the low-frequency signal, spectrum $S_B(f)$ for the signal component B and spectrum $S_C(f)$ for the signal component C, which are the high-frequency signals, in FIG. 10(a) are each expressed in the following equations:

$$S_A(f) = \sum_{m=0}^{p} \{C_m(f - m\Delta f) + C_m^*(f + m\Delta f)\}$$

$$S_B(f) = \sum_{m=p+1}^{M-1} C_m(f - m\Delta f)$$

$$S_C(f) = \sum_{m=p+1}^{M-1} C_m^*(f + m\Delta f)$$

$$\therefore S_{trg}(f) = S_A(f) + S_B(f) + S_C(f)$$

Equations (14)

Further, spectrum $S_1(f)$ for the output analog signal of the DAC 121 shown in FIG. 10(b) and spectrum $S_2(f)$ for the output analog signal of the DAC 122 shown in FIG. 10(c) are as follows:

Equations (15)

$$S_1(f) = S_A(f) + r \sum_{m=p+1}^{M-1} [C_m\{f + (2p-m)\Delta f\} + C_m^*(f - (2p-m)\Delta f)]$$

$$= S_A(f) + r\{S_B(f + f_c) + S_C(f - f_c)\}$$

$$S_2(f) = S_A(f) - r \sum_{m=p+1}^{M-1} [C_m\{f + (2p-m)\Delta f\} + C_m^*(f - (2p-m)\Delta f)]$$

$$= S_A(f) - r\{S_B(f + f_c) + S_C(f - f_c)\}$$

With reference to Equations (15), it can be understood that the relation identical to Equations (1) explained in the first embodiment is eventually established between spectra for $S_A(f)$, $S_B(f)$, $S_C(f)$, $S_1(f)$ and $S_2(f)$. Therefore, spectrum $S_{out}(f)$ for the output signal of the analog multiplexer 131 has a shape identical to that of Equation (3), and in the signal generating device of the present embodiment, signal processing identical to the first embodiment is performed and the same advantageous result can be obtained. In other words, in the signal generating device of the present embodiment, the output of a multicarrier signal of a broader bandwidth compared to an output bandwidth for the individual DACs 121, 122 can be achieved.

With reference to FIG. 11 again, the signal processing flow of the digital signal processing unit 1110 in the signal generating device of the present embodiment will be explained. The digital signal processing unit 1110 of FIG. 11 is represented as a functional block diagram, but each of the functions in the digital signal processing unit 1110 can be performed by computing processing using the DSP, for example, and therefore, can be viewed as substantially indicating a computing operation flow to be performed in arrow directions. It is possible, of course, to implement at least a part of processing for each block by hardware processing or to implement combination of hardware processing and computing processing. Processing for each of the functions in the digital signal processing unit 1110 will be explained below in order along the flow of signals.

Signal processing for the digital signal processing unit 1110 is basically block processing for every symbol time. Here, for simplification, only the processing for a certain symbol time will be focused on, where a subsymbol value for the symbol time is simply denoted as $c_m$. Input data 1101, which is information data to be transmitted by the OFDM signal, is divided into subchannels by an S/P conversion unit 1111, and further, they are converted into subsymbol values $c_0$ to $c_{M-1}$ for each of the frequency subcarriers by a symbol mapping unit 1121. A procedure up to subsymbol value generation is identical to the normal procedure of generating the OFDM signal shown in NPL 3 and the like.

Next, in a complex conjugate conversion unit 1131, subsymbol values $c_{p+1}$ to $C_{M-1}$ corresponding to the signal component B and the signal component C shown in FIG. 10(a) are r-folded to take complex conjugates. Thereafter, subsymbol values $c_0$ to $c_p$ and $rc_{p+1}^*$ to $rc_{M-1}^*$ are each divided into two branches, one is sent toward an addition unit 1141 and the other is sent toward a subtraction unit 1142. In the addition unit 1141 and the subtraction unit 1142, intermediate subsymbol values $g_0$ to $g_p$ and $h_0$ to $h_p$ are obtained by the following equations, respectively:

$$g_n = \begin{cases} c_n: & n = 0, 1, \ldots, 2p-M \text{ and } n = p \\ c_n + rc_{2p-n}^*: & n = 2p-M+1, \ldots, p-1 \end{cases} \quad \text{Equations (16)}$$

$$h_n = \begin{cases} c_n: & n = 0, 1, \ldots, 2p-M \text{ and } n = p \\ c_n - rc_{2p-n}^*: & n = 2p-M+1, \ldots, p-1 \end{cases}$$

Next, in IDFT computation units 1151, 1152, using intermediate subsymbol values $g_0$ to $g_p$ and $h_0$ to $h_p$ obtained by Equations (16), a digital signal corresponding to a time-domain signal of the multicarrier signal which modulates each subcarrier within the range of frequencies 0 to $p\Delta f$ ($=f_c/2$) is generated. At this time, assuming that the sampling rate of the first DAC 121 and second DAC 122 in the present embodiment is $f_s = 1/T_s$, a resultant needs to be $f_c/2 < f_s/2$ based on the sampling theorem. Here, $f_s$ (DAC sampling rate), $f_c$ (analog multiplexer clock frequency), $\Delta f$ (subcarrier interval) are set to have a relation such that $f_s/2 - f_c/2$ is exactly the integral multiple of $\Delta f$ as in the following equation:

$$\frac{f_s}{2} = \frac{1}{2T_s} = N\Delta f \quad \text{Equation (17)}$$

In Equation (17), N is a natural number larger than p. Since the area of frequencies between $f_c/2$ and $f_s/2$ is to be a guard band, intermediate sub symbol values $g_n$ and $h_n$ are defined as the following equations:

$$g_n = 0: n = p+1, \ldots, N$$

$$h_n = 0: n = p+1, \ldots, N \quad \text{Equations (18)}$$

Since time-domain signals outputted from the IDFT computation units 1151, 1152 are real-valued signals, the intermediate subsymbol values $g_n$ and $h_n$ are further defined as the following equations:

$$g_n = g_{2N-n}^*: n = N+1, \ldots, 2N-1$$

$$h_n = h_{2N-n}^*: n = N+1, \ldots, 2N-1 \quad \text{Equations (19)}$$

The intermediate subsymbol values $g_0$ to $g_{2N-1}$ and $h_0$ to $h_{2N-1}$ obtained by the above-described Equations (16), Equations (18), and Equations (19) are inputted into the IDFT computation units 1151, 1152, respectively. Provided, however, in FIG. 11, only $g_0$ to $g_{N-1}$ and $h_0$ to $h_{N-1}$ are illustrated as the inputs to the IDFT computation units 1151, 1152 for simplification, and $g_N$ to $g_{2N-1}$ and $h_N$ to $h_{2N-1}$ are omitted. Processing for inserting the guard band (oversampling) and obtaining real number outputs as shown in Equations (18) and Equations (19) is, as shown in NPL 3 as well, processing generally used in generating a baseband OFDM signal. When the extrinsic scaling factor is omitted, outputs $u_0$ to $u_{2N-1}$ and $v_0$ to $v_{2N-1}$ from the IDFT computation units 1151, 1152 are each expressed in the following equations:

Equations (20)

$$u_k = \sum_{n=0}^{2N-1} g_n \exp\left(j2\pi \frac{nk}{2N}\right)$$

$$= \sum_{n=0}^{N-1} g_n \exp\left(j2\pi \frac{nk}{2N}\right) + \sum_{n=1}^{N} g_{2N-n} \exp\left\{j2\pi \frac{(2N-n)k}{2N}\right\}$$

$$= \sum_{n=0}^{p} g_n \exp\left(j2\pi \frac{nk}{2N}\right) + \sum_{n=1}^{p} g_n^* \exp\left\{-j2\pi \frac{nk}{2N}\right\}$$

$$v_k = \sum_{n=0}^{p} h_n \exp\left(j2\pi \frac{nk}{2N}\right) + \sum_{n=1}^{p} h_n^* \exp\left\{-j2\pi \frac{nk}{2N}\right\}$$

Outputs from the IDFT computation units 1151, 1152 are converted into serial signals in P/S conversion units 1161, 1162, respectively. Here, when substituting Equations (16) and Equation (17) for Equations (20) and rewriting some of the index for a sigma computing operation, an output $u_k$ from the IDFT computation unit 1151 and an output $v_k$ from the IDFT computation unit 1152 are respectively expressed in the following equations:

Equations (21)

$$u_k = \sum_{m=0}^{p} \{c_m \exp(j2\pi m\Delta f k T_s) + c_m^* \exp(-j2\pi m\Delta f k T_s)\} +$$

$$r \sum_{m=p+1}^{M-1} [c_m \exp\{-j2\pi(2p-m)\Delta f k T_s\} +$$

$$c_m^* \exp\{j2\pi(2p-m)\Delta f k T_s\}]$$

$$v_k(t) = \sum_{n=0}^{p} \{c_n \exp(j2\pi n\Delta f k T_s) + c_n^* \exp(-j2\pi n\Delta f k T_s)\} -$$

$$r \sum_{m=p+1}^{M-1} [c_m \exp\{-j2\pi(2p-m)\Delta f k T_s\} +$$

$$c_m^* \exp\{j2\pi(2p-m)\Delta f k T_s\}]$$

Meanwhile, by inverse Fourier transforming $S_1(f)$ and $S_2(f)$ shown in Equations (15), time waveform $S_1(t)$ of an analog output signal from the DAC 121 and time waveform $S_2(t)$ of an analog output signal from the DAC 122 are expressed as the following equations:

Equations (22)

$$s_1(t) = \sum_{m=0}^{p} \{c_m(t)\exp(j2\pi m\Delta f t) + c_m^* \exp(-j2\pi m\Delta f t)\} +$$

$$r \sum_{m=p+1}^{M-1} [c_m(t)\exp\{-j2\pi(2p-m)\Delta f t\} +$$

$$c_m^*(t)\exp\{j2\pi(2p-m)\Delta f t\}]$$

$$s_2(t) = \sum_{m=0}^{p} \{c_m(t)\exp(j2\pi m\Delta f t) + c_m^* \exp(-j2\pi m\Delta f t)\} -$$

$$r \sum_{m=p+1}^{M-1} [c_m(t)\exp\{-j2\pi(2p-m)\Delta f t\} +$$

$$c_m^*(t)\exp\{j2\pi(2p-m)\Delta f t\}]$$

Therefore, outputs $u_k$ and $v_k$ from the IDFT computation units 1151, 1152 are recognized to have, when $c_m(t)$ takes a constant value $c_m$ within a certain symbol time (the length of $1/\Delta f$) (that is, when a pulse waveform is an ideal rectangular pulse), a waveform in which $s_1(t)$ and $s_2(t)$ are sampled with the sampling rate of $f_s = 1/T_s$. In practice, due to the output response characteristic of the DACs 121, 122 and the transmission path characteristic (e.g., band characteristic and dispersion) thereafter, the pulse waveform does not have an ideal rectangular pulse and causes the inter-block interference. However, by inserting a guard interval such as a CP which is generally used in the OFDM, the inter-block interference can be removed on the receiving side. In the present embodiment as well, adding the CP in the P/S conversion units 1161, 1162 is desirable.

Therefore, in another configuration example of the signal generating device of the present invention, the desired signal is a multicarrier signal constituted by a plurality of frequency subcarrier signals such as an orthogonal frequency-division multiplexing (OFDM) signal and a discrete multitone (DMT) signal, and the digital signal processing unit 1110 can be carried out by comprising: serial-parallel conversion means 1111 for branching transmission information data in parallel; symbol mapping means 1121 for making symbol mapping for the branched data and for generating a subsymbol sequence constituted by a plurality of subsymbols to be carried on the plurality of subcarriers, respectively; means 1131 for generating a subsymbol that is folded in a frequency band corresponding to the low-frequency signal by making a shift on the frequency axis with respect to a part of subsymbols, out of the plurality of subsymbols, corresponding to the positive frequency component and the negative frequency component; means 1141, 1142 for obtaining an intermediate subsymbol sequence by adding or subtracting a subsymbol corresponding to the low-frequency signal and subsymbols obtained by multiplying the folded subsymbols by the constant; IDFT computation means 1151, 1152 for making inverse-discrete Fourier transform (IDFT) for the intermediate subsymbol sequences; and parallel-serial conversion means 1161, 1162 for arranging an output data sequence from the IDFT computation means in serial.

As for output signals from the P/S conversion units 1161, 1162, as in the first embodiment, the frequency response characteristics intrinsically owned by the DACs 121, 122 are respectively compensated in compensation units 1181, 1182. The output digital signals from compensation units 1181, 1182 are supplied to the DACs 121, 122 as outputs of the digital signal processing unit 1110 in the signal generating device of the present embodiment. As an output analog signal from the DAC 121, a signal which has the spectrum of FIG. 10(*b*) and which is shown as the first signal S1(*f*) in Equations (15) is obtained. Similarly, as an output analog signal from the DAC 122, a signal which has the spectrum of FIG. 10(*c*) and which is shown as the second signal S2(*f*) in Equations (15) is obtained.

Incidentally, in the signal generating device of the present embodiment, the maximum frequency of p$\Delta$f of a subcarrier of the low-frequency signal (the signal component A in FIG. 10) is matched with $f_c/2$, but even if p$\Delta$f is deviated from $f_c/2$ by the integral multiple of $\Delta f/2$, the operation principle of the digital signal processing unit of the present embodiment shown in FIG. 10 is still established. Specifically, assuming q as an integer smaller than 2p, for example, p$\Delta$f and q shall satisfy the relation of the following equation:

$$p\Delta f = \frac{f_c}{2} + q\frac{\Delta f}{2}$$

Equation (23)

In this case as well, a subcarrier frequency obtained by folding a subcarrier frequency $m\Delta f$ (provided that m is an integer larger than p) of the high-frequency signal (the signal component B and the signal component C in FIG. 10) with a center on $f_c/2$ is represented by the following equation:

$$f_c - m\Delta f = (2p-q-m)\Delta f \qquad \text{Equation (24)}$$

With reference to Equation (24), the folded subcarrier frequency becomes the integral multiple of $\Delta f$, and thus the folded subcarrier frequency matches with the subcarrier frequency of any one of the low-frequency signals. When using the condition of Equation (23), 2p−m should be replaced with 2p−q−m in Equations (15) and Equations (21), and 2p−n should be replaced with 2p−q−n in Equations (16). At this time, the upper limit frequency for the low-frequency signal is substantially $f_c/2+(q+1) \Delta f/2$, and the upper limit frequency for the folded high-frequency signal is substantially $f_c/2-(q+1) \Delta f/2$, and if $|(q+1)\Delta f/2|$ is sufficiently small relative to $f_c/2$, even the DACs 121, 122 having the output bandwidth of $f_c/2$ can be sufficiently handled.

In the above-mentioned signal generating device of the present embodiment, since the OFDM signal has been exemplified as a desired signal, a constellation used in each of the subchannels is the same. In the case of generating a DMT signal as a desired signal, in the symbol mapping unit 1121, constellation in which signal point arrangement and intensity (level) are optimized for every subchannel is used. Accordingly, in the case of generating the DMT signal, a spectrum of an output signal does not also have a flat level of the vertical axis of each of the subcarriers shown in each diagram of FIG. 10, and the spectrum has different peak intensity for every subcarrier (subchannel). Even in such a case, it is possible to achieve the spectrum operation shown in FIGS. 10(a) to 10(d), and the feature of the signal generating device of the present invention can be obtained quite similarly to the case of generating the OFDM signal. Furthermore, in the case of generating the OFDM signal as well, in order to compensate the output response characteristic of the analog multiplexer 131, pre-equalization processing such as enhansing a subcarrier intensity on the high-frequency side can be performed in the symbol mapping unit 1121.

Furthermore, as DFT-spread OFDM shown in NPL 5, it is possible to generate, by using the digital signal processing unit of the present embodiment by partial modification, a multicarrier signal which is generated by inserting DFT processing at the post-stage of the symbol mapping unit. Specifically, in the digital signal processing unit 1110 of the present embodiment shown in FIG. 11, a DFT-spread processing block may be additionally inserted in the post-stage of the symbol mapping unit 1121. In the signal generating device of the present embodiment, in generating a multicarrier signal using IDFT processing, by starting from the point of the processing flow in normal signal generation, additional processing specific to the present invention is performed in the complex conjugate conversion unit 1131 for the subcarrier, which corresponds to the high frequency component, among complex symbols to be inputted into the IDFT computation unit. In other words, spectrum operation (r-folding an amplitude and horizontally shifting on the frequency axis) in FIGS. 5(c) and 5(d) as well as FIGS. 10(b) and 10(c) is added. Further, as shown in each block after the IDFT computation units 1151, 1152 of FIG. 11, processing after the IDFT computation is divided into two signal paths. The addition unit 1141 is arranged at the pre-stage of the IDFT computation unit on one of the signal paths and the subtraction unit 1142 is arranged at the pre-stage of the IDFT computation unit on the other one of the signal paths to perform the series of processing for generating digital signal input for the two DACs shown in Equations (16) through (21).

As described above, in the signal generating device of the present embodiment, in order to generate a multicarrier signal, it is possible to efficiently generate the multicarrier signal by including processing of multicarrier signal generation processes to the function of the digital signal processing unit of the present invention. The modified processing of multicarrier signal generation processes themselves as described above is incorporated into processing of the basic digital signal processing unit of the preceding embodiments of the present invention.

In the signal generating device of the present embodiment as well, the present invention has a feature of operating the digital signal processing unit 1110 so that the two DACs 121, 122 output, to the analog multiplexer 131, the first signal having the spectrum shown in FIG. 10(b) and the second signal having the spectrum shown in FIG. 10(c) as an output analog signal. In other words, the following advantageous result specific to the present invention is exerted by supplying, by the digital signal processing unit 1110, digital signals for outputting signals shown as the first signal $S_1(f)$ and the second signal $S_2(f)$ in Equations (22) to the two DACs.

In other words, due to the signal processing specific to the present invention including processing of multicarrier signal generation processes in the digital signal processing unit 1110, the signal generating device including the two DACs and the analog multiplexer allows outputting a multicarrier signal of a broader bandwidth compared to the output bandwidth of individual DACs. Further, as is evident from the entire configuration of the signal generating device shown in FIG. 1, each of the output points of the DACs 121, 122 through the output of the analog multiplexer 131 forms, when two signal paths are viewed along the traveling direction of electric signals, a symmetric configuration by regarding the traveling direction as a virtual central axis. Therefore, the adjustment of the amplitude and delay of the DACs can be suppressed to the minimum.

Further, if a desired transmission signal is a multicarrier signal, the digital signal processing unit 810 in the signal generating device 800 shown in FIG. 8 and the digital signal processing units 910a to 910d in the signal generating devices 900a to 900d shown in FIG. 9 can be replaced with the digital signal processing unit 1110 used in the present embodiment.

Fifth Embodiment

Figure 12:
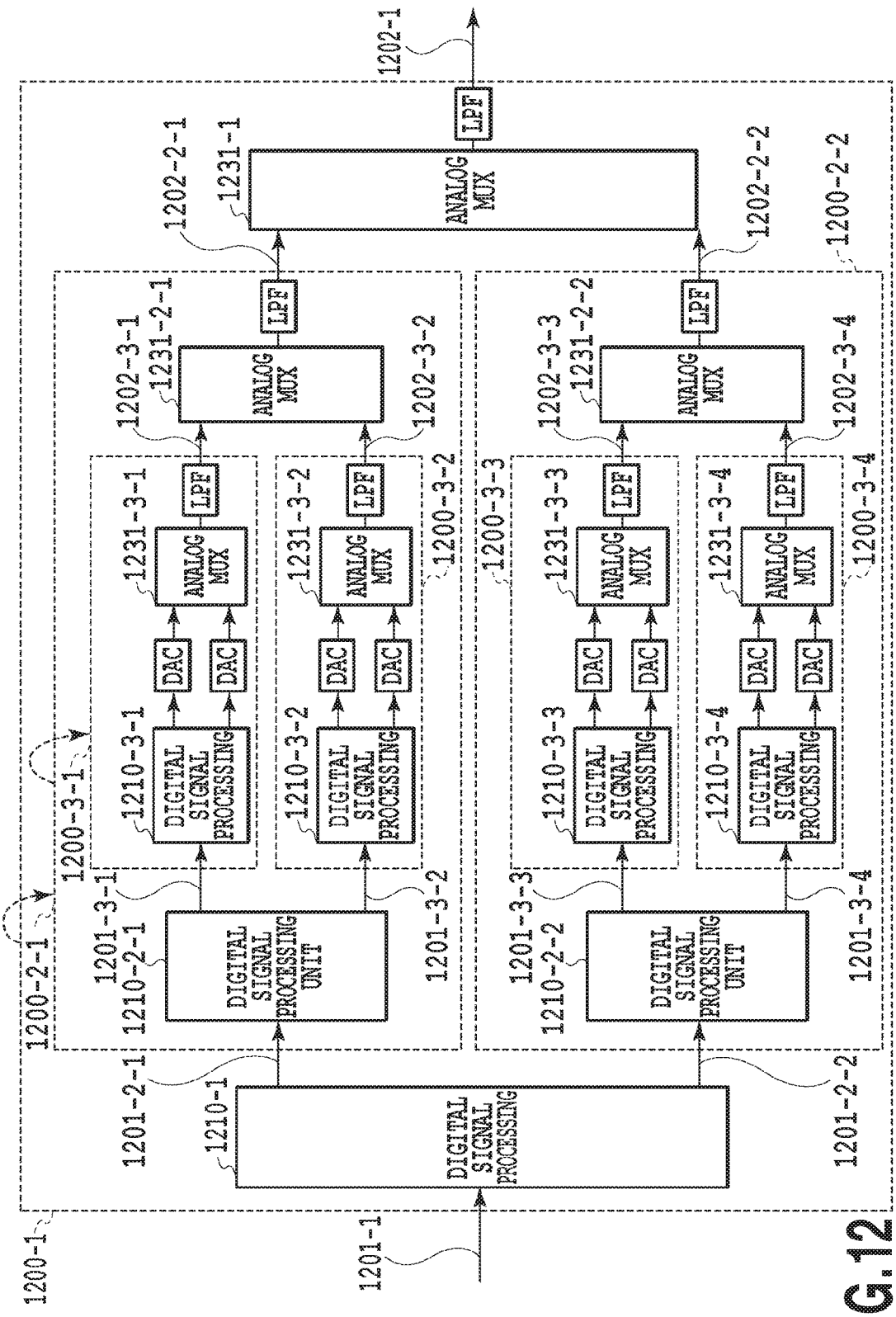
FIG. 12 is a diagram schematically showing a configuration of a signal generating device according to a fifth embodiment of the present invention.

FIG. 12 is a diagram schematically showing a configuration of the signal generating device according to the fifth embodiment of the present invention. In the present embodiment, the signal generating device of a three-stage nest (nesting) type configuration will be exemplified, but this is extensible to an N-stage (N is a natural number) nest type configuration of any number of stages.

A signal generating device 1200-1 in FIG. 12 has a configuration in which the DACs 821, 822 in the signal generating device 800 shown in FIG. 8 are replaced with signal generating devices 1200-2-1, 1200-2-2, respectively (first replacing operation). Further, the signal generating device 1200-2-1 has a configuration in which the DACs 821, 822 in the signal generating device 800 shown in FIG. 8 are replaced with signal generating devices 1200-3-1, 1200-3-2, respectively, which have a configuration equivalent to the signal generating device 800 itself shown in FIG. 8 (second replacing operation). The same applies to the signal generating device 1200-2-2. The signal generating device 1200-1 is a signal generating device positioned on a first stage counting from the outer side, the signal generating devices 1200-2-1, 1200-2-2 each are signal generating device positioned on a second stage counting from the outer side, and the signal generating devices 1200-3-1 to 1200-3-4 each are a signal generating device positioned on a third stage counting from the outer side. Therefore, the signal generating device 1200-1 in FIG. 12 is recognized to have a nest type configuration in which a signal generating device has separate signal generating devices therein in a nesting manner.

As described above, the signal generating device 800 of the second embodiment shown in FIG. 8 has a configuration of arranging the LPF 861 at the post-stage of the analog multiplexer 831 to remove an unnecessary spectrum. By removing components corresponding to the signal component B and signal component C which appear in $|f|>f_c$ shown in FIG. 5(g) from the output signal of the analog multiplexer 831, a desired signal itself that corresponds to FIG. 5(a) is configured to be obtained as the output signal 802. In a case where the output characteristic of the analog multiplexer 831 has a characteristic of sufficiently suppressing a signal component beyond the frequency $f_c$, the LPF 861 may be omitted.

In the signal generating device 800, a digital signal is accepted as an input signal 801 and a desired analog signal is outputted as an output signal 802, and thus the signal generating device 800 itself functions as one broad bandwidth DAC whose output bandwidth is larger than the DACs 121, 122. When focusing on this viewpoint, it is recognized that configuring a two-stage nest type by replacing the DACs 121, 122 included in the signal generating device 800 with the signal generating device 800 itself and using the analog multiplexer 831 having a sufficiently broad bandwidth allow configuring a signal generating device to have a broader bandwidth compared to the original signal generating device 800. The configuration of the multi-stage nest type shown in the present embodiment has been devised based on such an idea.

In the signal generating devices of the multi-stage nest type configuration of the present embodiment, conditions that should be satisfied by each stage of the signal generating devices will be explained below. First of all, each of the signal generating devices naturally needs to have its output signal having an output bandwidth of an upper limit frequency or more. Further, as described above, a drive clock frequency of the analog multiplexer in each signal generating device should be larger than the upper limit frequency of a desired output signal. A drive clock frequency of an analog multiplexer 1231-n in the signal generating device positioned at n-th stage from the outer side is denoted as $f_{c,n}$ below.

First of all, in a digital signal processing unit 1210-1 of the signal generating device 1200-1, as in the series of signal processing shown in FIG. 5, a desired signal is separated into a low-frequency signal and high-frequency signals along a boundary of $f_c/2$ and the high-frequency signals are converted into folded signals, and a first signal and a second signal are obtained by further taking a sum and difference with the low-frequency signal. The thus obtained first and second signals are input signals 1201-2-1, 1201-2-2 sent to the second-stage signal generating devices 1200-2-1, 1200-2-1. At this time, the upper limit frequency of the input signals 1201-2-1, 1201-2-2 is slightly above $f_{c,1}/2$, and this will be the upper limit frequency of desired output signals in the second-stage signal generating devices 1200-2-1, 1200-2-2, and therefore, $f_{c,1}/2 < f_{c,2}$ should hold.

In a digital signal processing unit 1210-2-1 in the second-stage signal generating device 1200-2-1, an input signal 1201-2-1 is separated into a low-frequency signal and high-frequency signals along a boundary of $f_{c,2}/2$ and the high-frequency signals are converted into folded signals, and a second-stage first signal and second signal which are slightly above $f_{c,2}/2$ are obtained by further taking a sum and difference with the low-frequency signal. If the upper limit frequency of the second-stage first signal and second signal obtained by this processing is not smaller than the upper limit frequency of $f_{c,1}/2$ of the input signal 1201-2-1, there is no advantage to perform signal processing, and therefore, $f_{c,2} < f_{c,1}$ holds.

The first signal and second signal obtained from the digital signal processing unit 1210-2-1 inside the second-stage signal generating device lead to input signals 1201-3-1, 1201-3-2 sent to the third-stage signal generating devices 1200-3-1, 1200-3-2, respectively, and due to the same processing, the first signal and second signal having the upper limit frequency of about $f_{c,3}/2$ are generated and inputted to the DACs. Here, similar to the above relation between $f_{c,1}$ and $f_{c,2}$, the relation of $f_{c,2}/2 < f_{c,3} < f_{c,2}$ is established. Accordingly, the output bandwidths of the DACs included in the third-stage signal generating devices 1200-3-1 to 1200-3-4 may be about $f_{c,3}/2$. Meanwhile, the upper limit frequency of a desired signal that can be set as a final output signal 1202-1 may be less than $f_{c,1}$. Therefore, for instance, when setting a signal having its upper limit frequency slightly below $f_{c,1}$ as a desired signal and setting $f_{c,2}$ to slightly above $f_{c,1}/2$ and $f_{c,3}$ slightly above $f_{c,2}/2$, the output bandwidth of the DAC may be slightly above ¼ of the desired signal, and thus the desired signal having a sufficiently broad band compared to the output bandwidth of the DAC is recognized to be outputted. Provided, however, the output bandwidth of the analog multiplexer in each of the stages should be about its drive clock frequency or more.

The signal generating device of the present embodiment and a configuration of extending this to multi-stages can be incorporated into the optical transmitter shown in the above-described second embodiment and third embodiment. Also, as in the fourth embodiment, it is possible to incorporate band separation and folding processing into multicarrier signal generation processing. Further, FIG. 12 depicts the digital signal processing units 1210-1, 1210-2-1, 1210-2-2, and 1210-3-1 to 1210-3-4 separately by blocks for the convenience of explanations, but they can actually be incorporated integrally into one signal processing circuit.

Sixth Embodiment

Figure 14:
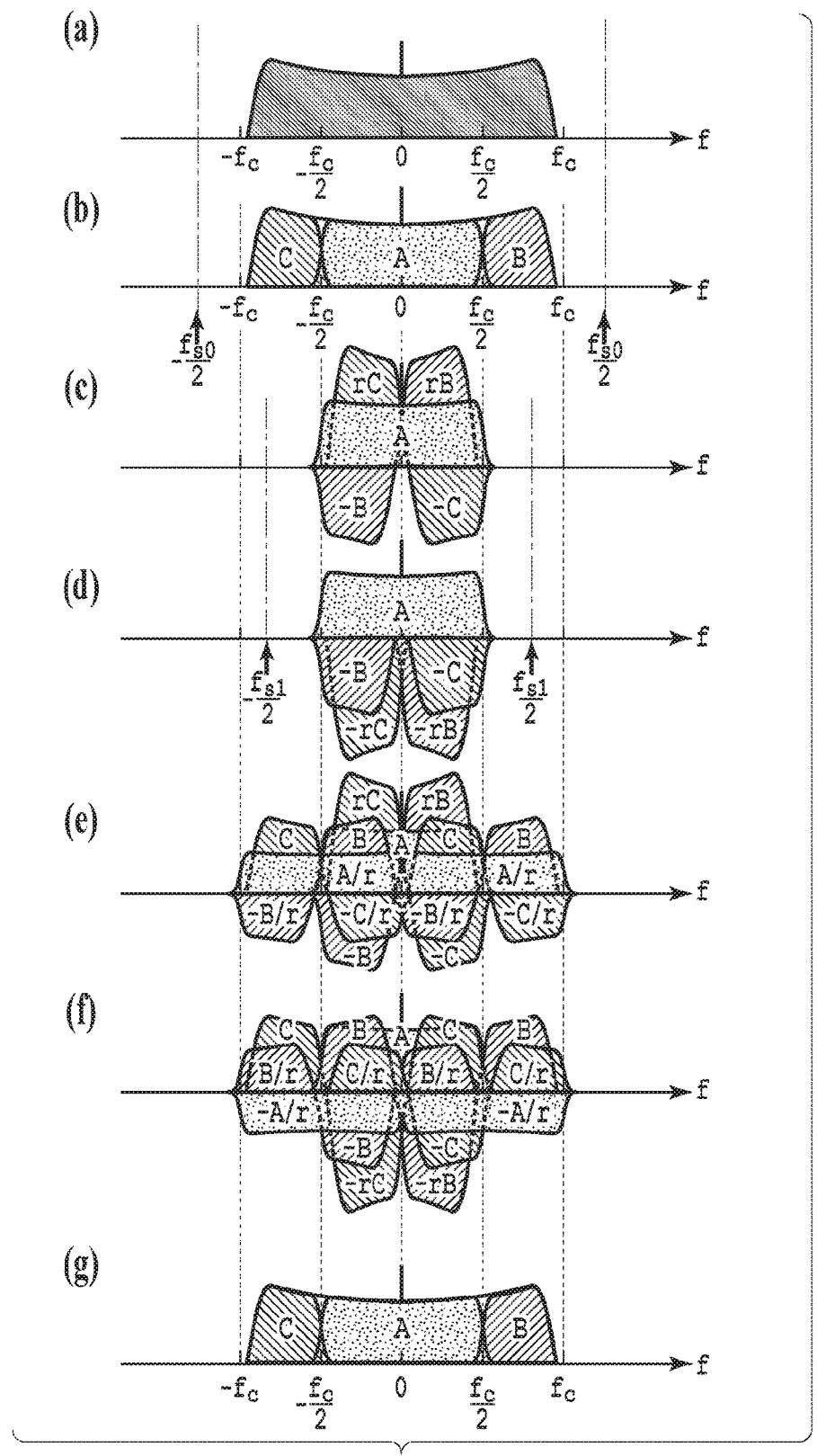
FIG. 14 is a diagram schematically representing a waveform synthesizing operation in the frequency domain in a signal generating device according to a sixth embodiment of the present invention.

The entire configuration of the signal generating device according to the sixth embodiment of the present invention is identical to the signal generating device 100 of the first embodiment shown in FIG. 1, but, as shown in FIG. 14 as will be described later, is different from the operation of the signal generating device of the first embodiment shown in FIG. 5 in the aspect of the details of the waveform synthesizing operation. With respect to the difference in the waveform synthesizing operation, as shown in the functional block diagram of FIG. 16 as will be described later, a digital signal processing unit 1610 which is different from the first embodiment of FIG. 6 is provided.

Major differences between the signal generating device of the present embodiment and that of the first embodiment are the following two aspects. Firstly, their relations between the drive clock frequency of the analog multiplexer and the upper limit frequency of a signal to be finally outputted are different from each other. The signal generating device of the first embodiment uses the analog multiplexer that is driven by the frequency $f_c$ and the DACs having the output bandwidth of about $f_c/2$ to generate any signal having the upper limit frequency of about $f_c$. On the contrary, the signal generating device of the present embodiment uses the analog multiplexer that is driven by the frequency $f_c/2$ and the DACs having the output bandwidth of about $f_c/2$ to generate any signal having the upper limit frequency of about $f_c$. For instance, in the case of obtaining a signal having the upper limit frequency of about 50 GHz using the DAC having the output bandwidth of about 25 GHz, the drive clock frequency of the analog multiplexer in the first embodiment needs to have 50 GHz, whereas, in the present embodiment, the drive clock frequency of the analog multiplexer only needs to have about 25 GHz. In the present embodiment, the signal generating device capable of alleviating requirements for the operating frequency of a clock source and the switching response speed of the analog multiplexer is disclosed.

Secondly, in the first embodiment, unnecessary components arise in the high frequency band exceeding the upper limit frequency of a desired signal, but the present embodiment differs in that the unnecessary components corresponding to those can be significantly suppressed. A configuration and operation of the signal generating device of the present embodiment will be explained below in details.

FIG. 14 is a diagram schematically representing a waveform synthesizing operation in the frequency domain in the signal generating device according to the sixth embodiment of the present invention. The aspects of differences from the waveform synthesizing operation in the signal generating device according to the first embodiment shown in FIG. 5 will be mainly explained below.

First of all, in the present embodiment, as in the first embodiment, a desired signal shown in FIG. 14(a) is separated into a low-frequency signal A, a positive frequency signal B of the high frequency band, and a negative frequency signal C of the high frequency band as shown in FIG. 14(b). Next, using these signal components of the low-frequency signal A, positive frequency signal B, and negative frequency signal C, a third signal and a fourth signal as shown in FIGS. 14(c) and 14(d), respectively, are obtained. In explaining the procedure of generating the third signal and fourth signal, a "folded signal" and a "parallel shifted signal" in the present embodiment are defined as follows.

The "folded signal" in the present embodiment refers to, as in the first embodiment, signals obtained by horizontally shifting the signal component of the negative frequency signal C by $+f_c$ and the signal component of the positive frequency signal B by $-f_c$, respectively, on the frequency axis.

Meanwhile, the "parallel shifted signal" in the present embodiment refers to signals obtained by horizontally shifting the signal component of the negative frequency signal C by $+f_c/2$ and the signal component of the positive frequency signal B by $-f_c/2$, respectively, on the frequency axis.

The third signal shown in FIG. 14(c) is obtained by subtracting the folded signal described above from the signal component of the low-frequency signal A and adding r-folded parallel-shifted signal described above. An order of the subtraction of the folded signal and the addition of the parallel shifted signal does not matter. Also, the fourth signal shown in FIG. 14(d) is obtained by subtracting the above-described folded signal and subtracting r-folded parallel shifted signal described above from the signal component of A. An order of the subtraction of the folded signal and the subtraction of the parallel shifted signal does not matter.

The setting of a value of a constant r is, as in the first embodiment, set according to a switch-switching transition characteristic in the analog multiplexer 131, that is, the waveform of a pulse train in the model of FIG. 2A, and is normally set within the range of $\pi/2<r<2$. Incidentally, an order of the operation of horizontal shift for generating the parallel shifted signal and the operation of r-folding in the above-described addition/subtraction does not matter.

Power in each spectrum for the third signal shown in FIG. 14(c) and the fourth signal shown in FIG. 14(d) both fall substantially within the frequency range of $|f|<f_c/2$. Therefore, both the third signal and fourth signal are sufficiently generated even when the output bandwidth of the DAC is about $f_c/2$.

The analog signals having spectra shown in FIG. 14(c) and FIG. 14(d) are respectively supplied from the DACs 121, 122 to the analog multiplexer 131 as the first input signal and second input signal. At this time, with reference to each of the spectra in FIGS. 4(b) and 4(d) when multiplying the input signals 201, 202 by the pulse trains 203a, 203b in the model of FIG. 2A, output signals corresponding to the first input signal and second input signal from the analog multiplexer 131 result in the spectra shown in FIGS. 14(e) and 14(f), respectively.

In the signal shown in FIG. 14(e), when focusing on a low frequency domain of $|f|<f_c/2$, folded signals −C and −B superimposed on the DC component and parallel shifted signals C and B superimposed on frequency±$f_c/2$ are mutually in the opposite phases. As for the signals shown in FIG. 14(f) as well, in the low frequency domain of about $|f|<f_c/2$, folded signals −C and −B superimposed on the DC component and parallel shifted signals C and B superimposed on frequency±$f_c/2$ are mutually in the opposite phases.

Furthermore, among signals in each of the spectra shown in FIGS. 14(e) and 14(f), the low-frequency signals of A are mutually in the same phase for signals superimposed on the DC component, while the parallel shifted signals indicated as rC and rB are mutually in the opposite phases. As for signals superimposed on frequency±$f_c/2$, the low-frequency signals indicated as A/r are mutually in the opposite phases, while the folded signals indicated as C/r and B/r are also in the opposite phases, and the parallel shifted signals indicated as C and B are mutually in the same phase.

Based on the above-described phase relation for each signal, the signal outputted from the analog multiplexer 131 is a signal having a spectrum as shown in FIG. 14(g). In other words, in the low frequency domain of $|f|<f_c/2$, the folded signals −C and −B superimposed on the DC component offset the parallel shifted signals C and B superimposed on frequency±$f_c/2$, respectively. In addition, the parallel shifted signals rC and rB superimposed on the DC component offset with the signals shown in FIGS. 14(e) and 14(f). Further, the folded signals C/r and B/r superimposed on ±$f_c/2$ also offset with the signals shown in FIGS. 14(e) and 14(f). Therefore, only the low-frequency signal component A which has been in the same phase remains.

Meanwhile, in the high frequency domain of about $|f|>f_c/2$, low frequency components A/r superimposed on ±$f_c/2$ offset with the signals shown in FIGS. 14(e) and 14(f). Further, the folded signals C/r and B/r superimposed on ±$f_c/2$ also offset with the signals shown in FIGS. 14(e) and 14(f). Therefore, only the signal components C and B derived from the parallel shifted signals which have been in the same phase remain. As a result, desired signals shown in FIGS. 14(*a*) and 14(*b*) are obtained within the frequency range of |f|<f$_c$.

Figure 15:
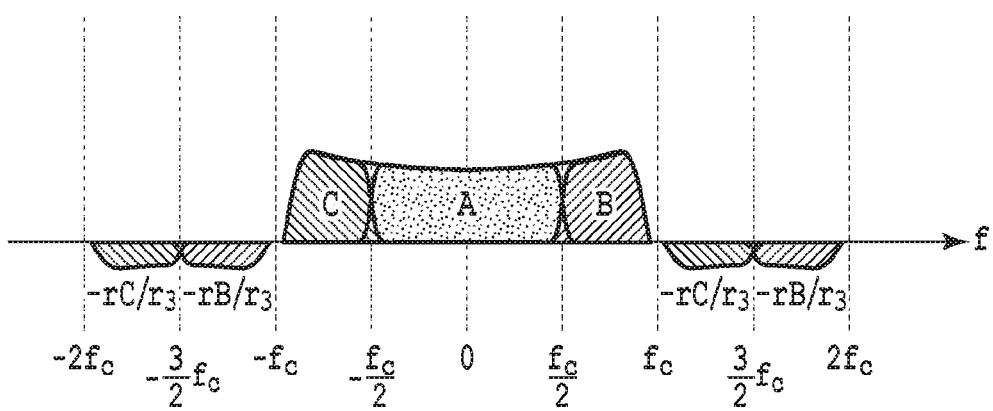
FIG. 15 is a diagram schematically representing an unnecessary component, in the frequency domain, arisen in an output signal of the signal generating device according to the sixth embodiment of the present invention.

In the signal generating device of the present embodiment, when considering only a primary clock component (±f$_c$/2) as described above, an unnecessary signal component does not arise in a frequency range beyond the upper limit frequency of a desired signal, which is different from the first embodiment. In practice, as shown in FIG. 15, an unnecessary component arises beyond |f|>f$_c$ in a tertiary block component (±3f$_c$/2). However, as will be described below, the intensity of the unnecessary component caused by the tertiary block component is sufficiently small compared to the unnecessary component arisen in |f|>f$_c$ in the signal generating device of the first embodiment.

FIG. 15 is a diagram schematically representing an unnecessary component, in the frequency domain, arisen in an output signal of the signal generating device according to the sixth embodiment of the present invention. In the first embodiment, the unnecessary component arisen in |f|>f$_c$ is a signal residue component superimposed on the primary clock component, and thus, has an intensity equivalent to the level of the positive frequency signal B and negative frequency signal C of a desired signal generated in |f|<f$_c$ in principle. However, the unnecessary component in |f|>f$_c$ in the present embodiment as shown in FIG. 15 is signal residue component superimposed on the tertiary block component. Accordingly, this is smaller than the desired signal by the intensity ratios of the primary component (±f$_c$/2) and the tertiary component (±3f$_c$/2) in FIG. 3A and FIG. 3B. Specifically, in the spectra shown in FIG. 3A and FIG. 3B, an amplitude of the DC component is assumed as 1, an amplitude of the primary component as 1/r, and an amplitude of the tertiary component as 1/r3. At this time, in the model of FIG. 2B, even if a waveform of a pulse train to be multiplied by each input signal is a complete square wave, 1/r=2/π and 1/r3=2/(3π) hold. Accordingly, the ratio of the amplitude of a desired signal component to an unnecessary component is 3:1, and the intensity ratio is 9:1. In a case where the time waveform of a pulse train is significantly blunt and the pulse train has a waveform that can be approximated by a squared cosine wave, 1/r3 is substantially 0, and the unnecessary component are substantially cancelled. In an actual device, the waveform of a pulse train can be regarded as an intermediate waveform between a complete square wave and a squared cosine wave, and thus, the ratio of the intensity is substantially 9:1 or more.

As such, in the signal generating device of the present embodiment, it is an advantage that the intensity of an unnecessary component is significantly suppressed compared to the first embodiment in the following aspects. First of all, suppressing the ratio of peak to average signal power in the output of the analog multiplexer 131 allows alleviating a requirement for linearity of a transmission path on the output side of the analog multiplexer 131. In addition, the unnecessary component can be significantly suppressed without using a low pass filter on the output side of the analog multiplexer 131, thereby simplifying the structure of the device. For further improving suppression ratio of the unnecessary component, the low pass filter having a cutoff frequency in the vicinity of frequency f$_c$ may be used, but even in such a case, the requirement for the suppression ratio of the low pass filter can be alleviated compared to that in the first embodiment.

With reference to the series of spectrum operation from FIGS. 14(*a*) to 14(*g*), spectra of signals that should be outputted from the DACs 121, 122 are 14(*c*) and 14(*d*).

Therefore, even if the output bandwidth of the DACs 121, 122 is about f$_c$/2, as the final output signal 102 of the signal generating device of the present invention, any desired signal having its upper limit frequency sufficiently larger than f$_c$/2 (but smaller than f$_c$) as shown in FIGS. 14(*a*) and 14(*g*) can be obtained.

The processes of spectrum operation from FIGS. 14(*a*) to 14(*g*) in the signal generating device of the present embodiment are represented in the following equation. Since the unnecessary components of the high frequency band is included in the equation, components up to the tertiary component are considered for the pulse train. The spectrum of a desired signal shown in FIG. 14(*a*) is assumed as Strg(f), and the signal component A, signal component B, and signal component C in FIG. 14(*b*) are assumed as SA(f), SB(f), and SC(f), respectively. Further, spectra of the pulse trains by which the first input signal and second input signal to the analog multiplexer are multiplied are assumed as P1(f) and P2(f), respectively. Here, a spectrum S3(f) of the output analog signal for the first DAC 121 shown in FIG. 14(*c*) and a spectrum S4(f) of the output analog signal for the second DAC 122 shown in FIG. 14(*d*) represent the following equations, respectively:

$$S_{trg}(f) = S_A(f) + S_B(f) + S_C(f) : S_C(f) = S_B^*(-f) \quad \text{Equations (25)}$$

$$S_3(f) = S_A(f) - \{S_B(f + f_c) + S_C(f - f_c)\} + r\left\{S_B\left(f + \frac{f_c}{2}\right) + S_C\left(f - \frac{f_c}{2}\right)\right\}$$

$$S_4(f) = S_A(f) - \{S_B(f + f_c) + S_C(f - f_c)\} - r\left\{S_B\left(f + \frac{f_c}{2}\right) + S_C\left(f - \frac{f_c}{2}\right)\right\}$$

$$P_1(f) = \frac{1}{2}\left\{\delta(f) + \frac{\delta\left(f - \frac{f_c}{2}\right) + \delta\left(f + \frac{f_c}{2}\right)}{r} - \frac{\delta\left(f - \frac{3}{2}f_c\right) + \delta\left(f + \frac{3}{2}f_c\right)}{r_3}\right\}$$

$$P_2(f) = \frac{1}{2}\left\{\delta(f) - \frac{\delta\left(f - \frac{f_c}{2}\right) + \delta\left(f + \frac{f_c}{2}\right)}{r} + \frac{\delta\left(f - \frac{3}{2}f_c\right) + \delta\left(f + \frac{3}{2}f_c\right)}{r_3}\right\}$$

$$\begin{aligned}S_{out}(f) &= P_1(f) * S_3(f) + P_2(f) * S_4(f) \\ &= S_A(f) + S_B(f) + S_C(f) - \\ & \quad \frac{r}{r_3}\{S_B(f - f_c) + S_C(f - 2f_c) + S_B(f + f_c) + S_C(f + 2f_c)\} \\ &= S_{trg}(f) \text{ Equations (25)} \\ &= S_{trg}(f) - \\ & \quad \frac{r}{r_3}\{S_B(f - f_c) + S_C(f - 2f_c) + S_B(f + f_c) + S_C(f + 2f_c)\}\end{aligned}$$

As in Equations (25), an output signal S$_{out}$(f) of the analog multiplexer 131 is a signal adding an unnecessary component such that its amplitude is r/r$_3$ folded relative to the desired signal S$_{trg}$(f), which is recognized to be identical to the signal shown in FIG. 15.

Incidentally, in explanations using the above-described equations, an extrinsic scaling factor is omitted. For describing the actual circuit operation of the signal generating device of the present embodiment, for instance, it is needed to multiply the right side of Equations (25) by a constant corresponding to a loss or gain of the analog multiplexer 131 (when an amplifier circuit is included).

Figure 16:
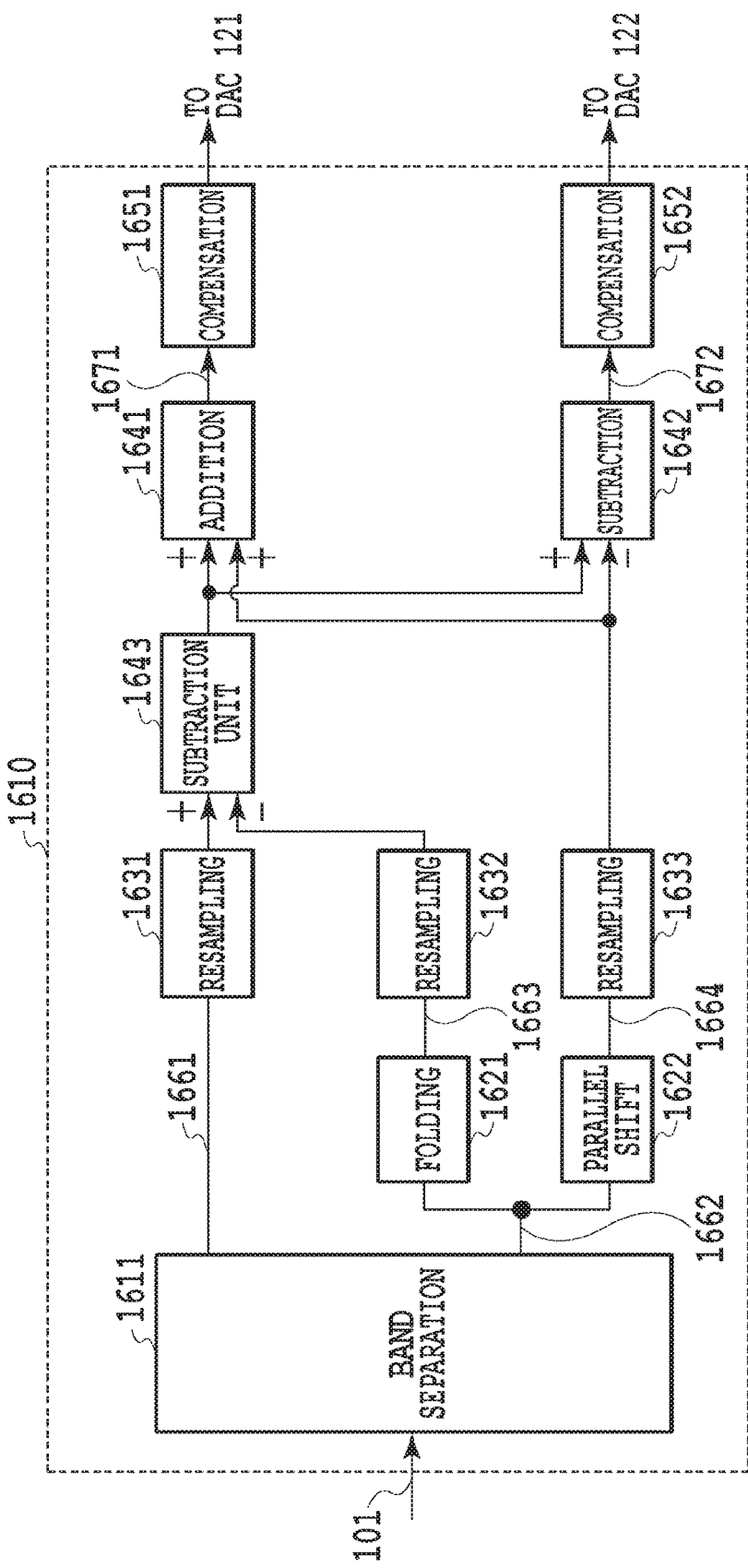
FIG. 16 is a block diagram illustrating a configuration and flow of the digital signal processing unit in the signal generating device according to the sixth embodiment of the present invention.

FIG. 16 is a block diagram illustrating a configuration and flow of the digital signal processing unit in the signal generating device according to the sixth embodiment of the present invention. The digital signal processing unit 1610 of FIG. 16 corresponds to the digital signal processing unit 110 in the signal generating device of FIG. 1. As described above, a role produced by the digital signal processing unit 1610 in the signal generating device of the present embodiment is to generate a digital signal such that each of the output analog signals from the two DACs 121, 122 becomes a signal having each of the spectra shown in FIGS. 14(c) and 14(d) and to supply them to the DACs 121, 122 of FIG. 1, respectively. In order to do so, the signals corresponding to FIGS. 14(c) and 14(d) may be generated in the digital domain based on a desired signal, and at the same time, if there is frequency dependency in the output characteristics owned by the DACs 121, 122, processing for compensating this may be performed.

The digital signal processing unit 1610 of FIG. 16 is represented as a functional block diagram, but each of the block functions of the digital signal processing unit 1610 can be performed by the computing processing using DSP, for example. Therefore, FIG. 16 can be recognized to show a flow of computation that is substantially performed in the direction of arrows. A part of processing in each block can be, of course, achieved by hardware processing, or the combination of hardware processing and computing processing can be achieved. Processing in each functional block in the digital signal processing unit 1610 will be explained below in order along the flow of signals.

As the input signal 101 for the signal generating device of the present invention, as in the first embodiment shown in FIG. 6, a digital signal in which a desired signal is sampled with a sampling rate $f_{s0}$ is used. As in the first embodiment, a digital signal that further underwent processing for compensating beforehand the response characteristic of the analog multiplexer 131 for a signal that has sampled the desired signal may be used as the input signal 101.

A band separation unit 1611 in FIG. 16 is equivalent to the band separation unit 611 in the first embodiment shown in FIG. 6, and can be configured by using an LPF, a subtracter or an HPF, and the like. A high-frequency signal 1662 outputted from the band separation unit 1611 of FIG. 16 are branched into two groups and each of them is sent to a folding unit 1621 and a parallel shifting unit 1622.

Processing in the folding unit 1621 of FIG. 16 is equivalent to processing in the folding unit 621 in the first embodiment shown in FIG. 6, except that the operation of a constant-r folding is not made. Specifically, Hilbert transform, the combination of the cosine wave multiplication and filter processing, and the like can be used to achieve this. A folded signal 1663 is outputted from the folding unit 1621.

In the parallel shifting unit 1622 of FIG. 16, a positive frequency component of the high-frequency signal 1662 in a frequency domain is shifted by $-f_c/2$ and a negative frequency component by $+f_c/2$, and its amplitude is further r-folded to output a parallel shifted signal 1664. The computation in this parallel shifting unit 1622 is also similar to the computation of the folding unit in the first embodiment shown in FIG. 6, and thus, after dividing the positive frequency component and negative frequency component using Hilbert transform, for example, $-f_c/2$ and $+f_c/2$ each may be shifted. As will be described later in detail, the combination of cosine wave multiplication and filter processing may also be used.

In resampling units 1631, 1632, and 1633 in FIG. 16, the sampling rate of digital signals of a low-frequency signal 1661, a folded signal 1663, and a parallel shifted signal 1664 are converted from $f_{s0}$ to fs1, respectively. Here, fs1 is a sampling rate for the DACs 121, 122, which needs to have a value larger than twice the upper limit frequency of an output signal S3(f) for the DAC 121 and an output signal S4(f) for the DAC 122. The upper limit frequencies of S3(f) and S4(f) are slightly above $f_c/2$, which are smaller than the upper limit frequency of the desired signal Strg(f), and therefore, it is generally considered to be fs1<$f_{s0}$. Provided, however, fs1=$f_{s0}$ is also possible, and in such a case, the resampling units 1631 and 1632 can naturally be omitted. The case of assuming fs1=$f_{s0}$ refers to a case where, for example, an operable sampling rate for the DACs 121, 122 is relatively larger by about four times the output bandwidth $f_c/2$ of the same DAC.

In a subtraction unit 1643 in FIG. 16, the resampled folded signal 1663 is subtracted from the resampled low-frequency signal 1661. In an addition unit 1641, the resampled parallel shifted signal 1664 is added to an output signal from the subtraction unit 1643 to generate a third signal 1671. The third signal 1671 corresponds to the total sum of all spectra shown in FIG. 14(c), that is, to the third signal indicated as S3(f) in Equations (25). In a subtraction unit 1642, the resampled parallel shifted signal 1664 is subtracted from an output signal from the subtraction unit 1643 to generate a fourth signal 1672. The fourth signal 1672 corresponds to the total sum of all spectra shown in FIG. 14(d), that is, to the fourth signal indicated as S4(f) in Equations (25). It should be noted that the third signal 1671 and the fourth signal 1672 are still digital signals at this stage.

Therefore, the present invention may be carried out using a signal generating device comprising: a digital signal processing unit 1610; two digital-to-analog converters (DACs) 121, 122; and an analog multiplexer 131 that alternatingly switches analog signals outputted from the two DACs with a frequency $f_c/2$ for outputting as analog signals, wherein the digital signal processing unit includes: when a signal, among desired output signals having an upper limit frequency of less than $f_c$, made of a component having an absolute value of a frequency being substantially $f_c/2$ or less is assumed as a low-frequency signal (signal component A), when, for a positive frequency component (signal component B) and a negative frequency component (signal component C) which are made of a component having an absolute value of a frequency being substantially $f_c/2$ or more among the desired output signals, a signal in which the positive frequency component is shifted by $-f_c$ on a frequency axis and a signal in which the negative frequency component is shifted by $+f_c$ on the frequency axis are assumed as a folded signal, and when a signal in which the positive frequency component is shifted by $-f_c/2$ on the frequency axis and a signal in which the negative frequency component is shifted by $+f_c/2$ on the frequency axis are assumed as a parallel shifted signal, means for generating a third signal 1671 that is equal to a signal obtained by adding a signal obtained by multiplying the parallel shifted signal by a constant to the low-frequency signal and then subtracting the folded signal from a resultant; and means for generating a fourth signal 1672 that is equal to a signal obtained by subtracting a signal obtained by multiplying the parallel shifted signal by the constant from the low-frequency signal and further subtracting the folded signal from a resultant, and wherein: a digital signal corresponding to the third signal generated in the digital signal processing unit is inputted into one of the two DACs; and a digital signal corresponding to the fourth signal generated in the digital signal processing unit is inputted into the other one of the two DACs.

Lastly, in compensation units 1651, 1652 in FIG. 16, the frequency response characteristics intrinsically owned by the DACs 121, 122 are compensated. Specifically, as a compensation unit, a filter having a response characteristic of a reverse characteristic that approximately cancels the frequency response characteristics of the DACs 121, 122 may be employed. Such compensation processing is sometimes called as pre-equalization and is commonly performed in a high-speed communication system using the DAC. Output digital signals from the compensation units 1651, 1652 are supplied to the DACs 121, 122, respectively, as outputs of the digital signal processing unit 1610. From the output of the DAC 121, the third signal which has the spectrum shown in FIG. 14(*c*) as an analog signal and which is denoted as S3(*f*) in Equations (25) is obtained. Similarly, from the output of the DAC 122, the fourth signal which has the spectrum shown in FIG. 14(*d*) as a analog signal and which is denoted as S4(*f*) in Equations (25) is obtained. In the case where the frequency response characteristics of the DACs 121, 122 are substantially flat within a bandwidth up to the upper limit frequency of the third signal S3(*f*) and fourth signal S4(*f*), the compensation units 1651, 1652 can be omitted.

The computation in the parallel shifting unit 1622 in FIG. 16 can be implemented by the combination of the cosine wave multiplication and the LPF without using the above-described Hilbert transform. In other words, the low pass filter having a cutoff frequency of about $f_c/2$ may be used after multiplying high-frequency signal 1662 to be inputted by the cosine wave of frequency $f_c/2$ in the time domain and 2r-folding the resultant. When assuming a spectrum of the high-frequency signal 1662 to be inputted as X(f) as represented in Equation (6) and a spectrum of a signal obtained by multiplying X(f) by the cosine wave of frequency $f_c/2$ and 2r-folding the resultant as Y"(f), such Y"(f) is represented by the following equation:

$$Y''(f) = 2r \cdot X(f) * \frac{\delta\left(f - \frac{f_c}{2}\right) + \delta\left(f + \frac{f_c}{2}\right)}{2} \quad \text{Equation (26)}$$

$$= r \cdot \left\{ X\left(f - \frac{f_c}{2}\right) + X\left(f + \frac{f_c}{2}\right) \right\}$$

$$= r \sum_{k=-\infty}^{+\infty} \left\{ S_B\left(f - \frac{f_c}{2} - kf_{s0}\right) + S_C\left(f - \frac{f_c}{2} - kf_{s0}\right) + S_B\left(f + \frac{f_c}{2} - kf_{s0}\right) + S_C\left(f + \frac{f_c}{2} - kf_{s0}\right) \right\}$$

Here, the second and third clauses of the right side of Equation (26) are necessary components as a parallel shifted signal, and first and fourth clauses are unnecessary components.

Figure 17A:
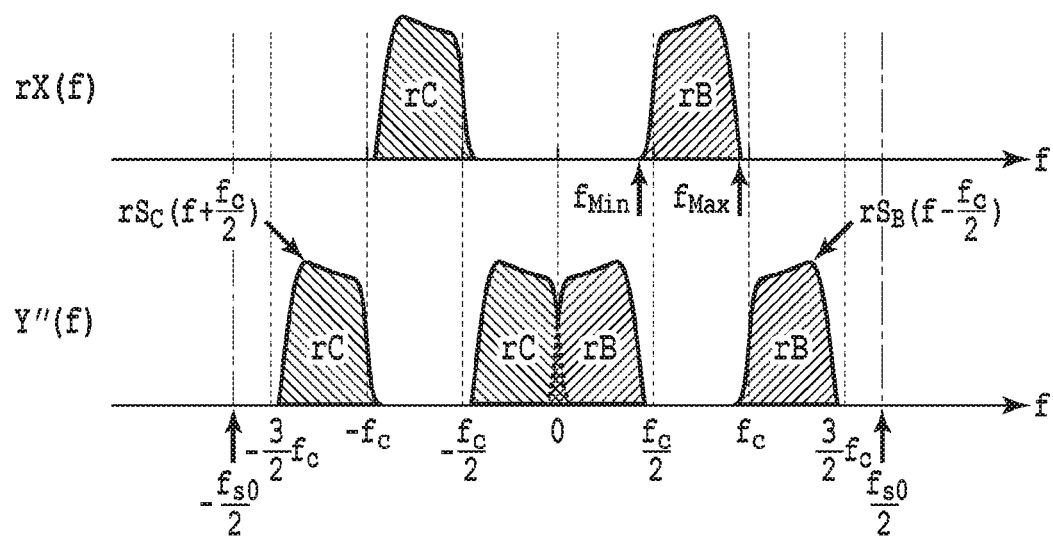
FIG. 17A is a spectrum diagram illustrating an computing operation in a parallel shifting unit when Hilbert transform is not used in the signal generating device according to the sixth embodiment of the present invention.
Figure 17B:
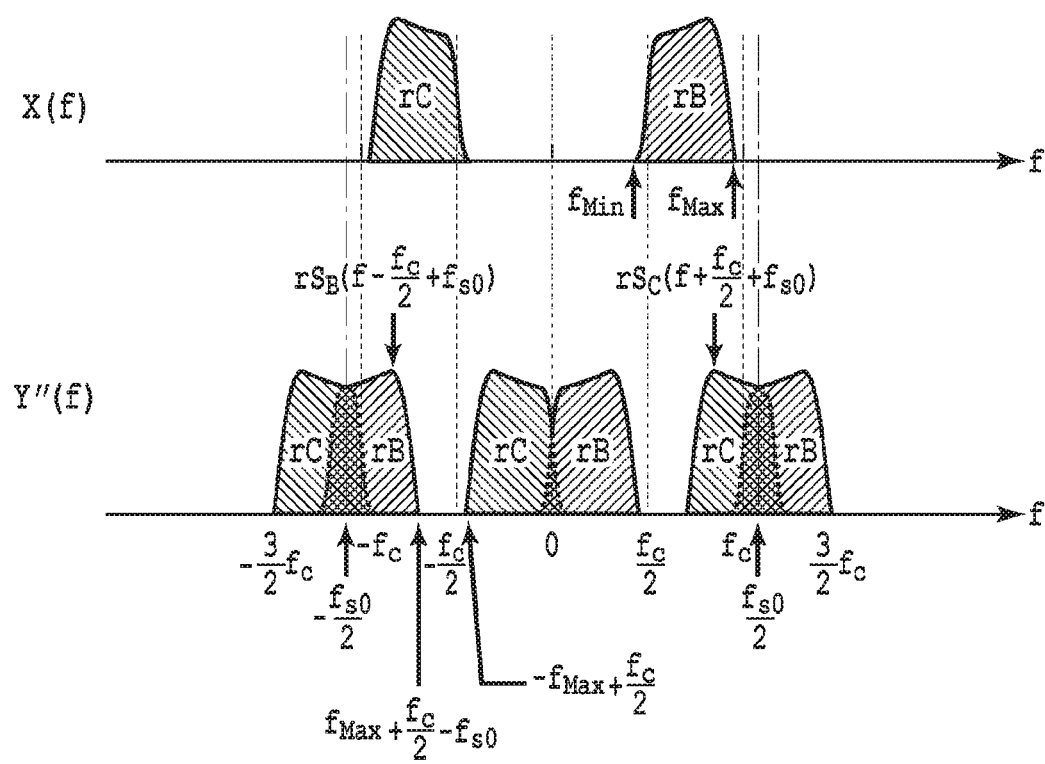
FIG. 17B is another spectrum diagram illustrating an computing operation in the parallel shifting unit when Hilbert transform is not used in the signal generating device according to the sixth embodiment of the present invention.

FIG. 17A and FIG. 17B are spectrum diagrams illustrating an computing operation in a parallel shifting unit when Hilbert transform is not used. The spectrum diagrams in FIG. 17A and FIG. 17B differ from those of FIG. 7A and FIG. 7B used for the explanation of the first embodiment. This difference derives from the fact that the drive frequency of the analog multiplexer 131 is $f_c$ in the first embodiment and is $f_c/2$ in the present embodiment.

Let us focus on rSB (f−$f_c$/2−k$f_{s0}$) in the first clause of the third row of the right side in Equation (26) below. The first clause of Equation (8) represents a spectrum which is obtained by r-folding the signal component of the positive frequency signal B in FIG. 14(*b*) and shifting it by +$f_c$/2 on the frequency axis and which repeatedly appears in an $f_{s0}$ interval. Here, the upper limit frequency of the signal component of the positive frequency signal B is assumed as $f_{Max}$ and the lower limit frequency is assumed as fMin. As for the spectrum of the first clause of Equation (26), in the case where the sampling rate $f_{s0}$ of the input signal 101 is $f_{s0} > f_{Max} + f_c/2$, as shown in FIG. 17A, a component of k=0, that is, $S_B$(f−$f_c$/2), only appears within the range of Nyquist band, that is, within |f|<$f_{s0}$/2. These unnecessary components can be easily removed by using, for example, the LPF of the cutoff frequency of about $f_c/2$.

Meanwhile, in the case where the sampling rate $f_{s0}$ of the input signal 101 is $f_{s0} < f_{Max} + f_c/2$, as shown in FIG. 17B, the component of k=−1, that is, $S_B$(f−$f_c$/2+$f_{s0}$) appears on the negative frequency side. The upper limit frequency of the unnecessary component that appears on this negative frequency side is $f_{Max} + f_c/2 − f_{s0}$, whereas the lower limit frequency of $S_C$(f−$f_c$/2), which is a necessary component, is −$f_{Max} + f_c/2$. Here, when subtracting the upper limit frequency of the above unnecessary component from the lower limit frequency of the above necessary component, (−$f_{Max}$+$f_c/2$)−($f_{Max}+f_c/2−f_{s0}$)=$f_{s0}$−2$f_{Max}$ holds, and when considering $f_{s0}$>2$f_{Max}$ due to the sampling theorem, it is recognized that the lower limit frequency of the above necessary component is constantly larger than the upper limit frequency of the above unnecessary component (close to zero on the frequency axis). Therefore, this unnecessary component which appears on the negative frequency side can be removed by using the LPF of the cutoff frequency of about |−$f_{Max}+f_c/2$|. The above discussion is similarly established for SC(f+$f_c$−k$f_{s0}$) in the fourth clause of the third row of the right side in Equation (8) as well. In other words, as for processing in the parallel shifting unit 1622, an unnecessary frequency component may be removed by an appropriate LPF after multiplying by the cosine wave of the frequency $f_c$.

Furthermore, as another implementation method, the entire processing flow in the digital signal processing unit 1610 shown in FIG. 16 is not processing using the time domain as explained above, as in the first embodiment, but can be achieved by using processing of the frequency domain using the DFT and the like.

As described above, a plurality of variations of different implementation methods for processing in each of the blocks in the digital signal processing unit 1610 have been presented as well, but, in the signal generating device of the present embodiment, the feature of the present invention does not depend, as in the first embodiment, on the method of implementing specific computing processing in the digital signal processing unit 1610. The present invention has a feature of operating the digital signal processing unit 1610 so as to output, to the analog multiplexer 131, the third signal having the spectrum shown in FIG. 14(*c*) and the fourth signal having the spectrum shown in FIG. 14(*d*) as the output analog signals for the two DACs 121, 122. In other words, the feature of the present invention and its advantageous result are exerted such that the digital signal processing unit 1610 supplies, to the two DACs, digital signals outputting signals indicated as the third signal S3(f) and fourth signal S4(f) in Equations (25). As in the first embodiment shown in FIG. 1, in the entire configuration of the signal generating device of the present embodiment forms, in each of the output points of the DACs 121, 122 through the output of the analog multiplexer 131, when two signal paths are viewed along the traveling direction of electric signals, a symmetric configuration by regarding the traveling direction as a virtual central axis. Therefore, as in the case of the first embodiment, the adjustment of the amplitude and delay of the DACs is facilitated.

Further, the digital signal processing unit 810 of the signal generating device 800 shown in FIG. 8, the digital signal processing units 910a to 910d of the signal generating devices 900a to 900d shown in FIG. 9, and the digital signal processing units 1210-3-1 to 4 of the signal generating devices 1200-3-1 to 4 shown in FIG. 12 each can be used by replacing it with the digital signal processing unit 1610 used in the present embodiment. In such a case, if the output bandwidths of the DACs 821, 822, 921, and 922 are fixed, the drive clock frequency of the analog multiplexer 131 needs to be set to approximately ½ of that before replacement.

Seventh Embodiment

The signal generating device according to the seventh embodiment of the present invention is the one that applies the principle of the signal generation which requires half the drive clock frequency of the analog multiplexer used in the above sixth embodiment to the signal generating device adapted to the generation of a multicarrier signal shown as the fourth embodiment. Therefore, the difference between the fourth embodiment and the present embodiment is identical to the difference between the sixth embodiment and the first embodiment. In other words, when comparing with the fourth embodiment, the signal generating device of the present embodiment has features including an aspect in which the drive clock frequency of the analog multiplexer for a given desired signal only requires half and an aspect in which unnecessary components appear in the high frequency band beyond the upper limit frequency of a desired signal in a final output signal can be significantly suppressed. The explanation will be given below by focusing on the difference between the present embodiment and the fourth embodiment.

Figure 18:
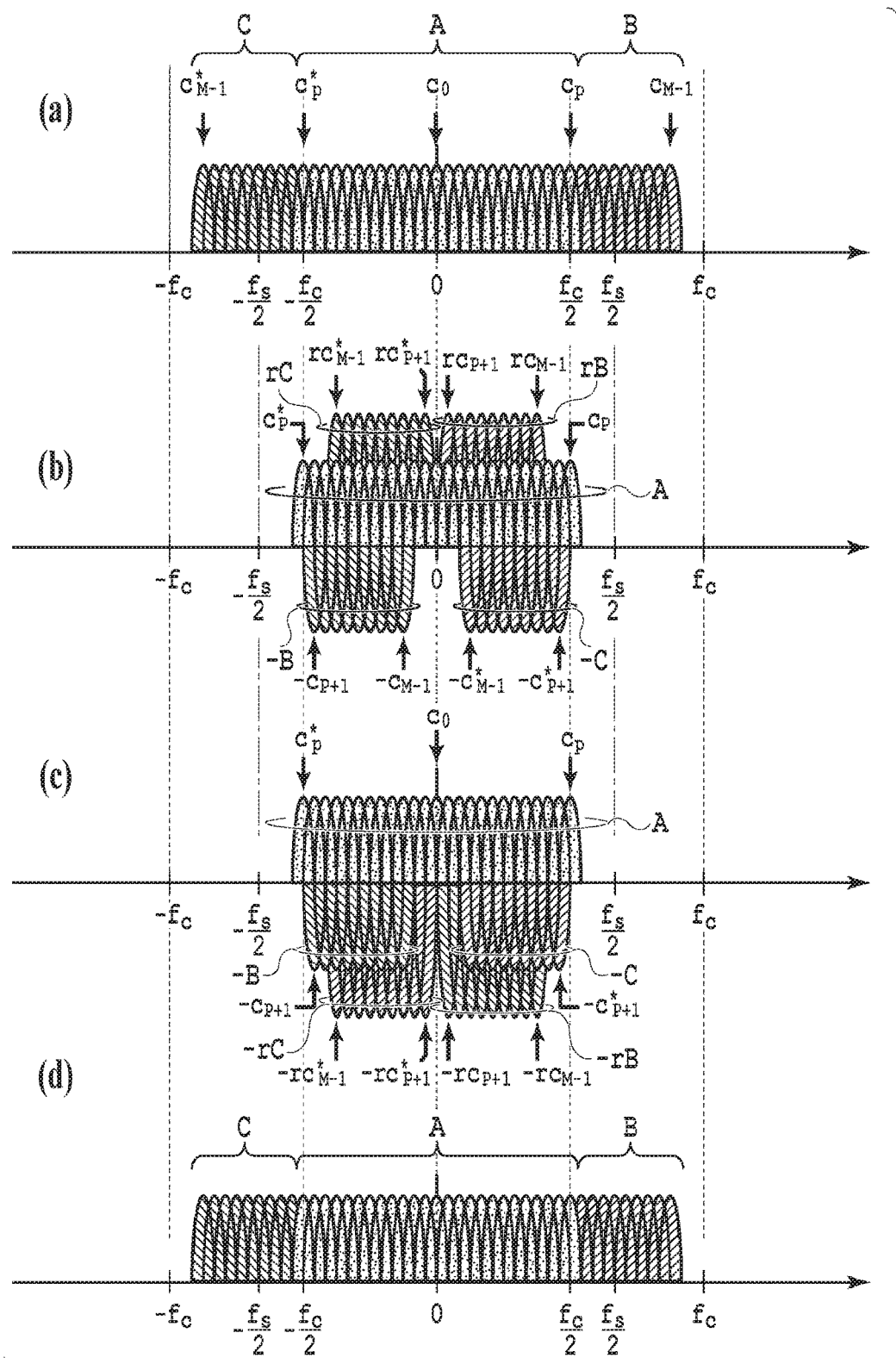
FIG. 18 is a diagram schematically illustrating processing until an OFDM signal is generated in the frequency domain by a signal generating device according to a seventh embodiment of the present invention.

FIG. 18 schematically illustrates processing until an OFDM signal is generated in the frequency domain by the signal generating device according to the seventh embodiment of the present invention. FIG. 18(a) shows a spectrum of a baseband OFDM signal which is a desired signal. A spectrum of FIG. 18(b) corresponds to the state of the spectrum shown in FIG. 14(c) of the sixth embodiment. In order to generate the spectrum of FIG. 18(b), a complex conjugate may be taken in advance for the subsymbol value of p+1th through M−1th of the OFDM signal for a desired signal at the OFDM signal generation stage and this is subtracted from the subsymbol value of p−1th through 2p−M+1th, while the subsymbol value of p+1th through M−1th may be r-folded and this is added to the subsymbol value of the first through −p+M−1th, and then IDFT computation may be performed.

A spectrum of FIG. 18(c) corresponds to the state of the spectrum shown in FIG. 14(d) of the sixth embodiment. In order to generate the spectrum of FIG. 18(c), a complex conjugate may be taken in advance for the subsymbol value of p+1th through M−1th of the OFDM signal for a desired signal at the OFDM signal generation stage and this is subtracted from the subsymbol value of p−1th through 2p−M+1th, while the subsymbol value of p+1th through M−1th may be r-folded and this is subtracted from the subsymbol value of the first through M−p−1th, and then IDFT computation may be performed.

When a signal having a first spectrum of FIG. 18(b) and a signal having a second spectrum of FIG. 18(c) are outputted from the DACs 121, 122, respectively, due to the same principle as that of the spectrum operation shown in FIGS. 14(e) to 14(g), a signal of a spectrum shown in FIG. 18(d) is obtained as an output of the analog multiplexer 131. As such, even when the output bandwidth of the DACs 121, 122 is about $f_c/2$, in the signal generating device of the present embodiment, any OFDM signal whose upper limit frequency is sufficiently larger than $f_c/2$ (but smaller than $f_c$) can be obtained as a final output signal from the analog multiplexer 131. The example of the series of processing for generating the OFDM signal explained in FIGS. 18(a) to (d) can be applied to other multicarrier signals such as a DMT signal.

A third spectrum shown in FIG. 18(b) and a fourth signal spectrum shown in 18(c) are represented as follows using the same symbols as those in Equations (15):

Equations (27)

$$S_3(f) = S_A(f) - \sum_{m=p+1}^{M-1} [C_m\{f + (2p-m)\Delta f\} + C_m^*\{f - (2p-m)\Delta f\}] +$$

$$r \sum_{m=p+1}^{M-1} [C_m\{f - (m-p)\Delta f\} + C_m^*\{f + (m-p)\Delta f\}]$$

$$= S_A(f) - \{S_B(f + f_c) + S_C(f - f_c)\} + r\left\{S_B\left(f + \frac{f_c}{2}\right) + S_C\left(f - \frac{f_c}{2}\right)\right\}$$

$$S_4(f) = S_A(f) - \sum_{m=p+1}^{M-1} [C_m\{f + (2p-m)\Delta f\} + C_m^*\{f - (2p-m)\Delta f\}] -$$

$$r \sum_{m=p+1}^{M-1} [C_m\{f - (m-p)\Delta f\} + C_m^*\{f + (m-p)\Delta f\}]$$

$$= S_A(f) - \{S_B(f + f_c) + S_C(f - f_c)\} - r\left\{S_B\left(f + \frac{f_c}{2}\right) + S_C\left(f - \frac{f_c}{2}\right)\right\}$$

With reference to Equations (27), the relation between the spectra of $S_A(f)$, $S_B(f)$, $S_C(f)$, $S_3(f)$, and $S_4(f)$ is eventually identical to that in Equations (25) explained in the sixth embodiment. The spectrum $S_{out}(f)$ of the output signal of the analog multiplexer 131 in Equations (27) has a shape identical to Equations (25), and the signal generating device of the present embodiment is recognized to perform signal processing equivalent to that of the sixth embodiment. Therefore, an advantageous result obtained in the signal generating device of the sixth embodiment can be wholly obtained in the present embodiment. In other words, due to the signal generating device of the present embodiment, it is possible to achieve the multicarrier signal output of a broader bandwidth beyond the output bandwidth of the individual DACs 121, 122. At this time, the drive clock frequency $f_c/2$ of the analog multiplexer is about ½ of the upper limit frequency of a desired signal. Also, at the same time, unnecessary signal components which appear in the frequency band beyond the upper limit frequency of a desired signal in a final output signal can be significantly suppressed compared to the signal generating device of the fourth embodiment.

Figure 19:
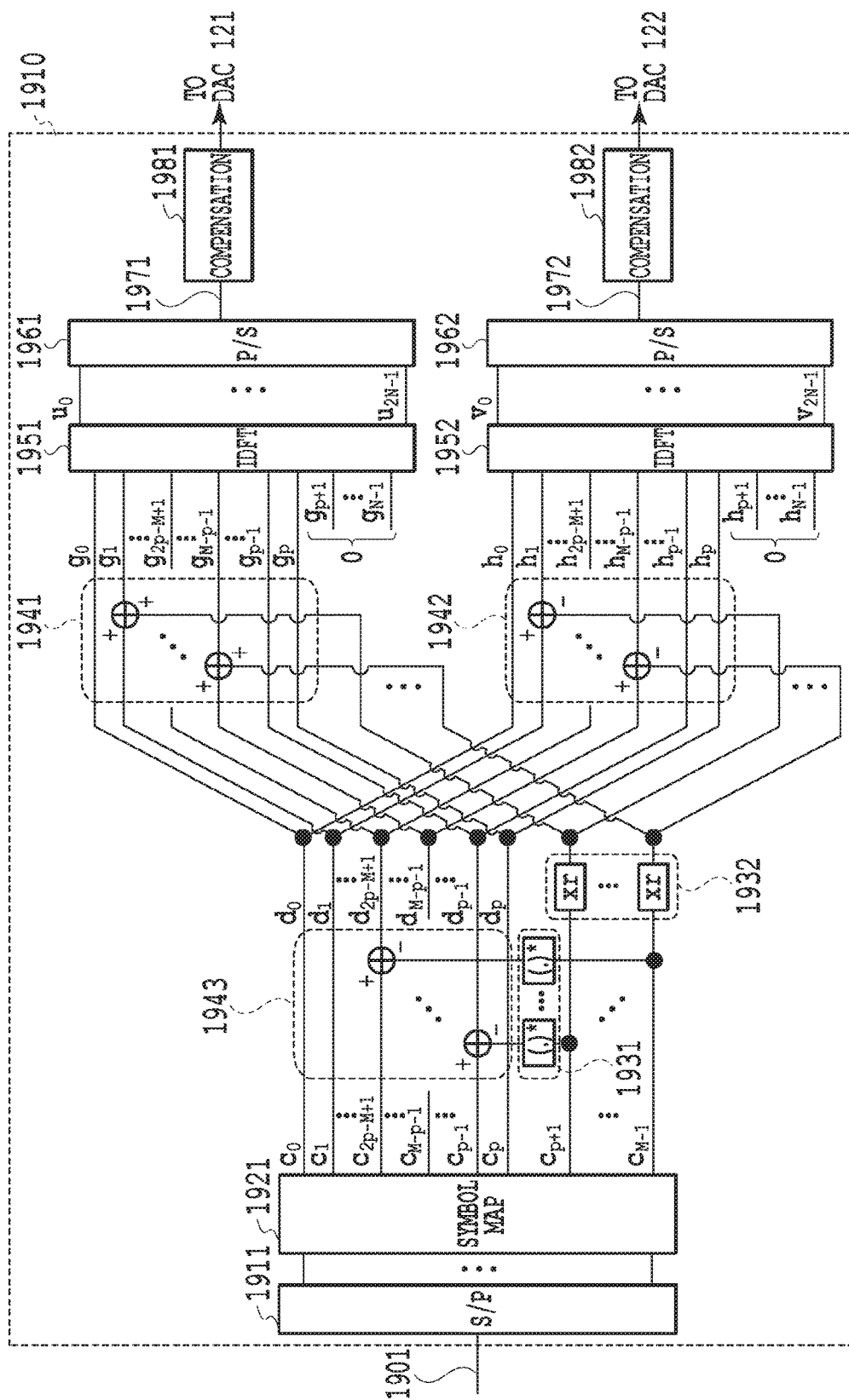
FIG. 19 is a diagram showing a configuration of the digital signal processing unit in the signal generating device according to the seventh embodiment of the present invention.

FIG. 19 is a diagram showing a configuration of the digital signal processing unit in the signal generating device according to the seventh embodiment of the present invention. A digital signal processing unit 1910 of FIG. 19 corresponds to the digital signal processing unit 1110 of the signal generating device of the fourth embodiment shown in FIG. 11. The explanation will be given below by focusing on the difference between the digital signal processing unit 1110 shown in FIG. 11 and the digital signal processing unit 1910 of FIG. 19.

First of all, among subsymbol values c0 to cM−1 that are outputted from a symbol mapping unit 1921, the subsymbol values cp+1 to cM−1 corresponding to the signal component B and the signal component C are each divided into two branches, that is, one is sent to a complex conjugate conversion unit 1931 and the other is sent to a constant multiplication unit 1932. The complex conjugate conversion unit 1931 takes a complex conjugate for the inputted subsymbol value and output it to a subtraction unit 1943. In the subtraction unit 1943, the subsymbol values d0 to $d_p$ are obtained by the following equation:

$$d_n = \begin{cases} c_n: & n = 0, 1, \ldots 2p - M \text{ and } n = p \\ c_n - c^*_{2p-n}: & n = 2p - M + 1, \ldots, p - 1 \end{cases} \quad \text{Equation (28)}$$

In the constant multiplication unit 1932, inputted symbol values are each r-folded. Thereafter, the subsymbol values $d_1$ to $d_p$ and $rc_{p+1}$ to $rc_{M-1}$ are each divided into two branches, one sent toward an addition unit 1941 and the other toward a subtraction unit 1942. In the addition unit 1941 and the subtraction unit 1942, the intermediate subsymbol values $g_0$ to $g_p$ and $h_0$ to $h_p$ are obtained by the following equations, respectively:

$$g_n = \begin{cases} d_n: & n = 0 \text{ and } n = M - p, \ldots, p \\ d_n + rc_{n-p}: & n = 1, \ldots, M - p - 1 \end{cases} \quad \text{Equations (29)}$$

$$h_n = \begin{cases} d_n: & n = 0 \text{ and } n = M - p, \ldots, p \\ d_n - rc_{n-p}: & n = 1, \ldots, M - p - 1 \end{cases}$$

Processing after the addition unit 1941 and the subtraction unit 1942 is identical to that of the digital signal processing unit of the fourth embodiment shown in FIG. 11. The output $u_k$ from an IDFT computation unit 1951 and the output $v_k$ from an IDFT computation unit 1952 can be confirmed to have a waveform in which a time waveform obtained as the inverse Fourier transform of $S_3(f)$ and $S_4(f)$ shown in Equations (27) has been sampled with the sampling rate of $f_s=1/T_s$, which is identical to the case of explanation of the fourth embodiment.

Incidentally, in the present embodiment, a maximum frequency pΔf of a subcarrier for a low-frequency signal (the signal component A in FIG. 10) matches with $f_c/2$, but, as in the case of the fourth embodiment, the operation principle of the digital signal processing unit of the present embodiment shown in FIG. 18 is still established even when pΔf is deviated by the integral multiple of Δf/2 from $f_c/2$.

As to an aspect that the DMT, the DFT-spread OFDM, and the like, besides the OFDM, can be used as desired signals, and an aspect that undergoing pre-equalization processing such as enhancing the intensity of a subcarrier on the high-frequency side in the symbol mapping unit 1921 for compensating the output response characteristic of the analog multiplexer 131 can be made, they are identical to the case of the signal generating device of the fourth embodiment.

Furthermore, the digital signal processing unit 810 of the signal generating device 80 shown in FIG. 8, the digital signal processing units 910a to 910d of the signal generating devices 900a to 900d shown in FIG. 9, and the digital signal processing units 1210-3-1 to 4 of the signal generating devices 1200-3-1 to 4 shown in FIG. 12 can be used by replacing them with the digital signal processing unit 1910 of the present embodiment. In such a case, if the output bandwidths of the DACs 821, 822, 921, and 922 are fixed, the drive clock frequency of the analog multiplexer 131 needs to be set to approximately ½ of that before replacement.

Eighth Embodiment

Figure 20:
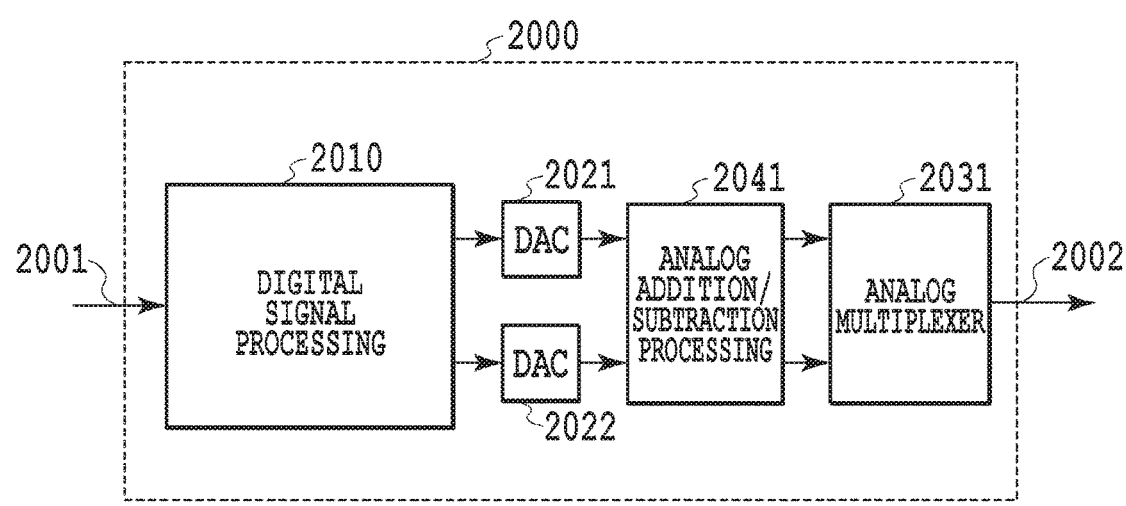
FIG. 20 is a diagram schematically showing a configuration of a signal generating device according to an eighth embodiment of the present invention.

FIG. 20 is a diagram schematically showing a configuration of the signal generating device according to the eighth embodiment of the present invention. A signal generating device 2000 of the present embodiment includes a digital signal processing unit 2010, two DACs 2021, 2022, an analog addition/subtraction unit 2041, and an analog multiplexer 2031. An input signal 2001 to the signal generating device 2000 undergoes digital signal processing specific to the present invention in the digital signal processing unit 2010. Digital data signals from the digital signal processing unit 2010 which have underwent signal processing to be described later are converted into analog signals in a first DAC 2021 and a second DAC 2022, respectively. The analog signal outputs from the two DACs undergo addition/subtraction processing in the analog addition/subtraction processing unit 2041. Lastly, the analog signal outputs from the analog addition/subtraction processing unit 2041 are converted into an output signal 2002 by the analog multiplexer 2031.

The signal generating device of the present embodiment has its entire configuration similar to that of the signal generating device of the first embodiment shown in FIG. 1, but is different in the aspect of the method of addition/subtraction processing for the low-frequency signal and the folded signal in the first embodiment. Specifically, in the signal generating device of the first embodiment, this addition/subtraction processing is performed within the digital signal processing unit 110, whereas, in the present embodiment, the equivalent addition/subtraction processing is performed within the analog addition/subtraction processing unit 2041. As a result, although a disadvantage such as increased analog parts compared to those of the signal generating device of the first embodiment or a complicated analog circuit configuration arises, an advantage of improving a signal to noise ratio (SNR) of a final output signal which will be described later can be obtained.

Figure 21A:
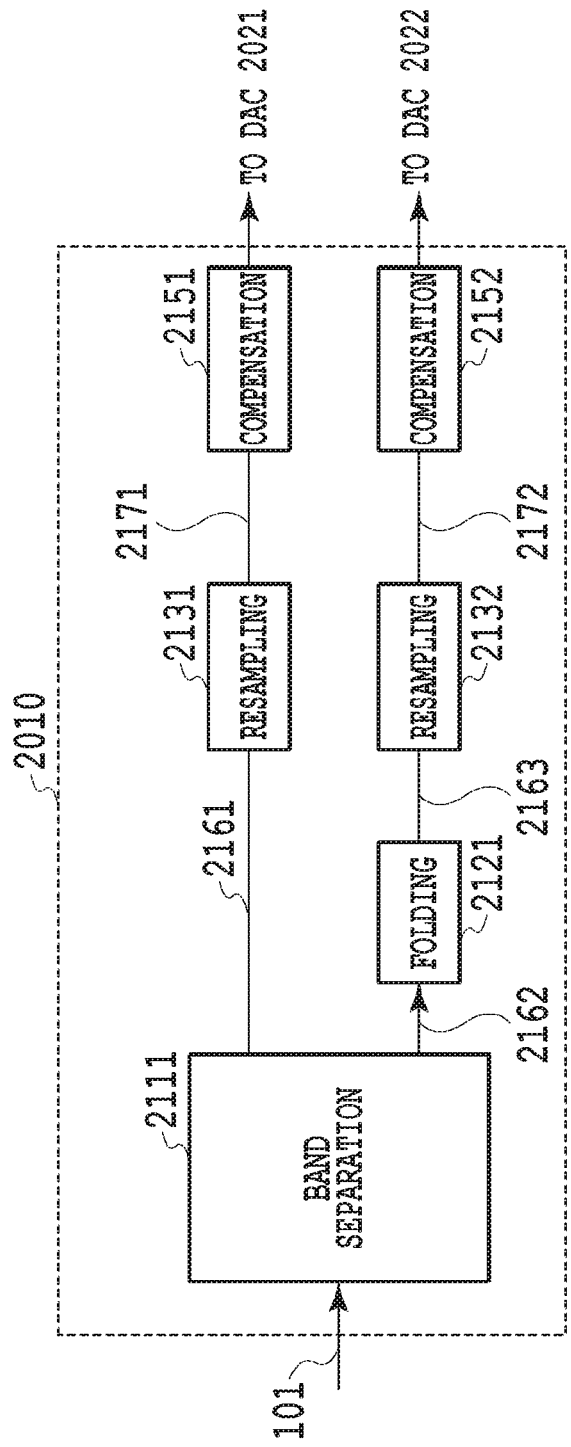
FIG. 21A is a block diagram illustrating a configuration and flow of the digital signal processing unit of the signal generating device according to the eighth embodiment of the present invention.

FIG. 21A is a block diagram illustrating a configuration and flow of the digital signal processing unit in the signal generating device of the present embodiment. The differences between the digital signal processing unit 110 of the first embodiment shown in FIG. 6 and a digital signal processing unit 2010 of the present embodiment in FIG. 21A only exist in the following two aspects. Firstly, in the digital signal processing unit 2010 of the present embodiment, parts corresponding to the addition unit 641 and the subtraction unit 642 in FIG. 6 are omitted. Therefore, a signal obtained by resampling a low-frequency signal 2161 by a resampling unit 2131 is outputted to the DAC 2021 via the compensation unit 2151 as a fifth signal 2171 as it is. Similarly, a signal obtained by resampling a folded signal 2163 by a resampling unit 2132 is outputted to the DAC 2022 via the compensation unit 2152 as a sixth signal 2172 as it is. Secondly, in the digital signal processing unit 2010 of the present embodiment, constant-r-folding processing is not performed in a folding unit 2121.

Figure 21B:
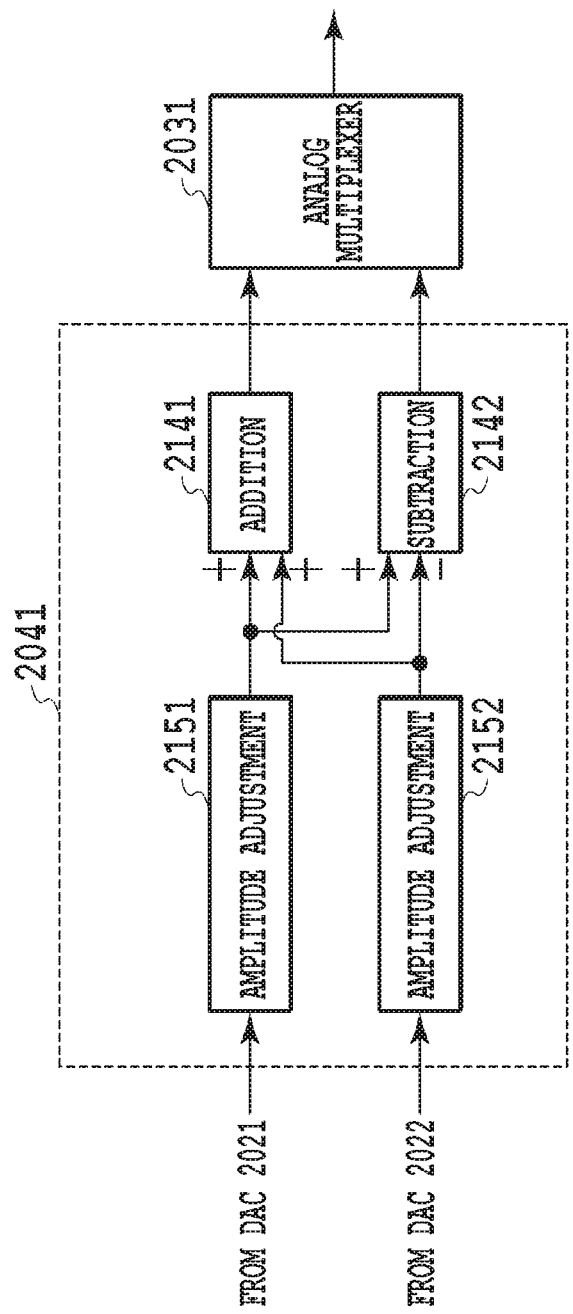
FIG. 21B is a block diagram illustrating a configuration and flow of an analog addition/subtraction processing unit of the signal generating device according to the eighth embodiment of the present invention.

FIG. 21B is a block diagram illustrating a configuration and flow of an analog addition/subtraction processing unit in the signal generating device according to the eighth embodiment of the present invention. Analog input signals of a dual system sent from the DACs 2021, 2022, respectively, are firstly adjusted in the amplitude adjustment units 2151, 2152 such that a relative amplitude becomes 1:r (i.e., r-folded). Next, each signal of the dual system is branched into two sets. As for one set of branched light, two signals from the amplitude adjustment units 2151, 2152 are added in an addition unit 2141. As for the other set of branched light, a signal from the amplitude adjustment unit 2152 is subtracted from a signal from the amplitude adjustment unit 2151 in a subtraction unit 2142. Output signals of the addition unit 2141 and subtraction unit 2142 are both sent to the analog multiplexer 2031.

Figure 22:
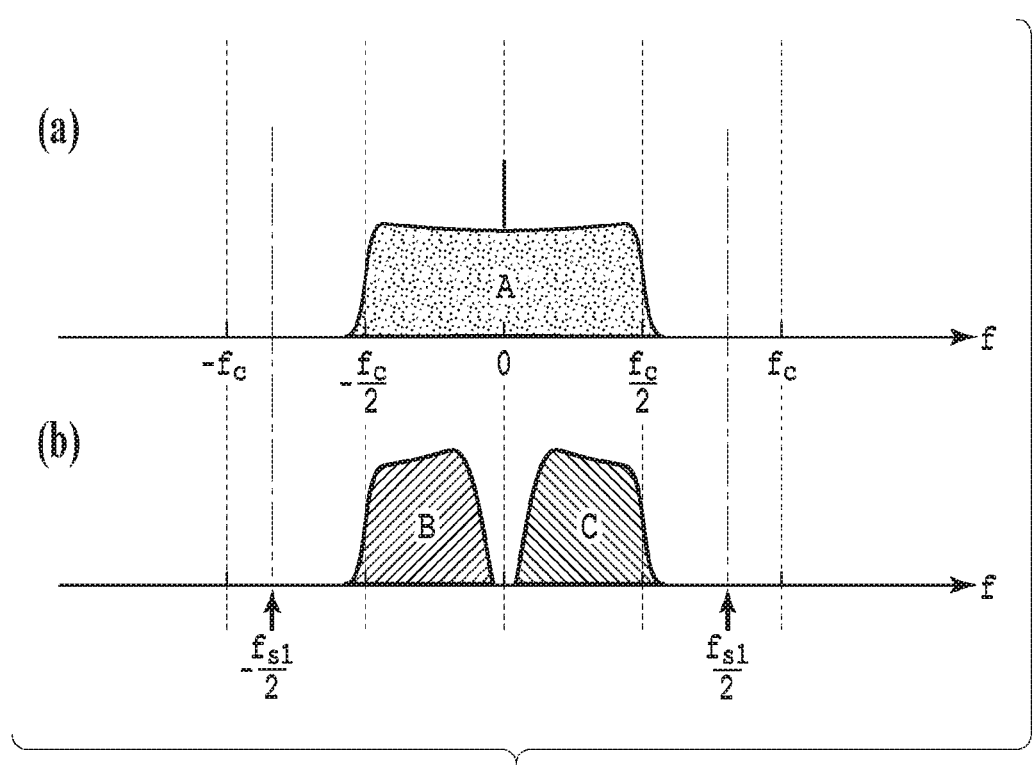
FIG. 22 is a diagram schematically representing a fifth signal and a sixth signal outputted from a resampling unit in the signal generating device according to the eighth embodiment of the present invention.

FIG. 22 is a diagram schematically representing a fifth signal and sixth signal in the frequency domain which are outputs from the resampling units in the signal generating device of the eighth embodiment of the present invention. With reference to FIG. 22 for the present embodiment and FIG. 5 for the first embodiment, the explanation will be given below by focusing on the difference between waveform-synthesizing operation in the present embodiment and waveform-synthesizing operation in the first embodiment. As shown in FIGS. 5(c) and 5(d), in the first embodiment, processing up to the stage of generating the first signal by superimposing the folded signals rB and rC on the low-frequency signal A in the in-phase state and processing up to the stage of generating the second signal by superimposing the folded signals rB and rC on the low-frequency signal A in the opposite-phase state are all made in the digital domain.

On the other hand, in the present embodiment, a low-frequency signal A shown in FIG. 22(a) is sent to the DAC 2021 as the fifth signal. A folded signal B and a folded signal C which are not constant-r folded yet as shown in FIG. 22(b) are sent to the DAC 2022 as the sixth signal. The fifth signal and sixth signal are converted into analog signals by the DACs 2021, 2022, respectively. Thereafter, in an analog domain, processing such as addition and subtraction is performed in the analog addition/subtraction processing unit 2041, and signals corresponding to FIGS. 5(c) and 5(d) are outputted. In other words, as an output of the addition unit 2141, a signal corresponding to the signal in which the r-folded folded signals rB and rC are added to the low-frequency signal A as shown in FIG. 5(c) is outputted. Also, as an output of the subtraction unit 2142, a signal corresponding to the signal in which the r-folded folded signals rB and rC are subtracted from the low-frequency signal A as shown in FIG. 5(d) is outputted. A principle of synthesizing the signals thereafter is identical to the case of the first embodiment shown in FIGS. 5(e) to 5(g).

Figure 23A:
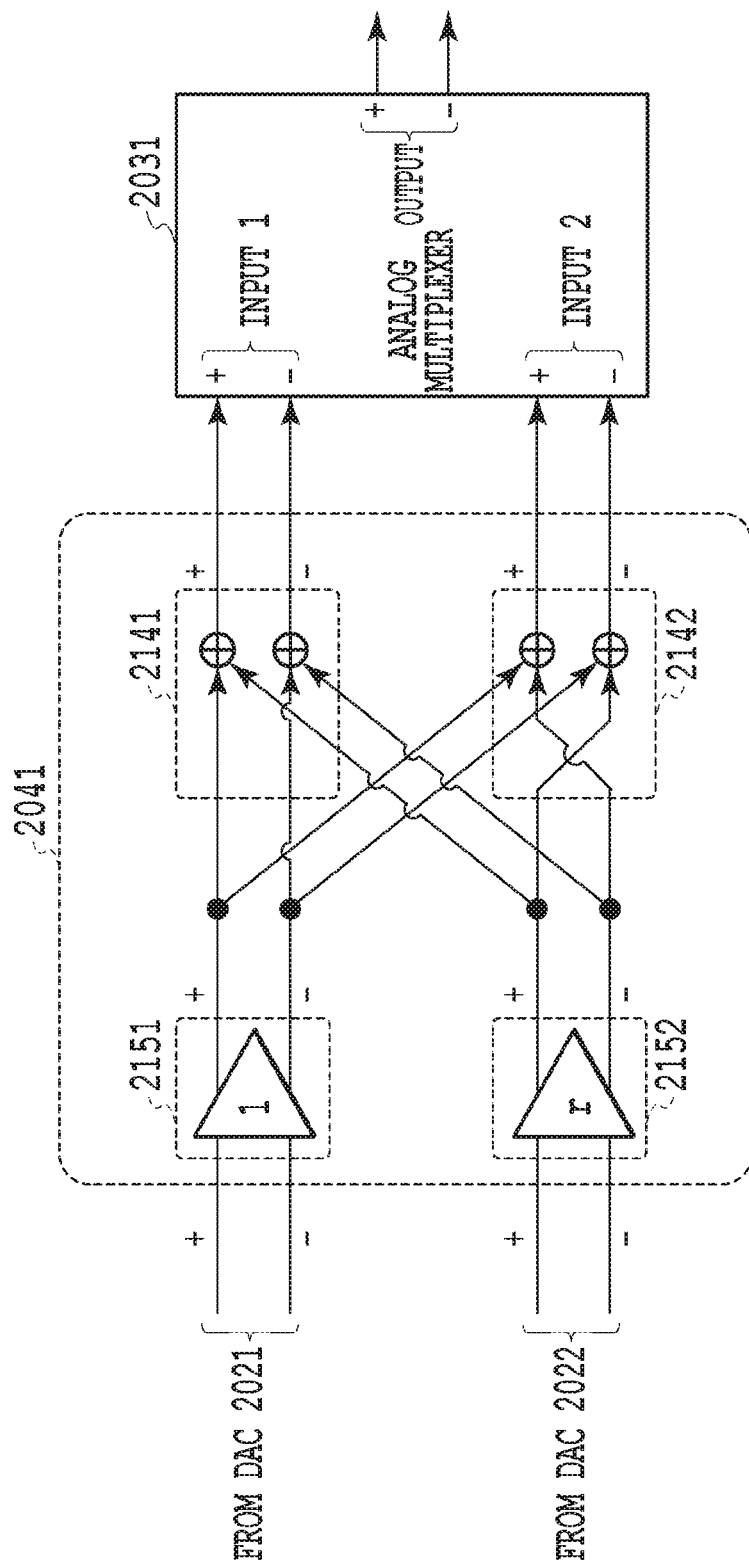
FIG. 23A is a diagram showing a configuration example of the analog addition/subtraction unit in the signal generating device according to the eighth embodiment.

FIG. 23A is a diagram showing a configuration example of the analog addition/subtraction unit in the signal generating device of the eighth embodiment. Specific circuit configurations for the analog addition/subtraction unit 2041 are considered to be countless, and one example is presented in FIG. 23A. Here, a configuration of a case where the outputs of the DACs 2021, 2022 and the analog multiplexer 2031 both serve as a differential input-output is presented. Each of the amplifier circuits of the differential input-output is used as the amplitude adjustment units 2151, 2152 to set the output amplitude of the amplitude adjustment unit 2152 to be r-folded relative to the amplitude adjustment unit 2151. Besides this configuration, it is possible to employ a configuration that uses an attenuation circuit instead of an amplifier circuit. In the addition unit 2141, a positive output of the amplitude adjustment unit 2151 and a positive output of the amplitude adjustment unit 2152 are inputted into an addition circuit, and thus its added output is a positive output. Also, a negative output of the amplitude adjustment unit 2151 and a negative output of the amplitude adjustment unit 2152 are inputted into the addition circuit, and thus its added output is a negative output. In the subtraction unit 2142, a positive output of the amplitude adjustment unit 2151 and a negative output of the amplitude adjustment unit 2152 are inputted into the addition circuit, and thus its added output is a positive output. Further, a negative output of the amplitude adjustment unit 2151 and a positive output of the amplitude adjustment unit 2152 are inputted into the addition circuit, and thus its added output is a negative output.

In a case where the output of the DACs 2021, 2022 has a configuration of a single phase (single-end configuration) instead of having the differential configuration, a single-phase input and differential output amplifier may be used as the amplitude adjustment units 2151, 2152 or a single-phase signal may be converted into a differential signal using a balun. Also, in a case where the analog multiplexer 2031 has a configuration of a single phase (single-end configuration) instead of having the differential configuration, the differential outputs of the addition unit 2141 and the subtraction unit 2142 may be converted into single-phase outputs by using the balun, a differential input and single-phase output amplifier, or the like. The analog addition/subtraction unit 2041 shown in FIG. 23A may be prepared as individual parts, or may be prepared integrally as one analog integrated circuit.

Figure 23B:
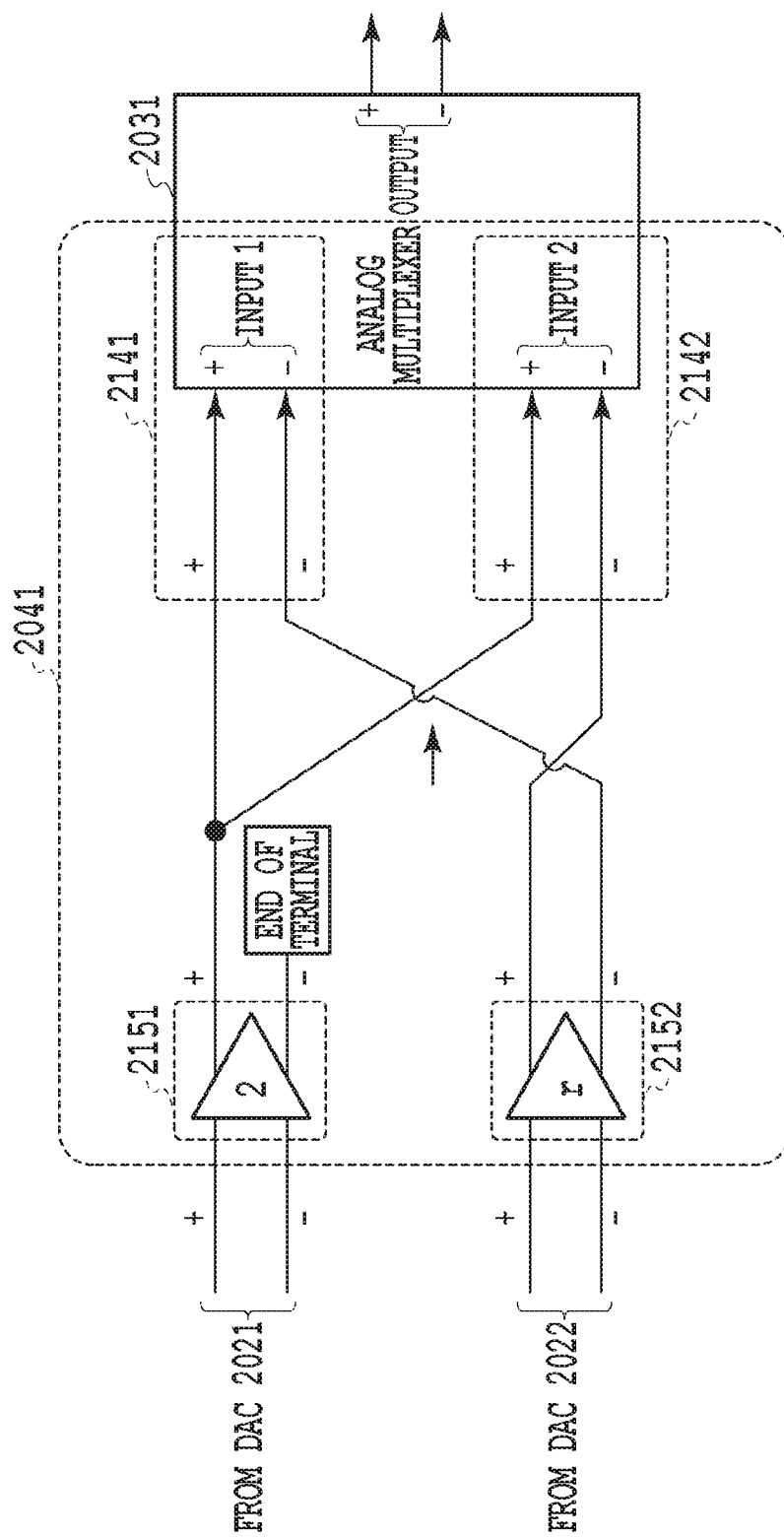
FIG. 23B is a diagram showing another configuration example of the analog addition/subtraction unit in the signal generating device according to the eighth embodiment.

FIG. 23B is a diagram showing another configuration example of the analog addition/subtraction unit in the signal generating device of the eighth embodiment. Here, a configuration of a case where the outputs of the DACs 2021, 2022 and the analog multiplexer 2031 both serve as a differential input-output is also presented. Provided, however, the common mode of a differential signal inputted into the analog multiplexer 2031 should be removed within the analog multiplexer 2031. In this case, if a signal x is inputted in the positive input side of one of the input ports in the analog multiplexer 2031 and a signal y is inputted in the negative input side thereof, an operation equivalent to the case of inputting a signal x-y into the input port can be obtained. In the configuration of FIG. 23B, each of the amplifier circuits of the differential input-output is used as the amplitude adjustment units 2151, 2152 to set the output amplitude ratio of the amplitude adjustment unit 2151 to the amplitude adjustment unit 2152 to be 2:r. The negative output of the amplitude adjustment unit 2151 terminates, and, after the positive output of the amplitude adjustment unit 2151 is branched into two, each of them is connected to the positive input side of the input ports of the analog multiplexer 2031. Meanwhile, the negative output of the amplitude adjustment unit 2152 is connected to the negative input side of a first input port of the analog multiplexer 2031 and the positive output of the amplitude adjustment unit 2151 is connected to the negative input side of a second input port of the analog multiplexer 2031. By branching the positive output of the amplitude adjustment unit 2151 into two, its amplitude is split in half, and thus, the configuration of FIG. 23B can achieve an operation equivalent to the case of using the configuration of FIG. 23A.

Therefore, the present invention may also be carried out using a signal generating device comprising: a digital signal processing unit 2010; two digital-to-analog converters (DACs) 2021, 2022; an analog addition/subtraction processing unit 2041 that outputs a first analog output signal in which a relative amplitude of analog input signals of a dual system is adjusted and which is equal to a sum of the analog input signals of the dual system whose relative amplitude has been adjusted and a second analog output signal which is equal to a difference in the analog input signals of the dual system whose relative amplitude has been adjusted; and an analog multiplexer 2031 that alternatingly switches the first analog output signal and the second analog output signal outputted from the analog addition/subtraction processing unit with a frequency $f_c$ for outputting as analog signals, wherein the digital signal processing unit includes: when a signal, among desired output signals having an upper limit frequency of less than $f_c$, made of a component having an absolute value of a frequency being substantially $f_c/2$ or less is assumed as a low-frequency signal (signal component A), and when, for a positive frequency component (signal component B) and a negative frequency component (signal component C) which are made of a component having an absolute value of a frequency being substantially $f_c/2$ or more among the desired output signals, a signal in which the positive frequency component is shifted by $-f_c$ on a frequency axis and a signal in which the negative frequency component is shifted by $+f_c$ on the frequency axis are assumed as a folded signal, means for generating a first signal 2161 that is equal to the low-frequency signal; and means for generating a second signal 2163 that is equal to the folded signal, and wherein: a digital signal corresponding to the first signal generated in the digital signal processing unit is inputted into a DAC 2021 which is one of the two DACs; a digital signal corresponding to the second signal generated in the digital signal processing unit is inputted into a DAC 2022 which is the other one of the two DACs, and analog outputs from the two DACs are each inputted into the analog addition/subtraction processing unit 2031 as the analog input signals of the dual system.

An advantage of the case when comparing the signal generating device of the present embodiment in which some processing including the addition/subtraction processing are made in the analog domain with the first embodiment in which all processing are made in the digital domain will further be explained below. In the signal generating devices according to all the embodiments of the present invention as described above, a major noise generation source in the output signals is the two DACs. To be more exact, a noise and distortion are generated, but in the following study, the distortion is included in the noise in the explanation for simplification. The amount of noise in each of the DACs is substantially determined by the full scale value of the DAC, and does not significantly depend on the waveform of a signal actually outputted by the DAC. Further, an input digital signal to the DAC must be standardized such that a maximum value and a minimum value in a time waveform is basically within the range of a full scale value of the DAC. As shown in FIGS. 5(c) and 5(d), when a plurality of superimposed signal components are inputted into the DAC in the digital domain, a maximum value and a minimum value in a time waveform of a signal after being superimposed must be standardized so as to fall within the range of a full scale of the DAC. When comparing with the case of outputting each signal component individually from the DAC, the signal intensity of each signal component needs to be reduced. As a result, the SNR of the output signal of the DAC leads to deterioration. Thus, in the signal generating device of the present embodiment, a problem of the above-described SNR deterioration is avoided by superimposing (adding and subtracting) the plurality of signal components in the analog domain instead of in the digital domain.

For explaining the above-described SNR deterioration problem in more detail, the case of generating a simple two-tone signal will be considered below. First of all, the full scale value of each DAC is assumed as −1 for the minimum and +1 for the maximum. When generating a single-tone sinusoidal signal of frequency f1 by one DAC, the total amplitude of this sine wave can be set to 2 (minimum value: −1, maximum value: +1), and thus the signal intensity becomes ½. Next, the case of adding a new sine wave of a frequency f2 to the sine wave of the original f1 in the digital domain by the amplitude ratio of 1:1 to change the DAC output signal to a two-tone signal is considered. At this time, in order to make the total amplitude of the time waveform (beat waveform) of the two-tone signal to take 2 (minimum value: −1, maximum value: +1), the total amplitude of the components of frequencies f1 and f2 must respectively be halved to 1 (minimum value: −½, maximum value: +½). The signal intensity of a sine wave of a total amplitude 1 is ⅛. Therefore, if focusing only on the signal intensity of the component of frequency f1 and when adding the component of frequency f2, the signal intensity of the component of frequency f1 is reduced by ¼ compared to before making addition. As long as the full scale value is fixed as described above, the intensity of noise added by the DAC is fixed. Therefore, for adding the component of frequency f2, the SNR becomes ¼, and thus leads to deterioration of 6 dB in logarithm notation.

When replacing the above-described component of frequency f1 with the low-frequency signal and the component of frequency f2 with the folded signal, respectively, a mechanism of SNR deterioration for the DAC units in the first embodiment when comparing with the signal generating device of the present embodiment can be roughly understood. In practice, in digital processing in the first embodiment, a folded signal is r-folded and folded, and thus, although the width of SNR deterioration in the DAC units varies between the deteriorated portion of the low-frequency signal and the high-frequency signal, the deterioration of 6 dB or more is found in average.

While the above-described SNR deterioration specified by the full scale value of the DAC occurs, in the first embodiment, the outputs of the two DACs each include signal components of both the low-frequency signal and the folded signal, and these are finally added in analog to reconfigure a signal, which is making one kind of diversity synthesis. For this reason, when comparing with the present embodiment which outputs the low-frequency signal and the folded signal to the individual DACs 2021, 2022, SNR improvement can be obtained by a diversity effect on the contrary. However, this SNR improvement due to the diversity effect shows 3 dB, and such an improvement effect cannot compensate for the above-described SNR deterioration of 6 dB in the DAC. Consequently, the signal generating device of the present embodiment can achieve better SNR than that in the first embodiment.

Incidentally, in a general data modulation signal and the like, the correlation between the low-frequency signal and the folded signal is smaller than in the case of simple two-tone signal as described above, and thus, the SNR deterioration for the DAC units in the first embodiment becomes smaller than 6 dB. However, when signal intensities of the low-frequency signal (A) and the high-frequency signals (B and C) in a desired signal are equal, the SNR deterioration for the DAC units in the first embodiment becomes 3 dB or more. For this reason, even with consideration of improvement due to the diversity effect in the first embodiment, the present embodiment can achieve better SNR in general. In the case where there is a significant difference between the signal intensity of the low-frequency signal and the signal intensity of the high-frequency signal and the correlation between those is small, the SNR deterioration due to scaling for the DAC units in the first embodiment becomes less than 3 dB. For this reason, it is considered that there may be a case where favorable SNR is achieved compared to that in the present embodiment. However, the effect of the present invention is exerted to a maximum when available bandwidth (DC to frequency $f_c$) are widely used as much as possible, and in such a case, the difference in signal intensities between the low-frequency signal and the high-frequency signal is small. Therefore, in most cases, the use of the signal generating device of the present embodiment in which some processing such as addition/subtraction processing are made in the analog domain allows obtaining the advantage of SNR improvement when compared with the first embodiment.

As is evident from the configuration shown in FIG. 20, FIG. 21A, FIG. 21B, and FIG. 23A, each of the output points of the DACs 2021, 2022 through the output of the analog multiplexer 2031 substantially forms, when two signal paths are viewed along the traveling direction of electric signals, a symmetric configuration by regarding the traveling direction as a virtual central axis. Therefore, in the signal generating device of the present embodiment as well, as in the first embodiment, the adjustment of the amplitude and delay of the DACs can be suppressed to the minimum. When using the configuration of FIG. 23B, the two signal paths are not symmetrical, but a difference only exists in passive circuit connection manners, which are different between the paths. When making comparison with the configuration in which a mixer made of an active element is generally inserted into only one of the paths as in the configuration example of the conventional technique shown in FIG. 13A, the adjustment of the amplitude and delay of the DACs and the like in the signal generating device of the present embodiment may be a minor one.

Ninth Embodiment

Figure 24:
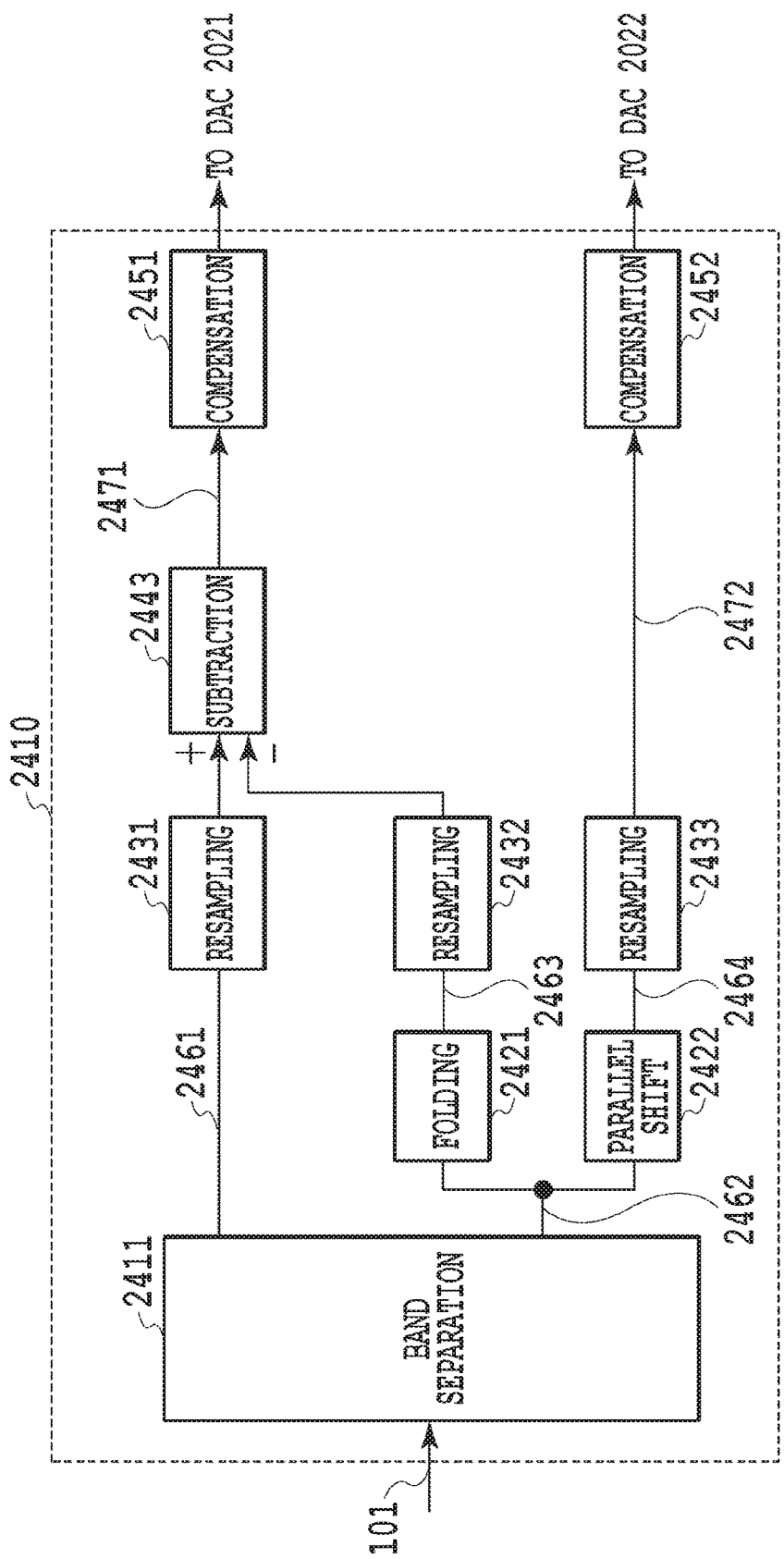
FIG. 24 is a block diagram illustrating a configuration and flow of the digital signal processing unit of a signal generating device according to a ninth embodiment of the present invention.

FIG. 24 is a block diagram illustrating a configuration and flow of the digital signal processing unit of the signal generating device according to the ninth embodiment of the present invention. The entire configuration of the signal generating device of the present embodiment is identical to the signal generating device 2000 of the eighth embodiment including the analog addition/subtraction processing unit 2041 shown in FIG. 20. The signal generating device of the present embodiment further differs from the eighth embodiment in that the series of waveform synthesizing processing of the sixth embodiment shown in FIGS. 14(*a*) to 14(*g*) are defined as an operation principle. In order to perform the series of waveform synthesizing processing of the sixth embodiment, as is similar to the configuration of FIG. 16, there is provided a digital signal processing unit 2410, as shown in FIG. 24, that does not include the addition/subtraction processing as a part of the digital domain. Therefore, the signal generating device of the present embodiment includes both the feature of the sixth embodiment and the feature of the eighth embodiment.

The operation principle of the signal generating device of the present embodiment is similar to the sixth embodiment, but the part of the addition/subtraction processing is made in the analog domain. In the sixth embodiment, the addition/subtraction processing of the low-frequency signal and the parallel shifted signal is made within the digital signal processing unit 1610. In contrast, in the present embodiment, the equivalent addition/subtraction processing is made within the analog addition/subtraction processing unit 2041. Therefore, as for the signal generating device of the present embodiment, the advantage and disadvantage relation explained in the eighth embodiment with respect to the first embodiment corresponds wholly to the signal generating device of the present embodiment. In other words, in the signal generating device of the present embodiment, although a disadvantage such as increased analog parts compared to those of the sixth embodiment or a complicated analog circuit configuration arises, an advantage of improving a signal to noise ratio (SNR) of a final output signal can be obtained.

The differences between the digital signal processing unit 2410 of the present embodiment shown in FIG. 24 and the digital signal processing unit 1610 of the sixth embodiment shown in FIG. 16 only exist in the following two aspects. Firstly, parts corresponding to the addition unit 1641 and the subtraction unit 1642 in FIG. 16 are omitted from the digital signal processing unit 2410. Therefore, an output of a subtraction unit 2443 that subtracts a folded signal 2421 from a low-frequency signal 2461 is directly outputted to the DAC 2021 via a compensation unit 2451 as a seventh signal 2471. Similarly, a signal obtained by resampling a parallel shifted signal 2464 by a resampling unit 2433 is directly outputted to the DAC 2022 via a compensation unit 2452 as an eighth signal 2472. Secondly, in the digital signal processing unit 2410, constant-r-folding processing is not performed in a parallel shifting unit 2422.

Figure 25:
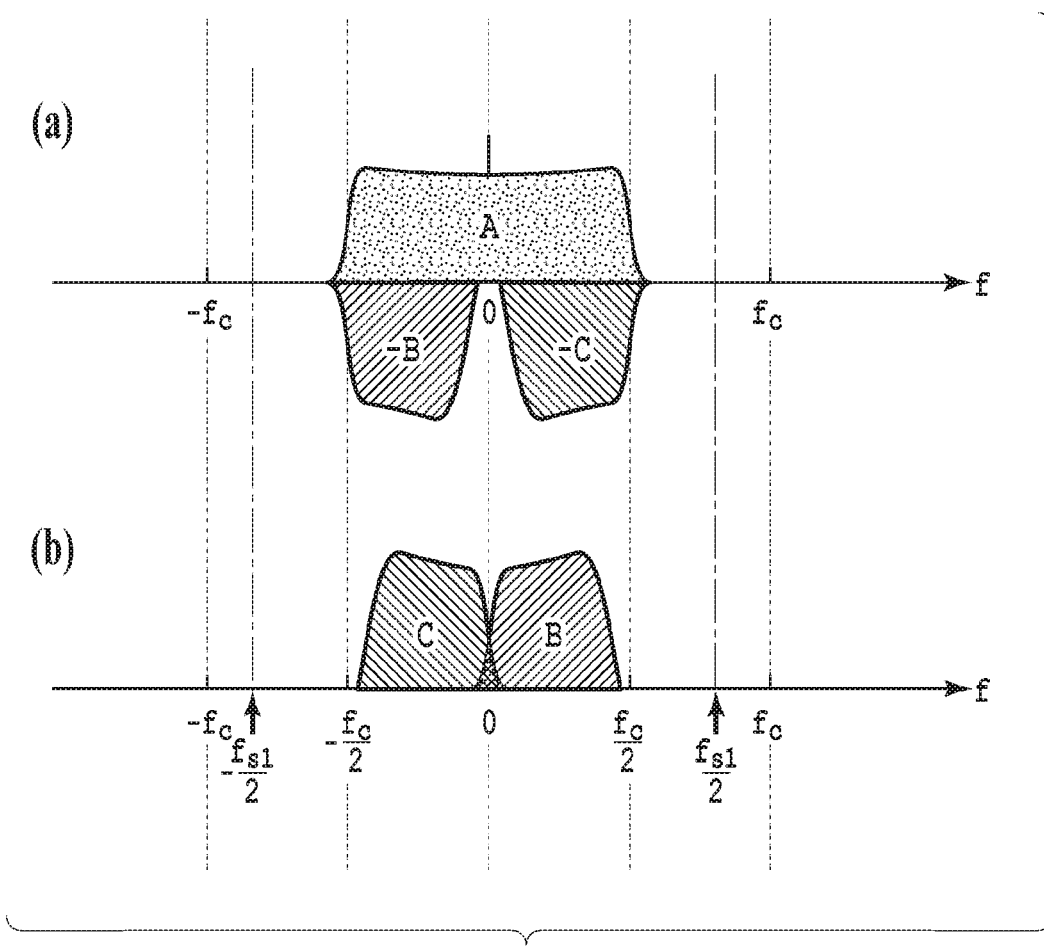
FIG. 25 is a diagram schematically representing a seventh signal outputted from a subtraction unit and an eighth signal outputted from a resampling unit in the signal generating device according to the ninth embodiment of the present invention.

FIG. 25 is a diagram schematically representing a seventh signal outputted from a subtraction unit and an eighth signal outputted from a resampling unit in the frequency domain in the signal generating device according to the ninth embodiment of the present invention. With reference to FIG. 25 for the present embodiment and FIG. 16 for the sixth embodiment, a difference between the waveform synthesizing operation in the signal generating device of the present embodiment and the waveform synthesizing operation in the sixth embodiment will be focused below for explanation. As shown in FIGS. 14(*c*) and 14(*d*), in the sixth embodiment, processing up to the stage of superimposing the folded signal B and folded signal C over the low-frequency signal A in the opposite phases, and further superimposing the r-folded parallel shifted signals rB and rC in the same phase, or superimposing the r-folded parallel shifted signals rB and rC in the opposite phases are all made in the digital domain.

On the other hand, in the present embodiment, a signal in which the folded signals B and C are superimposed on the low-frequency signal A shown in FIG. 25(*a*) in the opposite phases is sent to the DAC 2021 as the seventh signal. Also, the parallel shifted signals B and C which are not constant-r folded yet as shown in FIG. 25(*b*) are sent to the DAC 2022 as the eighth signal. The seventh signal and eighth signal are converted into analog signals by the DACs 2021, 2022, respectively. Thereafter, in the analog domain, processing such as addition and subtraction is performed in the analog addition/subtraction processing unit 2041, and signals corresponding to FIGS. 14(*c*) and 14(*d*) are outputted. In other words, as an output of the addition unit 2141, a signal corresponding to the signal in which the r-folded parallel shifted signals rB and rC are added to the above-described seventh signal shown in FIG. 14(*c*) is outputted. Also, as an output of the subtraction unit 2142, a signal corresponding to the signal in which the r-folded parallel shifted signals rB and rC are subtracted from the above-described eighth signal shown in FIG. 14(*d*) is outputted. The principle of synthesizing the signals thereafter is identical to the case of the sixth embodiment shown in FIGS. 14(*e*) to 14(*g*).

Therefore, the present invention may also be carried out using a signal generating device comprising: a digital signal processing unit 2410; two digital-to-analog converters (DACs) 2021, 2022; an analog addition/subtraction processing unit 2041 that outputs a first analog output signal in which a relative amplitude of analog input signals of a dual system is adjusted and which is equal to a sum of the analog input signals of the dual system whose relative amplitude has been adjusted and a second analog output signal which is equal to a difference in the analog input signals of the dual system whose relative amplitude has been adjusted; and an analog multiplexer 2031 that alternatingly switches the first analog output signal and the second analog output signal outputted from the analog addition/subtraction processing unit with a frequency $f_c/2$ for outputting as analog signals, wherein the digital signal processing unit includes: when a signal, among desired output signals having an upper limit frequency of less than $f_c$, made of a component having an absolute value of a frequency being substantially $f_c/2$ or less is assumed as a low-frequency signal, when, for a positive frequency component and a negative frequency component which are made of a component having an absolute value of a frequency being substantially $f_c/2$ or more among the desired output signals, a signal in which the positive frequency component is shifted by $-f_c$ on a frequency axis and a signal in which the negative frequency component is shifted by $+f_c$ on the frequency axis are assumed as a folded signal 2463, and when a signal in which the positive frequency component is shifted by $-f_c/2$ on the frequency axis and a signal in which the negative frequency component is shifted by $+f_c/2$ on the frequency axis are assumed as a parallel shifted signal 2464, means for generating a seventh signal that is equal to a signal obtained by subtracting the folded signal from the low-frequency signal; and means for generating an eighth signal that is equal to the parallel shifted signal, and wherein: a digital signal corresponding to the seventh signal generated in the digital signal processing unit is inputted into one of the two DACs; a digital signal corresponding to the eighth signal generated in the digital signal processing unit is inputted into the other one of the two DACs; and analog outputs from the two DACs are each inputted into the analog addition/subtraction processing unit as the analog input signals of the dual system.

As already described above, the signal generating device of the present embodiment is the combination of the feature of the sixth embodiment and the feature of the eighth embodiment, and thus has both of the features. The advantage and disadvantage relation as already explained in the eighth embodiment with respect to the first embodiment wholly applies to the relation of the signal generating device of the present embodiment with respect to the sixth embodiment. In other words, in the signal generating device of the present embodiment, processing of adding or subtracting the parallel shifted signal is made in the analog domain instead of in the digital domain, and thus, although a disadvantage such as increased analog parts or a complicated analog circuit configuration arises, an advantage of improving a signal to noise ratio (SNR) of a final output signal can be obtained. The SNR deterioration due to scaling for accommodating the amplitude of the input digital signal to the DAC within the full scale of the DAC is suppressed, and thus the SNR of the final output signal can be improved compared to that of the sixth embodiment.

Further, when comparing the signal generating device of the present embodiment with that of the eighth embodiment, as in the above-described advantage in the case of comparing the sixth embodiment with the first embodiment, clock frequency of the analog multiplexer is set to a half and an image signal can be suppressed. However, in the present embodiment, as shown in FIG. 25(*a*), a signal in which the low-frequency signal A is superimposed on the folded signals B and C is used as an input signal to the DAC 2021, and thus its SNR deteriorates compared to that of the eighth embodiment.

In the signal generating device of the present embodiment as well, each of the output points of the DACs 2021, 2022 through the output of the analog multiplexer 2031 substantially forms, when viewing two signal paths along the traveling direction of electric signals, a symmetric configuration by regarding the traveling direction as a virtual central axis. Therefore, in the present embodiment, as in the case of the first embodiment, the adjustment of the amplitude and delay of the DACs can also be suppressed to the minimum.

In all embodiments of the signal generating devices of the present invention as described above, real-valued signals have been assumed as an input signal to the digital signal processing unit. For this reason, in the explanation regarding FIG. 5 and FIG. 14, the component of the positive frequency component B and the signal component of the negative frequency component C have been described as signals having a relation in which they are mutually folded on the frequency axis to take a complex conjugate. However, in practice, in the signal generation processes explained using FIG. 5 and FIG. 14, the offset of signal components caused by an opposite-phase interference and the residue of signal components caused by an in-phase interference are established even if the signal component B and the signal component C are mutually independent. In other words, it is readily understood from FIG. 5 and FIG. 14 that, even when the signal component B and the signal component C are not in a relation of being folded to take the complex conjugate, they are still established. This means that an advantageous result of the present invention can still be obtained even when an input signal to the digital signal processing unit is a complex signal.

In practice, input signals to the DACs 121 and 122 in FIG. 1 need to be real-valued signals, but in the case where IQ modulation is made as in the optical transmitter of the third embodiment shown in FIG. 9, for example, there is no necessity to perform digital signal processing individually after separating an in-phase (I) component from an orthogonal (Q) component of the complex signal. In other words, it is also possible to use a method of sending a real part to the DAC of the I channel side and a false part to the DAC of the Q channel side after performing digital signal processing on the complex signal as it is to obtain the third signal and the fourth signal.

As described above in detail, according to the signal generating device of the present invention, it is possible to output an analog signal of a broader bandwidth beyond the intrinsically outputtable bandwidth by the single DAC included in the device. Further, each of the output points of the DACs through the output of the analog multiplexer forms, when viewing two signal paths along the traveling direction of electric signals, a symmetric configuration by regarding the traveling direction as a virtual central axis. Therefore, the adjustment of the amplitude and delay of the DACs can be suppressed to the minimum, and the problem of asymmetricity of the circuit configuration in the signal generating device of the conventional technique can also be resolved.

INDUSTRIAL APPLICABILITY

The present invention can be used for a communication system in general. In particular, the present invention can be used for a device that includes high-speed digital signal processing.

The invention claimed is:

1. A signal generating device comprising:
a digital signal processing unit;
two digital-to-analog converters (DACs); and
an analog multiplexer that alternatingly switches analog signals outputted from the two DACs with a frequency $f_c$ for outputting as analog signals, wherein
the digital signal processing unit includes:
when a signal, among desired output signals having an upper limit frequency of less than fc, made of a component having an absolute value of a frequency being substantially $f_c/2$ or less is assumed as a low-frequency signal, and
when, for a positive frequency component and a negative frequency component which are made of a component having an absolute value of a frequency being substantially $f_c/2$ or more among the desired output signals, a signal in which the positive frequency component is shifted by $-f_c$ on a frequency axis and a signal in which the negative frequency component is shifted by $+f_c$ on the frequency axis are assumed as a folded signal,
means for generating a first signal that is equal to a signal obtained by multiplying the folded signal by a constant and adding a resultant to the low-frequency signal; and
means for generating a second signal that is equal to a signal obtained by multiplying the folded signal by the constant and subtracting a resultant from the low-frequency signal, and wherein:
a digital signal corresponding to the first signal generated in the digital signal processing unit is inputted into one of the two DACs; and
a digital signal corresponding to the second signal generated in the digital signal processing unit is inputted into the other one of the two DACs.

2. The signal generating device according to claim 1, wherein the constant is a real number of $\pi/2$ or more.

3. The signal generating device according to claim 1, wherein an output bandwidth of the analog multiplexer has a broader bandwidth compared to an output bandwidth of each of the two DACs.

4. The signal generating device according to claim 1, wherein the digital signal processing unit further comprises compensation means for performing processing of compensating a response characteristic of the DACs for the first signal and the second signal.

5. The signal generating device according to claim 1, further comprising a low pass filter at a post-stage of the analog multiplexer to suppress a frequency component of G or more.

6. The signal generating device according to claim 1, wherein a signal in which transmission information data has underwent processing of symbol mapping, pulse shaping, and channel equalization is inputted into the digital signal processing unit, and the analog signal from the analog multiplexer is inputted into modulation means.

7. The signal generating device according to claim 6, wherein the modulation means is any of an orthogonal modulator, a polarization multiplexed orthogonal modulator, and an electric-optic conversion (E/O) device.

8. The signal generating device according to claim 1, wherein
the desired signal is a multicarrier signal constituted by a plurality of frequency subcarrier signals, and
the digital signal processing unit comprises:
serial-parallel conversion means for branching transmission information data in parallel;
symbol mapping means for making symbol mapping for the branched data and for generating a subsymbol sequence constituted by a plurality of subsymbols to be carried on the plurality of subcarriers, respectively;
means for generating a subsymbol that is folded in a frequency band corresponding to the low-frequency signal by making a shift on the frequency axis with respect to a part of subsymbols, out of the plurality of subsymbols, corresponding to the positive frequency component and the negative frequency component;
means for obtaining an intermediate subsymbol sequence by adding or subtracting a subsymbol corresponding to the low-frequency signal and subsymbols obtained by multiplying the folded subsymbols by the constant;
IDFT computation means for making inverse-discrete Fourier transform (IDFT) for the intermediate subsymbol sequences; and
parallel-serial conversion means for arranging an output data sequence from the IDFT computation means in serial.

9. A multistage nest-type signal generating device comprising, in the signal generating device according to claim 1, a configuration of N+1 stage nest type obtained by repeating an operation of replacing each of the two DACs with the signal generating device itself recited in claim 1 by N times (N is any integer of 1 or more), wherein
when a frequency for switching the analog multiplexer in the signal generating devices by the number of 2n−1 positioned at nth stage (n is an integer of 1 or more and N+1 or less) from an outer side in the N+1 stage nest-type configuration is $f_{c,n}$, a range is $f_{c,k}/2 < f_{c,k+1} <$ (k is an integer of 1 or more and N or less).

10. A signal generating device comprising:
a digital signal processing unit;
two digital-to-analog converters (DACs); and
an analog multiplexer that alternatingly switches analog signals outputted from the two DACs with a frequency $f_c/2$ for outputting as analog signals, wherein
the digital signal processing unit includes:
when a signal, among desired output signals having an upper limit frequency of less than $f_c$, made of a component having an absolute value of a frequency being substantially $f_c/2$ or less is assumed as a low-frequency signal,
when, for a positive frequency component and a negative frequency component which are made of a component having an absolute value of a frequency being substantially $f_c/2$ or more among the desired output signals, a signal in which the positive frequency component is shifted by $-f_c$ on a frequency axis and a signal in which the negative frequency component is shifted by $-f_c$ on the frequency axis are assumed as a folded signal, and when a signal in which the positive frequency component is shifted by $-f_c/2$ on the frequency axis and a signal in which the negative frequency component is shifted by $+f_c/2$ on the frequency axis are assumed as a parallel shifted signal, means for generating a third signal that is equal to a signal obtained by adding a signal obtained by multiplying the parallel shifted signal by a constant to the low-frequency signal and then subtracting the folded signal from a resultant; and means for generating a fourth signal that is equal to a signal obtained by subtracting a signal obtained by multiplying the parallel shifted signal by the constant from the low-frequency signal and further subtracting the folded signal from a resultant, and wherein:

a digital signal corresponding to the third signal generated in the digital signal processing unit is inputted into one of the two DACs; and a digital signal corresponding to the fourth signal generated in the digital signal processing unit is inputted into the other one of the two DACs.

11. The signal generating device according to claim 10, wherein the digital signal processing unit further comprises compensation means for performing processing of compensating a response characteristic of the DACs for the third signal and the fourth signal.

12. The signal generating device according to claim 10, wherein the desired signal is a multicarrier signal constituted by a plurality of frequency subcarriers, and the digital signal processing unit comprises:

serial-parallel conversion means for branching transmission information data in parallel;

symbol mapping means for making symbol mapping for the branched data and for generating a subsymbol sequence constituted by a plurality of subsymbols to be carried on the plurality of subcarriers, respectively;

means for generating a subsymbol that is folded in a frequency band corresponding to the low-frequency signal and a subsymbol that is parallel-shifted in a frequency band corresponding to the low-frequency signal by making a shift operation on the frequency axis with respect to a part of subsymbols, out of the plurality of subsymbols, corresponding to the positive frequency component and the negative frequency component;

means for obtaining an intermediate subsymbol sequence by adding or subtracting a subsymbol obtained by multiplying subsymbols corresponding to the low-frequency signal, the folded subsymbols, and the parallel-shifted subsymbols by the constant;

IDFT computation means for making inverse-discrete Fourier transform (IDFT) for the intermediate subsymbol sequences; and parallel-serial conversion means for arranging an output data sequence from the IDFT computation means in serial.

13. A signal generating device comprising:

a digital signal processing unit;

two digital-to-analog converters (DACs);

an analog addition/subtraction processing unit that outputs a first analog output signal in which a relative amplitude of analog input signals of a dual system is adjusted and which is equal to a sum of the analog input signals of the dual system whose relative amplitude has been adjusted and a second analog output signal which is equal to a difference in the analog input signals of the dual system whose relative amplitude has been adjusted; and an analog multiplexer that alternatingly switches the first analog output signal and the second analog output signal outputted from the analog addition/subtraction processing unit with a frequency fc for outputting as analog signals, wherein the digital signal processing unit includes:

when a signal, among desired output signals having an upper limit frequency of less than fc, made of a component having an absolute value of a frequency being substantially fc/2 or less is assumed as a low-frequency signal, and when, for a positive frequency component and a negative frequency component which are made of a component having an absolute value of a frequency being substantially fc/2 or more among the desired output signals, a signal in which the positive frequency component is shifted by −fc on a frequency axis and a signal in which the negative frequency component is shifted by ☐fc on the frequency axis are assumed as a folded signal, means for generating a first signal that is equal to the low-frequency signal; and means for generating a second signal that is equal to the folded signal, and wherein:

a digital signal corresponding to the first signal generated in the digital signal processing unit is inputted into one of the two DACs;

a digital signal corresponding to the second signal generated in the digital signal processing unit is inputted into the other one of the two DACs; and analog outputs from the two DACs are each inputted into the analog addition/subtraction processing unit as the analog input signals of the dual system.

14. The signal generating device according to claim 2, wherein an output bandwidth of the analog multiplexer has a broader bandwidth compared to an output bandwidth of each of the two DACs.

* * * * *